United States Patent
Minami et al.

(10) Patent No.: US 9,640,110 B2
(45) Date of Patent: May 2, 2017

(54) LIGHT-EMITTING ELEMENT AND DISPLAY DEVICE

(71) Applicant: Sony Corporation, Tokyo (JP)

(72) Inventors: Tetsuo Minami, Kanagawa (JP); Junichi Yamashita, Tokyo (JP)

(73) Assignee: Sony Corporation, Tokyo (JP)

( * ) Notice: Subject to any disclaimer, the term of this patent is extended or adjusted under 35 U.S.C. 154(b) by 0 days.

(21) Appl. No.: 14/632,012

(22) Filed: Feb. 26, 2015

(65) Prior Publication Data

US 2015/0170566 A1    Jun. 18, 2015

Related U.S. Application Data

(63) Continuation of application No. 14/025,284, filed on Sep. 12, 2013, now Pat. No. 8,982,111.

(30) Foreign Application Priority Data

Nov. 19, 2012    (JP) .................... 2012-253015

(51) Int. Cl.
| | |
|---|---|
| *G09G 5/00* | (2006.01) |
| *G09G 3/3233* | (2016.01) |
| *G09G 3/00* | (2006.01) |
| *H01L 27/32* | (2006.01) |
| *H05B 33/08* | (2006.01) |

(52) U.S. Cl.
CPC ............ *G09G 3/3233* (2013.01); *G09G 3/00* (2013.01); *H01L 27/326* (2013.01); *H01L 27/3276* (2013.01); *H05B 33/0896* (2013.01); *G09G 2300/0819* (2013.01); *G09G 2300/0842* (2013.01); *G09G 2300/0861* (2013.01); *G09G 2300/0866* (2013.01); *G09G 2310/0256* (2013.01); *G09G 2320/0233* (2013.01); *Y02B 20/343* (2013.01)

(58) Field of Classification Search
CPC ............ H05B 33/0896; G09G 33/3233; H01L 27/3276
USPC ........................................................ 345/205
See application file for complete search history.

(56) References Cited

U.S. PATENT DOCUMENTS

| | | |
|---|---|---|
| 2002/0154151 A1 | 10/2002 | Koyama |
| 2003/0063077 A1 | 4/2003 | Koyama |
| 2005/0206590 A1 | 9/2005 | Sasaki et al. |
| 2006/0170628 A1 | 8/2006 | Yamashita et al. |
| 2006/0273999 A1 | 12/2006 | Yamazaki et al. |
| 2007/0077105 A1 | 4/2007 | Sato et al. |
| 2008/0036703 A1 | 2/2008 | Wang et al. |
| 2008/0198103 A1 | 8/2008 | Toyomura et al. |

(Continued)

FOREIGN PATENT DOCUMENTS

JP    2006-030635 A    2/2006

*Primary Examiner* — Jason M Crawford
(74) *Attorney, Agent, or Firm* — Michael Best & Friedrich LLP

(57) ABSTRACT

A light-emitting device comprising an emitting unit including at least two emitting elements, a driving unit configured to control the emitting unit, and a capacitor unit formed over the driving unit. A shield layer may be located between the two emitting elements. In one example, the capacitor unit is formed at a level higher than a level of the driving unit, and a shield layer that is located between the two emitting elements is formed at a level that is higher than the level of the driving unit and equal to or lower than the level of the capacitor unit.

20 Claims, 35 Drawing Sheets

(56) References Cited

U.S. PATENT DOCUMENTS

| | | |
|---|---|---|
| 2008/0252568 A1 | 10/2008 | Kwon |
| 2010/0053045 A1 | 3/2010 | Fish et al. |
| 2010/0118002 A1 | 5/2010 | Yamashita et al. |
| 2010/0118003 A1 | 5/2010 | Yamashita et al. |
| 2012/0086683 A1* | 4/2012 | Segura Puchades .......... G02F 1/136213 345/205 |

* cited by examiner

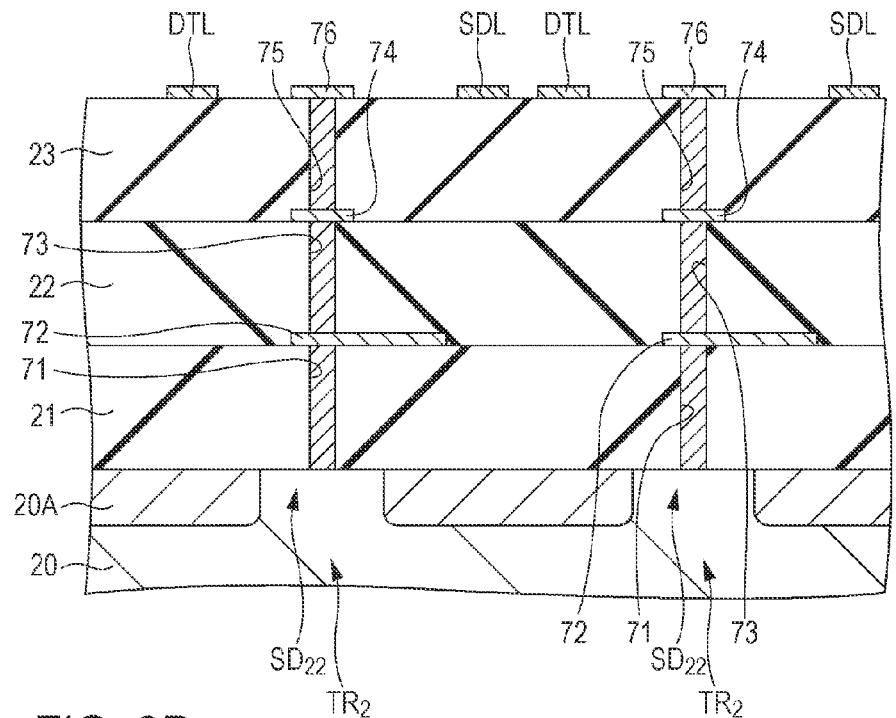
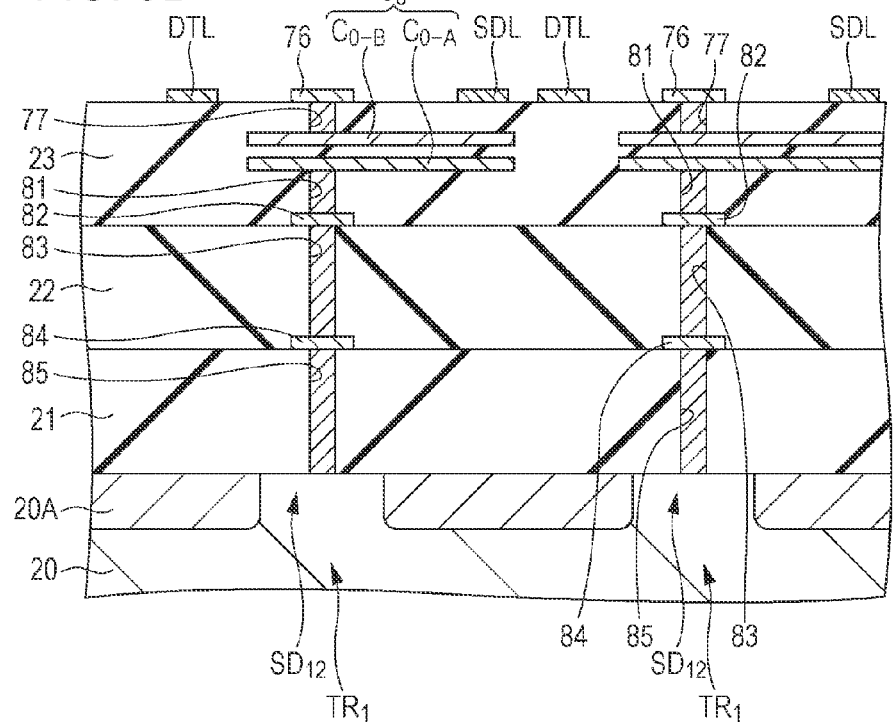

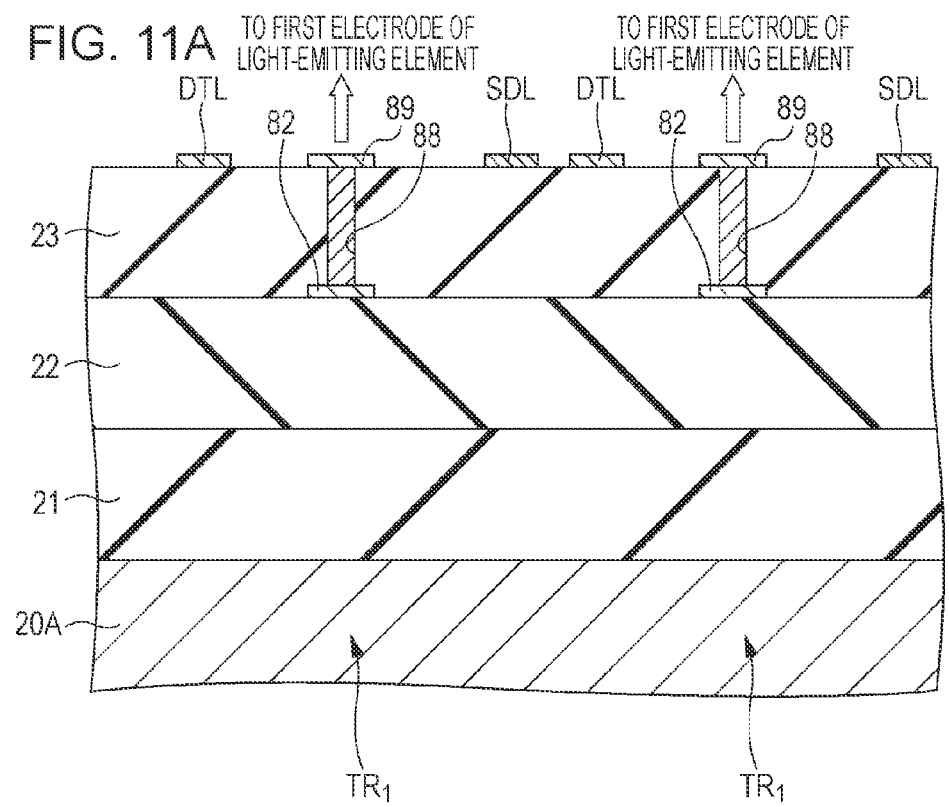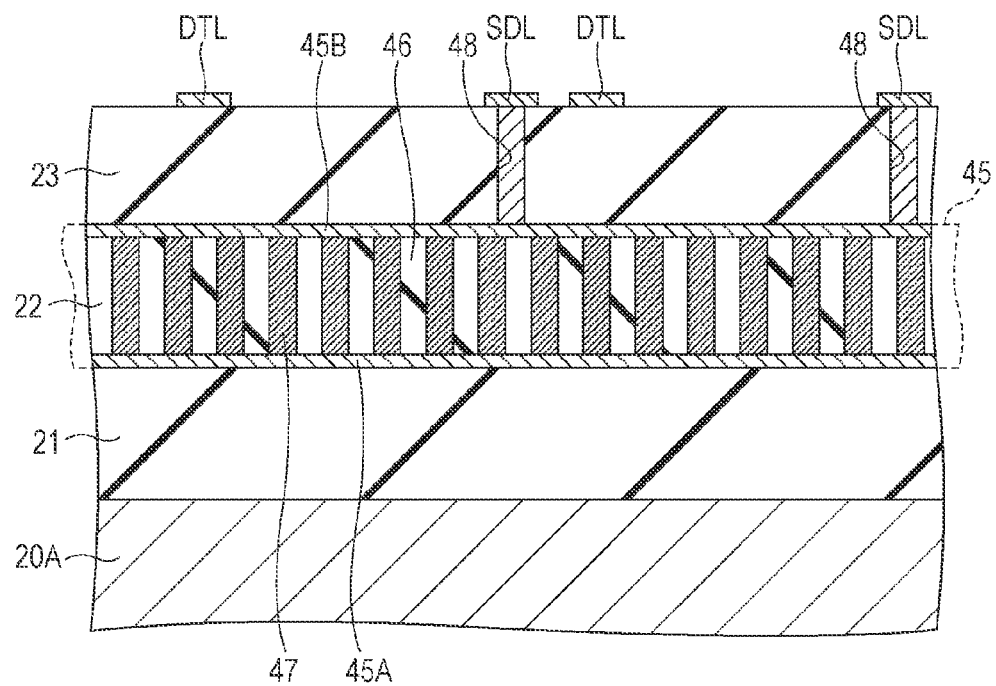

LIGHT-EMITTING ELEMENT AND DISPLAY DEVICE

CROSS REFERENCE TO RELATED APPLICATIONS

This present application is a Continuation of application Ser. No. 14/025,284, filed Sep. 12, 2013, which claims priority to Japanese Priority Patent Application JP 2012-253015 filed Nov. 19, 2012, the entire contents of which are incorporated herein by reference.

BACKGROUND

The present disclosure relates to a light-emitting element and a display device.

In recent years, there has been increased interest in organic electroluminescence display devices (hereinafter, also referred to simply as "organic EL display device") employing organic electroluminescence elements (also referred to simply as "organic EL element"). The organic EL display devices are of a self-luminous type, and have a property that consumption power is low. Organic EL display devices are conceived as having sufficient responsivity as to high-definition high-speed video signals, and development and commercialization thereof have been advanced toward practical use.

The organic EL display devices include multiple light-emitting elements including an emitting unit ELP and a driving circuit configured to drive the emitting unit ELP. Specifically, the multiple light-emitting elements are arrayed in a two-dimensional matrix shape of N columns in a first direction and M rows in a second direction different from the first direction. A circuit diagram of the organic EL display device is illustrated in FIG. 1, and an equivalent circuit diagram of a light-emitting element including a driving circuit configured of two transistors and one capacitor unit for example, is illustrated in FIG. 2. Here, the driving circuit is configured of a driving transistor $TR_1$, an image signal writing transistor $TR_2$, and a capacitor unit $C_0$, and is connected to a current supply line CSL, a scanning signal SCL, and a signal line DTL. The transistors $TR_1$ and $TR_2$ making up a driving circuit positioned in an odd row in the organic EL display device, and the transistors $TR_1$ and $TR_2$ making up a driving circuit positioned in an even row, are disposed in symmetry as to an axial line extending in the first direction. That is to say, the driving circuits are disposed upside down alternately in odd and even rows. Employing such a layout is employed enables reduction in area of the driving circuits to be realized overall.

SUMMARY

As described above, with driving circuits according to the related art, as illustrated in FIG. 35, in the event that the driving circuits are disposed as upside down alternately in odd and even rows, there may be a problem described below. Specifically, parasitic capacitance between pixels adjacent in the second direction differ between odd rows and even rows. For example, let us say that "m" is an odd number, and parasitic capacitance occurring due to coupling between a gate electrode of a driving transistor $TR_{1\_m-1}$ making up a driving circuit positioned in the (m−1)'th row, and a capacitor unit $C_{0\_m}$ making up a driving circuit position in the m'th row is $PC_m$. Also, let us say that parasitic capacitance occurring due to coupling between a gate electrode of a driving transistor $TR_{1\_m}$ making up a driving circuit posi- tioned in the m'th row, and a capacitor unit $C_{0\_m+1}$ making up a driving circuit position in the (m+1)'th row is $PC_{m+1}$. In this arrangement, the value of the parasitic capacitance $PC_m$ and the value of the parasitic capacitance $PC_{m+1}$ differ. Specifically, parasitic capacitance $PC_{m+1}$>parasitic capacitance $PC_m$ holds.

In the event of displaying an image on an organic EL display device, a bootstrap phenomenon at the driving transistor $TR_1$ is applied to send a current to the emitting unit ELP according to luminance to be displayed. In the event of performing image display up to down on the organic EL display device (i.e., in the event of performing image display in a direction where the value of m increases), potential increase amount of the gate electrode of the driving transistor $TR_1$ fluctuates depending on parasitic capacitance. Specifically, for example, when displaying an image having the same luminance at a pixel including a driving circuit position in the (m−1)'th row, a pixel including a driving circuit position in the m'th row, and at a pixel including a driving circuit position in the (m+1)'th row, potential increase amount of the gate electrode of the driving transistor $TR_{1\_m-1}$ making up the driving circuit positioned in the (m−1)'th row, and potential increase amount of the gate electrode of the driving transistor $TR_{1\_m}$ making up the driving circuit positioned in the m'th row differ, since the parasitic capacitances $PC_m$ and $PC_{m+1}$ differ, even though the luminance is the same. As a result thereof, with the display device, luminance differs between odd and even rows, and streaky spots may be visually recognized, or an image may be observed appearing to have only half its resolution.

Even when disposing driving circuits so as not to be vertically inverted between odd and even rows, a pixel may emit an unintended luminance or uniformity may deteriorate due to being subjected to coupling from adjacent pixels, and in some cases, uniformity may deteriorate due to being subjected to coupling from adjacent signal lines DTL.

A display device where a metal pattern serving as an electric field shield as to a scanning line and signal lines is disposed is disclosed in Japanese Unexamined Patent Application Publication No. 2006-030635, but it is difficult to sufficiently solve the above-mentioned problem by such a metal pattern.

It has been found to be desirable to provide a light-emitting element having a configuration and an architecture which are not readily influenced by adjacent pixels, and a display device including such light-emitting elements.

A light-emitting element according to an embodiment includes: an emitting unit; and a driving circuit configured to drive the emitting unit, with the driving circuit being configured of at least (A) a driving transistor including two source/drain regions, a channel formation region, and a gate electrode, (B) an image signal writing transistor including two source/drain regions, a channel formation region, and a gate electrode, and (C) a capacitor unit; with the driving transistor, (A-1) one of the source/drain regions being connected to a current supply line extending in a first direction, (A-2) the other source/drain region being connected to the emitting unit, and also connected to one edge of the capacitor unit, and (A-3) the gate electrode being connected to the other source/drain region of the image signal writing transistor, and also connected to the other edge of the capacitor unit; with the image signal writing transistor, (B-1) one of the source/drain regions being connected to a data line extending in a second direction different from the first direction, and (B-2) the gate electrode being connected to a scanning line extending in the first direction; with the driving transistor, the image signal writing transistor, and the capacitor unit being covered with a first interlayer insulating layer; with the current supply line and the scanning line being formed on the first interlayer insulating layer; with the first interlayer insulating layer, the current supply line, and the scanning line being covered with a second interlayer insulating layer; with the data line being formed on the second interlayer insulating layer; and with a shield wall extending in the first direction being provided to the second interlayer insulating layer between one light-emitting element and a light-emitting element adjacent to the one light-emitting element. Note that, as will be described later, in the event that the second interlayer insulating layer has a laminated configuration of a lower layer of the second interlayer insulating layer and an upper layer of the second interlayer insulating layer, the shield wall may be provided within the lower layer of the second interlayer insulating layer or may be provided within the upper layer of the second interlayer insulating layer, or may be provided within the lower layer of the second interlayer insulating layer and within the upper layer of the second interlayer insulating layer in the second direction.

With the light-emitting element according to the above configuration, the shield wall extending in the first direction (hereinafter, for convenience, may be referred to as "first shield wall") is provided to the second interlayer insulating layer between one light-emitting element and a light-emitting element adjacent to the one light-emitting element in the second direction.

A light-emitting element according to an embodiment of the present disclosure includes: an emitting unit; and a driving circuit configured to drive the emitting unit, with a shield wall being provided between one light-emitting element and a light-emitting element adjacent to the one light-emitting element; with the shield wall being configured of a plurality of columnar-shaped conductor portions being arrayed apart; and with the plurality of columnar-shaped conductor portions being arrayed in two columns and also arrayed in a zigzag pattern when viewing the shield wall from the axial directions of the conductor portions.

With the light-emitting element according to the above configuration, the first shield wall is provided between one light-emitting element and a light-emitting element adjacent to the one light-emitting element, the first shield wall is configured of a plurality of columnar-shaped conductor portions (hereinafter, for convenience, may be referred to as "first conductor portions") being arrayed apart, and when viewing the first shield wall from the axial directions of the first conductor portions, the plurality of columnar-shaped first conductor portions are arrayed in two columns, and also arrayed in a zigzag pattern.

A light-emitting element according to an embodiment of the present disclosure includes: an emitting unit; and a driving circuit configured to drive the emitting unit, with the driving circuit including at least a driving transistor, an image signal writing transistor, and a capacitor unit; with the capacitor unit being provided in a higher level than a level where the driving transistor and the image signal writing transistor are provided; and with a shield wall being provided in a level equal to or lower than a level where the capacitor is provided but a level higher than a level where the driving transistor and the image signal writing transistor are provided, between one light-emitting element and a light-emitting element adjacent to the one light-emitting element.

Further, with the light-emitting element according to the third embodiment of the present disclosure, the capacitor unit is provided in a higher level than a level where the driving transistor and the image signal writing transistor are provided, and the first shield wall is provided in a level equal to or lower than a level where the capacitor unit is provided but a level higher than a level where the driving transistor and the image signal writing transistor are provided, between one light-emitting element and a light-emitting element adjacent to the one light-emitting element.

A display device is configured of a plurality of the light-emitting elements according to the above configurations are arrayed in the first direction and in a second direction different from the first direction in a two-dimensional matrix shape. Also, an electronic device according to the present disclosure includes a display device according to the present disclosure.

According to the configurations above, a configuration/architecture which is not readily influenced by electric fields from adjacent pixels may be provided to the light-emitting elements. That is to say, occurrence of a phenomenon may be suppressed where potential increase amount of the gate electrode of a driving transistor of a driving circuit making up one light-emitting element fluctuates due to a light-emitting element adjacent to the one light-emitting element. As a result thereof, an image can be displayed with high uniformity without visual recognition of streaky spots, and without occurrence of a phenomenon where an image is observed appearing to have only half the resolution thereof, and without a pixels emitting light with unintended luminance.

BRIEF DESCRIPTION OF THE DRAWINGS

FIGS. 9A and 9B are schematic partial cross-sectional views of the display device or light-emitting element according to the first embodiment taken along arrow IXA-IXA and arrow IXB-IXB in FIG. 4, respectively;

FIGS. 11A and 11B are schematic partial cross-sectional views of the display device or light-emitting element according to the first embodiment taken along arrow XIA-XIA and arrow XIB-XIB in FIG. 4, respectively;

DETAILED DESCRIPTION OF EMBODIMENTS

Figure 1:
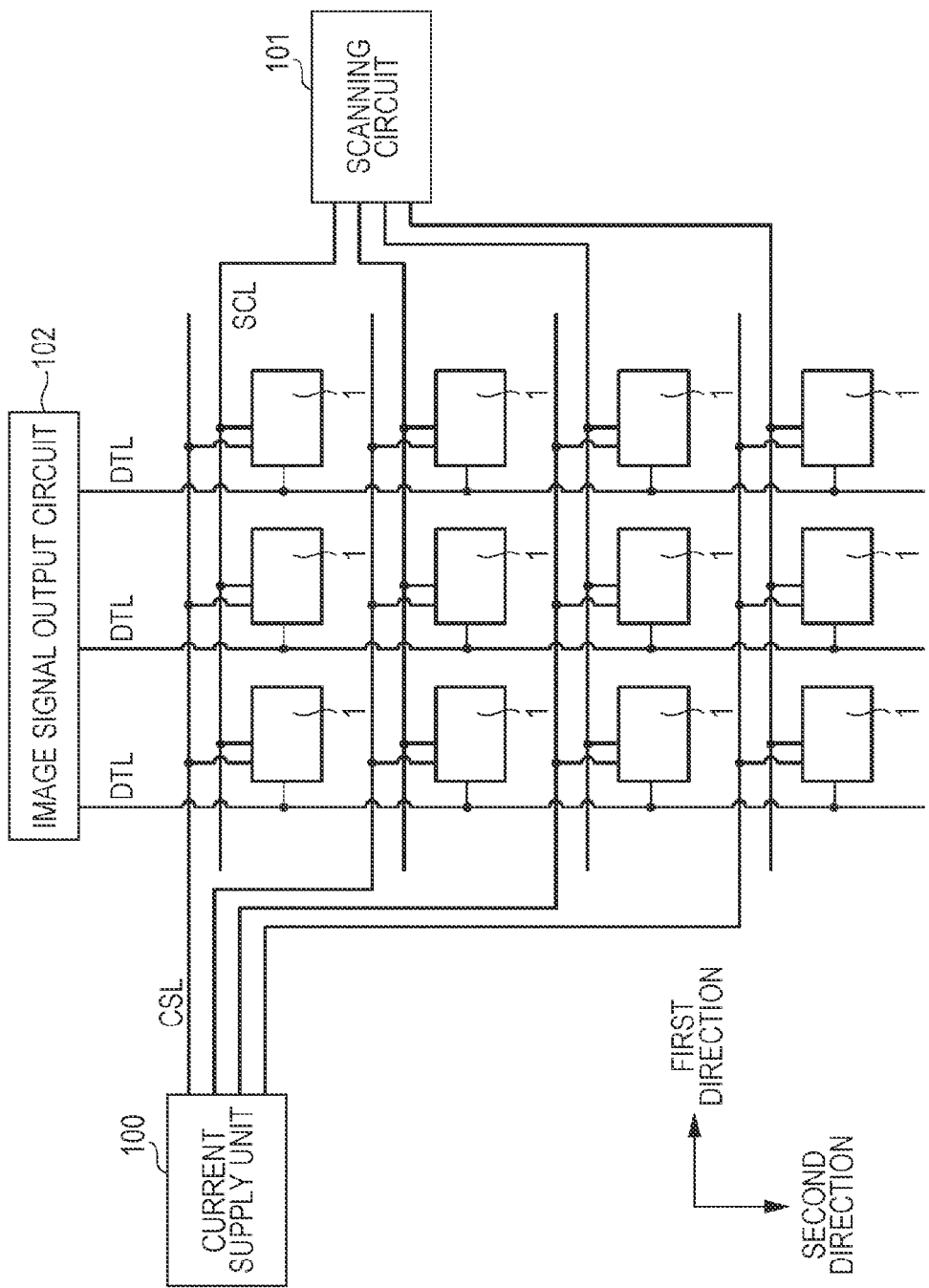
FIG. 1 is a conceptual diagram of a circuit making up a display device included in a display device or electronic device according a first embodiment.

Hereinafter, the present disclosure will be described based on embodiments with reference to the drawings, but the present disclosure is not restricted to the embodiments, and various numeric values and materials in the embodiments are exemplifications. Note that description will be made in the following sequence.

1. Description regarding Light-emitting Element, Display Device, and Electronic Device in General According to First through Third Forms of Present Disclosure 2. First Embodiment (Light-emitting Element, Display Device, and Electronic Device According to First through Third Forms of Present Disclosure)

3. Second Embodiment (Modification of First Embodiment)

4. Third Embodiment (Modification of First Embodiment or Second Embodiment)

5. Fourth Embodiment (Operational Description of Light-emitting Elements According to First through Third embodiments)

Others

Description regarding Light-emitting Element, Display Device, and Electronic Device in General According to First through Forms of Present Disclosure Various forms of light-emitting elements according to first through third forms of the present disclosure to be described below may be applied to light-emitting elements included in the display device and electronic device according to the present disclosure. Light-emitting elements according to the first through third forms of the present disclosure, light-emitting elements according to the first form to the third form of the present disclosure included in the display device of the present disclosure, and Light-emitting elements according to the first through third forms of the present disclosure included in the electronic device of the present disclosure may be collectively referred to as "light-emitting elements or the like according to the first form of the present disclosure", "light-emitting elements or the like according to the second form of the present disclosure", and "light-emitting elements or the like according to the third form of the present disclosure".

With the light-emitting elements or the like according to the first form or third form of the present disclosure, it is a preferable form that a first shield wall is configured of multiple columnar-shaped first conductor portions being arrayed apart, and when viewing the first shield wall from the axial directions of the first conductor portions (i.e., when viewing the first shield wall from above), the multiple columnar-shaped first conductor portions are arrayed in two columns and also arrayed in a zigzag pattern. With the light-emitting elements or the like according to the first form of the present disclosure including such a preferred form, the first shield wall may have a form connected to a shield wiring portion formed on a second interlayer insulating layer, and with the light-emitting elements or the like according to the third form of the present disclosure including such a preferable form, or with the light-emitting elements or the like according to the second form of the present disclosure, the first shield wall may have a form where the first shield wall is connected to the shield wiring portion. Note that the shield wiring portion may be formed on the second interlayer insulating layer or may be formed within the second interlayer insulating layer.

Further, with the light-emitting elements or the like according to the first form of the present disclosure including various preferred forms described above, at the light-emitting elements arrayed in the second direction, when assuming that m is an odd number, the m'th light-emitting element and the (m+1)'th light-emitting element are disposed in line symmetry as to a borderline extending in the first direction between the m'th light-emitting element and the (m+1)'th light-emitting element, and the first shield wall may have a form where the first shield wall is at least provided between the m'th light-emitting element and the (m+1)'th light-emitting element. Also, with the light-emitting elements or the like according to the third form of the present disclosure including various preferred forms described above, and the light-emitting elements or the like according to the second form of the present disclosure, a driving circuit is connected to a current supply line extending in the first direction, a scanning line extending in the first direction, and a data line extending in the second direction different from the first direction, and at light-emitting elements arrayed in the second direction, when assuming that m is an odd number, the m'th light-emitting element and the (m+1)'th light-emitting element are disposed in line symmetry as to a borderline extending in the first direction between the m'th light-emitting element and the (m+1)'th light-emitting element, and the first shield wall may have a form where the first shield wall is at least provided between the m'th light-emitting element and the (m+1)'th light-emitting element. Note that such a form in the light-emitting elements or the like according to the first through third forms of the present disclosure will be referred to as "light-emitting elements disposed in symmetry" for convenience. Note that it is a preferable form that the first shield wall is formed on the border line.

With such "light-emitting elements disposed in symmetry", at the light-emitting elements arrayed in the second direction, there may be employed a form wherein a second shield wall extending in the first direction is provided between the (m−1)'th light-emitting element and the m'th light-emitting element. Note that such a form at "light-emitting elements disposed in symmetry" will be referred to as "light-emitting elements including the second shield wall" for convenience. At "light-emitting elements including the second shield wall", it is a preferable form that the second shield wall is further configured of multiple columnar-shaped second conductor portions being arrayed apart, and when viewing the second shield wall from the axial directions of the second conductor portions (i.e., when viewing the second shield wall from above), the multiple columnar-shaped second conductor portions are arrayed in two columns, and also arrayed in a zigzag pattern. Here, it is desirable that the second shield wall is connected to a shield wiring portion formed in the second interlayer insulating layer, or it is desirable that the second shield wall is connected to the shield wiring portion. Note that the shield wiring portion may be formed on the second interlayer insulating layer as described above, or may be formed within the second interlayer insulating layer. Also, as will be described next, in the event that the second interlayer insulating layer has a laminated structure of an upper layer of the second interlayer insulating layer and a lower layer of the second interlayer insulating layer, the second shield wall may be provided within the lower layer of the second interlayer insulating layer, or may be provided within the upper layer of the second interlayer insulating layer, or may be provided within the lower layer of the second interlayer insulating layer and within the upper layer of the second interlayer insulating layer.

Further, with "light-emitting elements including the second shield wall" such as light-emitting elements according to the first form of the present disclosure including the above preferred forms, there may be provided a form wherein the second interlayer insulating layer includes the laminated configuration of the lower layer of the second interlayer insulating layer and the upper layer of the second interlayer insulating layer, the first shield wall is provided to the lower layer of the second interlayer insulating layer, and a third shield wall extending in the first direction having the same configuration as with the first shield wall is provided to the upper layer portion of the second interlayer insulating layer positioned above the first shield wall, and the third shield wall is connected to the shield wiring portion. Further, with "light-emitting elements including the second shield wall" such as light-emitting elements according to the first form of the present disclosure including such a form, there may be provided a form wherein the second interlayer insulating layer includes the laminated configuration of the lower layer of the second interlayer insulating layer and the upper layer of the second interlayer insulating layer, the second shield wall is provided to the lower layer of the second interlayer insulating layer, and a fourth shield wall extending in the first direction having the same configuration as with the second shield wall is provided to the upper layer portion of the second interlayer insulating layer positioned above the second shield wall, and the fourth shield wall is connected to the shield wiring portion.

Also, with "light-emitting elements disposed in symmetry" such as light-emitting elements according to the first form of the present disclosure, there may be provided a form wherein the second interlayer insulating layer includes the laminated configuration of the lower layer of the second interlayer insulating layer and the upper layer of the second interlayer insulating layer, the first shield wall is provided to the lower layer of the second interlayer insulating layer, and a third shield wall extending in the first direction having the same configuration as with the first shield wall is provided to the upper layer portion of the second interlayer insulating layer positioned above the first shield wall, and the third shield wall is connected to the shield wiring portion.

With the light-emitting elements or the like according to the first form of the present disclosure including the above various preferable forms, there may be provided a form wherein a second direction shield wall extending in the second direction is provided to the second interlayer insulating layer between one light-emitting element and a light-emitting element adjacent to the one light-emitting element in the first direction. Note that in the event that the second interlayer insulating layer has, as described above, the laminated configuration of the lower layer of the second interlayer insulating layer and the upper layer of the second interlayer insulating layer, the second direction shield wall may be provided within the lower layer of the second interlayer insulating layer, or may be provided within the upper layer of the second interlayer insulating layer, or may be provided within the lower layer of the second interlayer insulating layer, and within the upper layer of the second interlayer insulating layer. Also, with "light-emitting elements disposed in symmetry" such as light-emitting elements according to the second through third forms of the present disclosure including various preferred forms described above, there may be provided a form wherein the second direction shield wall extending in the second direction is provided between one light-emitting element and a light-emitting element adjacent to the one light-emitting element in the first direction.

With the light-emitting elements or the like according to the second and third forms of the present disclosure including various preferred forms described above, the driving circuit is more specifically configured of at least (A) a driving transistor including two source/drain regions, a channel formation region, and a gate electrode, (B) an image signal writing transistor including two source/drain regions, a channel formation region, and a gate electrode, and (C) a capacitor unit; with the driving transistor, (A-1) one of the source/drain regions being connected to a current supply line, (A-2) the other source/drain region being connected to the emitting unit, and also connected to one edge of the capacitor unit, and (A-3) the gate electrode being connected to the other source/drain region of the image signal writing transistor, and also connected to the other edge of the capacitor unit; and with the image signal writing transistor, (B-1) one of the source/drain regions being connected to a data line, and (B-2) the gate electrode being connected to a scanning line.

Examples of component materials of the first interlayer insulating layer and second interlayer insulating layer (lower layer of the second interlayer insulating layer and upper layer of the second interlayer insulating layer) include an $SiO_2$ material such as $SiO_2$, BPSG, PSG, BSG, AsSG, PbSG, SiON, SOG (Spin-On Glass), low-melting glass, and glass paste; an SiN material; aluminum oxide; and a photosensitive polyimide resin or insulating resin such as a novolak resin, acrylic resin, polybenzoxazole resin, polyhydroxystyrene resin, or the like. Process according to the related art such as various CVD methods, various PVD methods including sputtering, various coating methods, various printing methods, and so forth may be employed for formation of an interlayer insulating layer. The first interlayer insulating layer and second interlayer insulating layer may be configured of the same material, or may be configured of different materials. Also, the lower layer of the second interlayer insulating layer and the upper layer of the second interlayer insulating layer may be configured of the same material, or may be configured of different materials.

Hereinafter, the conductor portions which make up the third shield wall, fourth shield wall, and second direction shield wall may be referred to as "third conductor portions", "fourth conductor portions", and "conductor portions of the second direction shield wall" respectively, and the first conductor portions, second conductor portions, third conductor portions, and fourth conductor portions may be collectively referred to simply as "first conductor portions or the like". Here, it is a preferable form that the third shield wall and fourth shield wall are configured of multiple columnar-shaped third conductor portions and fourth conductor portions being arrayed apart, and when viewing the third shield wall and fourth shield wall from the axial directions of the third conductor portions and fourth conductor portions (i.e., when viewing the third shield wall and fourth shield wall from above), the third conductor portions and fourth conductor portions are arrayed in two columns and also arrayed in a zigzag pattern. When projecting the first conductor portions or the like on a virtual plane (virtual vertical plane) including the axial lines of the first conductor portions or the like, the first conductor portions or the like may be arrayed in an overlapped state, or may be arrayed in a non-overlapped state. In the case of the latter, with an projected image, there may be or may not be a gap between the first conductor portions or the like and the first conductor portions or the like. The second direction shield wall is configured of the multiple columnar-shaped conductor portions (conductor portions of the second direction shield wall) being arrayed apart, but when viewing the second direction shield wall from the axial directions of the conductor portions of the second direction shield wall (i.e., when viewing the second direction shield wall from above), the multiple columnar-shaped conductor portions of the second direction shield wall may be arrayed in two columns and also arrayed in a zigzag pattern, or may be arrayed in one column. Between the first conductor portions or the like and the first conductor portions or the like, or between the conductor portions of the second direction shield wall and the conductor portions of the second direction shield wall is filled with an extended portion of an interlayer insulating layer surrounding these shield walls.

Examples of a electroconductive material according to the related art serving as a material making up the first conductor portions or the like and the conductor portions of the second direction shield wall include copper (Cu), silver (Ag), aluminum (Al), platinum (Pt), titanium (Ti), ruthenium (Ru), molybdenum (Mo), tungsten (W), and nickel (Ni). Alloys of these may also be exemplified. An electroconductive paste material may also be employed as an electroconductive material. With the first conductor portions or the like and the conductor portions of the second direction shield wall, based on a method according to the related art, an opening portion may be formed in the interlayer insulating layer, and such an opening portion may be embedded with an electroconductive material. In some cases, alternatively, the first shield wall, second shield wall, third shield wall, fourth shield wall, and second direction shield wall may be formed by forming a recessed portion or groove portion in the interlayer insulating layer, and embedding an electroconductive material in such a recessed portion or groove portion.

The first shield wall, second shield wall, third shield wall, fourth shield wall, and second direction shield wall are connected to a predetermined fixed potential, for example, such as power source $V_{SS}$ or power sources $V_{CC}$ and $V_{DD}$ via the shield wiring portion.

With the light-emitting elements according to the first through third forms of the present disclosure including various preferred forms described above, a display device including such light-emitting elements according to the first through third form according to the present disclosure, or an electronic device including such a display device (hereinafter, these collectively referred to as "light-emitting elements or the like of the present disclosure"), the emitting unit and driving circuit are provided to a first substrate. On the other hand, a second substrate is disposed on the emitting unit or above the emitting unit. The emitting unit may specifically be configured of an organic electroluminescence emitting unit (organic EL emitting unit), for example. More specifically, the emitting unit is configured of a first electrode (e.g., anode electrode), an organic layer including an emitting layer, and a second electrode (e.g., cathode electrode), for example. A transistor making up the driving circuit is formed on the first substrate. Also, the capacitor unit may be configured of one of the electrodes, the other electrode, and a dielectric layer (insulating layer) sandwiched with these electrodes, and is, for example, allocated in the second interlayer insulating layer. The emitting unit is formed above the transistor making up the driving circuit via the interlayer insulating layer (specifically, the first interlayer insulating layer, second interlayer insulating layer, or the like). The other source/drain region of the driving transistor is connected to the first electrode provided to the emitting unit via a contact hole.

A form may be made wherein light from each light-emitting element is externally emitted via the second substrate. Note that such a display device may be referred to as "upper face emission type display device". Alternatively, a form may be made wherein light from each light-emitting element is externally emitted via the first substrate. Note that such a display device may be referred to as "lower face emission type display device".

The organic layer includes the emission layer (e.g., emission layer made of an organic emission material), but may specifically be configured of a laminated configuration between a hole transportation layer and an emission layer and an electron transportation layer, a laminated configuration between a hole transportation layer and an emission layer which also serves as an electron transportation layer, a laminated configuration of a hole injection layer, a hole transportation layer, an emission layer, and an electron transportation layer, and an electron injection layer, or the like, for example. Also, in the event that these laminated configurations and so forth are taken as a "tandem unit", the organic layer may have a two-stage tandem configuration wherein a first tandem unit, a connection layer, and a second tandem unit are laminated, and may further have a three or more stage tandem configuration where three or more tandem units are laminated, and in these cases, the organic layer may be obtained wherein the emission color at each tandem unit is differentiated into red, green, and blue, thereby emitting white as a whole. Examples of an organic layer forming method include a physical vapor deposition method (PVD method) such as a vacuum evaporation method or the like; a printing method such as a screen printing method or inkjet printing method; a laser transfer method wherein laser light is irradiated on the laminated configuration of a laser absorption layer formed on a substrate for transfer and the organic layer, thereby separating the organic layer on the laser absorption layer to transfer the organic layer; and various coating methods. In the event of forming an organic layer based on the vacuum evaporation method, an organic layer may be obtained by using a so-called metal mask, and depositing a material passed through an opening provided to such a metal mask, or an organic layer may be formed on the entire surface without patterning.

As a material (light reflecting material) making up a first electrode in an upper face emission type display device or a second electrode in a lower face emission type display device (these electrodes will be referred to as "light reflecting electrode" for convenience), in the event of having the light reflecting electrode serve as an anode electrode, examples of this material include metal having a high work function such as platinum (Pt), gold (Au), silver (Ag), chrome (Cr), tungsten (W), nickel (Ni), copper (Cu), iron (Fe), cobalt (Co), tantalum (Ta), titanium (Ti), aluminum (Al), ruthenium (Ru), molybdenum (Mo), zinc (Zn), tin (Sn), and zirconium (Zr), and alloys (e.g., Ag—Pd—Cu alloy which take silver as a main ingredient, and includes palladium (Pd) of 0.3 to 1 percent by mass, and copper (Cu) of 0.3 to 1 percent by mass, an aluminum alloy such as Al—Nd alloy or Al—Ce alloy). Further, in the event of employing an electroconductive material having a small work function value and also having a high optical reflectance such as aluminum (Al) or an alloy including aluminum, this may be employed as an anode electrode by improving the hole injection property thereof by providing a suitable hole injection layer or the like. Examples of the thickness of the light reflecting electrode include 0.1 μm to 1 μm. Alternatively, a configuration may be made wherein a transparent electroconductive material which excels in a hole injection property such as oxide of indium and tin (ITO), oxide of indium and zinc (IZO), or the like is laminated on a reflection film having a high optical reflectance such as a dielectric multilayer or aluminum (Al). On the other hand, in the event of having the light reflecting electrode serve as a cathode electrode, it is desirable that the light reflecting electrode is configured of an electroconductive material having a small work function value and also having a high optical reflectance, but the light reflecting electrode may be used as a cathode electrode by providing a suitable electron injection layer to an electroconductive material having a high optical reflectance to be used as an anode electrode to improve the electron injection priority.

On the other hand, as a material (semi-light transmitting material or light transmitting material) making up a second electrode in an upper face emission type display device or a first electrode in a lower face emission type display device (these electrodes will be referred to as "semi-light transmitting electrode" for convenience), in the event of having the semi-light transmission electrode serve as a cathode electrode, it is desirable that the semi-light transmission material is configured of an electroconductive material having a work function value so as to transmit emission light and also so as to effectively inject electrons into the organic layer, and examples of this material include metal or alloy having a small work function such as aluminum (Al), silver (Ag), magnesium (Mg), calcium (Ca), natrium (Na), strontium (Sr), copper (Cu), alkali metal or alkali earth metal and silver (Ag) (e.g., an alloy of magnesium (Mg) and silver (Ag) (Mg—Ag alloy)), an alloy of magnesium and calcium (Mg—Ca alloy), an alloy of aluminum (Al) and lithium (Li) (Al—Li alloy), and so forth, and among these, the Mg—Ag alloy is desirable, and Mg:Ag=5:1 to 30:1 may be exemplified as a volume ratio between magnesium and silver. Alternatively, Mg:Ca=2:1 to 10:1 may be exemplified as a volume ratio between magnesium and calcium. As the thickness of the semi-light transmission electrode, 4 nm to 50 nm, preferably 4 nm to 20 nm, more preferably 6 nm to 12 nm may be exemplified. Alternatively, the semi-light transmission electrode may also be configured of transparent conductive oxide, more specifically, a zinc-oxide material including, for example, zinc oxide (ZnO), aluminum-oxide-doped zinc oxide (AZO), gallium-doped zinc oxide (GZO), In—GaZnO$_4$ (IGZO), an indium-zinc compound oxide (IZO), and F-doped zinc oxide (FZO); an indium oxide material including indium oxide (In$_2$O$_2$), Sn-doped In$_2$O$_2$ of (ITO), and fluorine-doped SnO$_2$ (FTG); or a tin oxide material including tin oxide (SnO$_2$), antimony-doped SnO$_2$ of (ATO), and F-doped SnO$_2$ of (FTO). Alternatively, the semi-light transmission electrode may also have a laminated configuration of a first layer made of, from the organic layer side, the above electroconductive material, and a second layer made of the above transparent electroconductive oxide (e.g., thickness $3 \times 10^{-8}$ m to $1 \times 10^{-6}$ m). In a case of a laminated structure, the thickness of the first layer may be reduced, to be 1 nm to 4 nm. Also, the semi-light transmission electrode may also be configured of a transparent electrode alone. Alternatively, a bus electrode (auxiliary electrode) made of a low-resistance material such as aluminum, aluminum alloy, silver, silver alloy, copper, copper alloy, gold, gold alloy, or the like may be provided to the semi-light transmission electrode to realize low resistance as the entire semi-light transmission electrode. On the other hand, in the event of having the semi-light transmission electrode serve as an anode electrode, it is desirable that the semi-light transmission electrode is configured of an electroconductive material which transmits emission light and also has a great work function value.

Examples of a method for forming the first electrode or second electrode include an evaporation method including an electron beam evaporation method, a hot filament evaporation method, and a vacuum evaporation method, a sputtering method, a chemical vapor-phase-growth method (CVD method) or MOCVD method, a combination of an ion-plating method and an etching method; various printing methods such as screen printing method, an inkjet printing method, and a metal mask printing method; a plating method (an electroplating method and an electroless deposition method); a lift-off method; a laser ablation method; a sol-gel method; and so forth. According to various printing methods or plating methods, the first electrode and second electrode having a desired shape (pattern) may directly be formed. Note that in the event of forming the first electrode and second electrode after forming the organic layer, it is particularly desirable from a viewpoint for suppressing occurrence of damage of the organic layer, to form the first electrode and second electrode based on a film formation method wherein film formation particles have small energy such as the vacuum evaporation method, or film formation method such as the MOCVD method. Occurrence of damage as to the organic layer may cause a non-emitting pixel (or non-emitting sub pixel) called "dark spot" due to occurrence of a leakage current. Also, it is desirable from a viewpoint for suppressing deterioration in the organic layer due to moisture in the atmosphere to execute from formation of the organic layer to formation of these electrodes without exposure to the atmosphere. In some cases, patterning may be omitted regarding one or the other of the first electrode and second electrode.

In order to suppress moisture from reaching the organic layer, an insulating or electroconductive protective film may be provided above the organic layer. In the event that the display device is an upper face emission type, it is desirable that the protective film is configured of a material which transmits 80% or more of light generated at the organic layer, and more specifically, an insulating material having an inorganic amorphous property, for example, regarding which the following materials may be exemplified. Such an insulating material having an inorganic amorphous property generates no grains, thereby making up a suitable protective film with low water permeability. Specifically, it is desirable to employ a close material which is transparent as to light emitted at the emission layer, and transmits no moisture, as a material making up the protective film. More specifically, examples of this material include amorphous silicon ($\alpha$-Si), amorphous carbonization silicon ($\alpha$-SiC), amorphous silicon nitride ($\alpha$-Si$_{1-x}$N$_x$), amorphous silicon oxide ($\alpha$-Si$_{1-y}$O$_y$), amorphous carbon ($\alpha$-C), amorphous silicon oxynitride ($\alpha$-SiON), and Al$_2$O$_3$. Note that, in the event that the protective film is configured of an electroconductive material, the protective film may be configured of the above transparent electroconductive material such as ITO or IZO.

A silicon semiconductor substrate or a silicon semiconductor substrate where an insulating film is formed on the surface may be employed as the first substrate, and in this case, the transistor making up the driving circuit may be configured of a field-effect transistor.

Alternatively, examples of the first substrate include a quartz glass substrate, a high-distortion point glass substrate, a soda glass (Na$_2$O.CaO.SiO$_2$) substrate, a phosphate glass substrate, a borosilicate glass (Na$_2$O.B$_2$O$_3$.SiO$_2$) substrate, a forsterite (2MgO.SiO$_2$) substrate, a lead glass (Na$_2$O.PbO.SiO$_2$) substrate, various glass substrates where an insulating film is formed on the surface, a quartz substrate, a quartz substrate where an insulating film is formed on the surface, polymethylmethacrylate (polymethyl methacrylate, PMMA), polyvinyl alcohol (PVA), polyvinyl phenol (PVP), polyether sulphone (PES), polyimide, polycarbonate (PC), polyethylene terephthalate (PET), polybutylene terephthalate (PBT), polyethylenenaphthalate (PEN), polyacetylcellulose, tetraacetyl cellulose, polyphenylene sulfide, polyethylene (PE), polypropylene (PP), polyvinylidene fluoride, brominated phenoxy, polyamide, polystyrene, polyarylate, polysulfone such as polyester sulfone, organic polymer (having a polymer material form such as plastic film, plastic sheet, or plastic substrate which is configured of a polymer material and has flexibility) exemplified as polyolefin. In the event that the first substrate is configured of these materials, the transistor making up the driving circuit may be configured of a thin-film transistor. The thin-film transistor may be a bottom gate/top contact type, or may be a bottom gate/bottom contact type, or may be a top gate/top contact type, or may be a top gate/bottom contact type. The second substrate may also be configured of the above materials described as materials making up the first substrate. The materials making up the first substrate and second substrate may be the same, or may differ. The first substrate and second substrate may have a single layer configuration, or may have a laminated configuration.

With the display device according to the present disclosure, or the display device according to the present disclosure included in an electronic device, the configuration and architecture of various circuits such as a current supply unit, an image signal output circuit, a scanning circuit, and so forth, and various wirings such as a current supply line, a data line, a scanning line, and so forth may be a configuration and architecture according to the related art.

With the light-emitting elements according to the present disclosure, the driving circuit may be configured of a driving circuit made up of two transistors (driving transistor and image signal writing transistor) and one capacitor unit (referred to as "2Tr/1C driving circuit"), a driving circuit made up of three transistors (driving transistor and image signal writing transistor and one transistor) and one capacitor unit (referred to as "3Tr/1C driving circuit"), a driving circuit made up of four transistors (driving transistor and image signal writing transistor and two transistors) and one capacitor unit (referred to as "4Tr/1C driving circuit"), or a driving circuit made up of five transistors (driving transistor and image signal writing transistor and three transistors) and one capacitor unit (referred to as "5Tr/1C driving circuit").

The display device according to the present disclosure, or the display device according to the present disclosure included in an electronic device may have configuration of so-called monochrome display, or may have configuration of color display. In the case of the latter, there may be a form wherein one pixel is configured of multiple sub pixels, and specifically, one pixel is configured of three sub pixels of a red light-emitting sub pixel configured to emit red, a green light-emitting sub pixel configured to emit green, and a blue light-emitting sub pixel configured to emit blue. In this case, in the event that the number of light-emitting elements making up the display device is N×M, the number of pixels is (N×M)/3. Further, one pixel may be configured of one set wherein one kind or multiple kinds of sub pixels (e.g., one set to which a sub pixel configured to emit white light to improve luminance is added, one set to which a sub pixel configured to emit complementary color to extend the color reproducing range is added, one set to which a sub pixel configured to emit yellow to extend the color reproducing range is added, or one set to which a sub pixel configured to emit yellow and cyan is added to extend the color reproducing range) are added to these three sub pixels. Alternatively, the upper face emission type display device may be configured such that the second substrate has a color filter, the light-emitting elements are configured to emit white light, and the color light-emitting sub pixels are configured of a combination of the light-emitting elements configured to emit white light and the color filter. The second substrate may be configured to include a light shielding film (black matrix). Similarly, the lower face emission type display device may be configured such that the first substrate is configured to include a color filer and a light shielding film (black matrix).

The display device may be, as described above, configured of an organic EL display device. The organic EL display device may be used as a monitor device making up a personal computer, video camera, or digital still camera, or may be used as a monitor device embedded in a television receiver, cellular phone, personal digital assistant (PDA), or game machine. Alternatively, the organic EL display device may be applied to a electronic view finder (EVF) or a head mounted display (HMD). In addition, the organic EL display device may be applied to a lighting apparatus including a backlight device for liquid crystal display device, and a surface light source device.

At the display device according to the present disclosure, or the display device according to the present disclosure included in an electronic device, with a form wherein one pixel (or sub pixel) is configured of one light-emitting element, though not restricted to this, examples of an array of pixels (or sub pixels) may include a striped array, a diagonal array, a delta array, and a rectangle array. Also, with a form wherein one pixel (or sub pixel) is configured of multiple light-emitting elements being grouped, though not restricted to this, examples of an array of pixels (or sub pixels) may include a striped array.

First Embodiment

The first embodiment relates to light-emitting elements according to the first form, second form, and third form of the present disclosure, a display device including such light-emitting elements, and an electronic device including such a display device.

Figure 2:
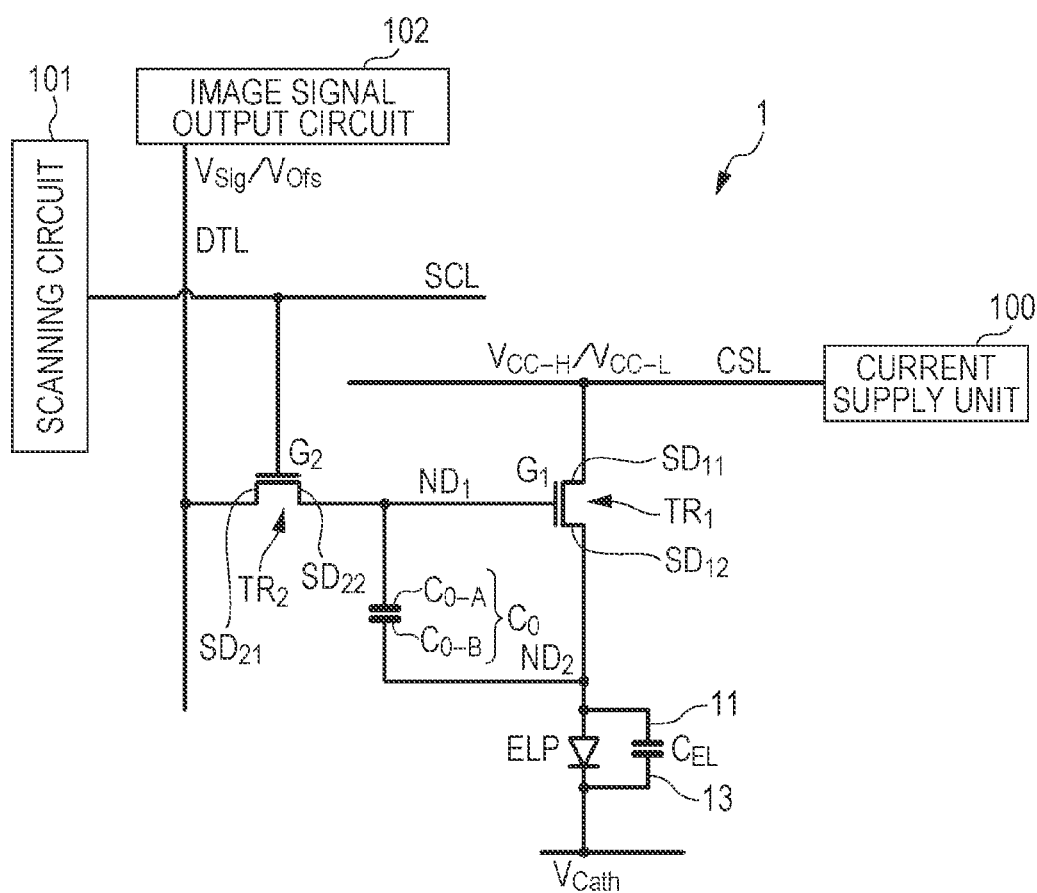
FIG. 2 is an equivalent circuit of a 2Tr/1C driving circuit according to the first embodiment.
Figure 3:
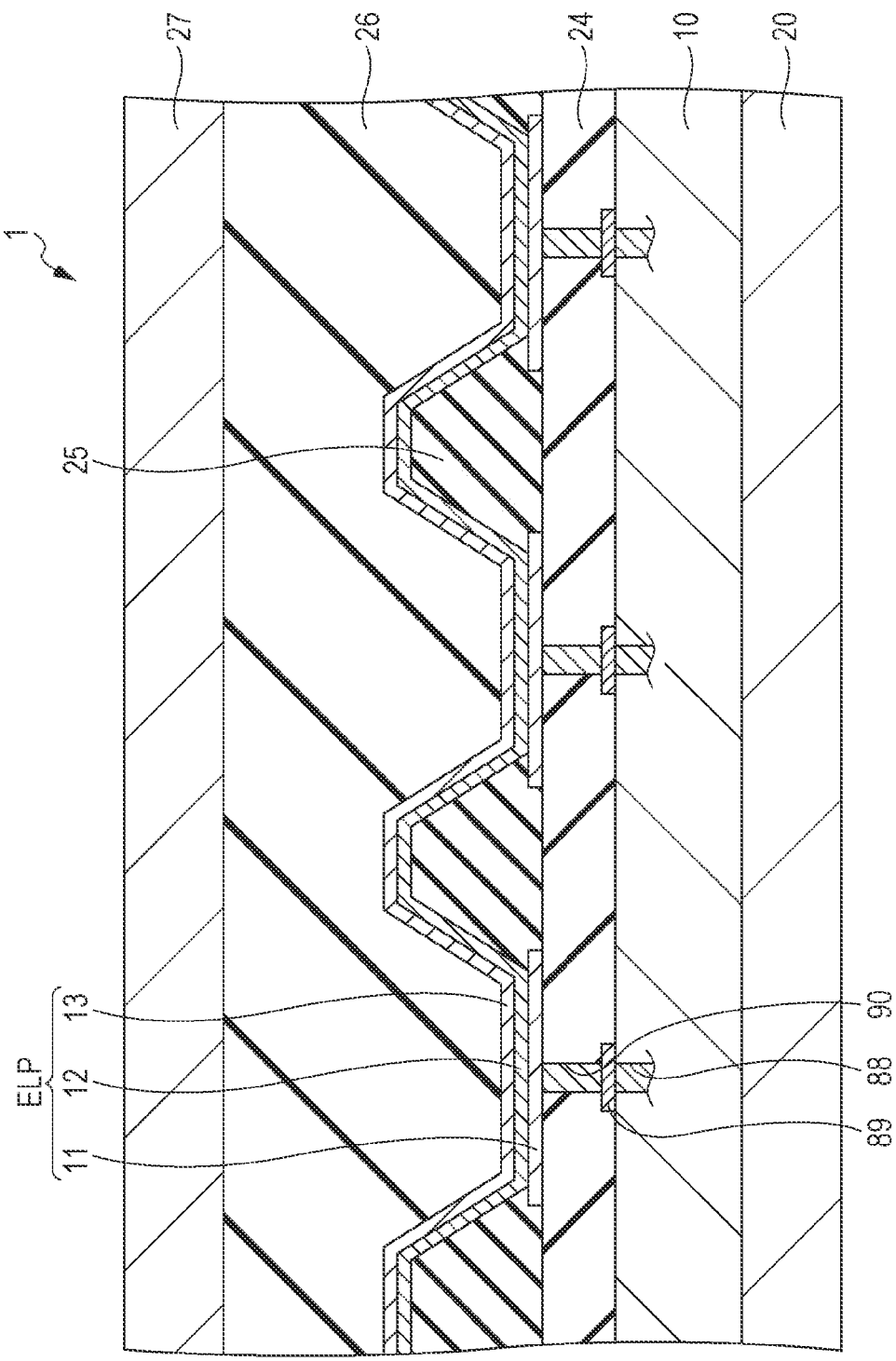
FIG. 3 is a schematic partial cross-sectional view of a light-emitting element according to the first embodiment.
Figure 4:
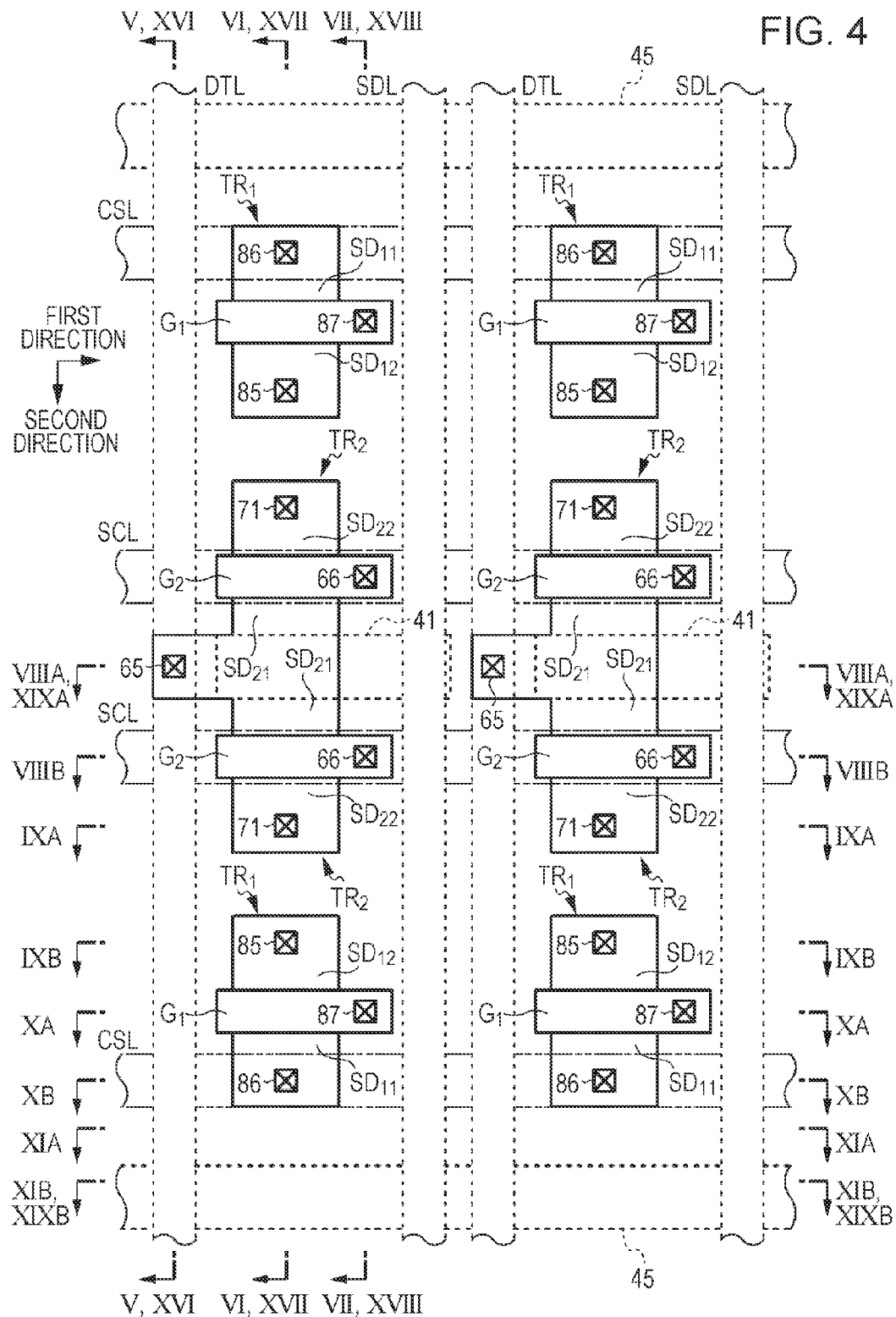
FIG. 4 is a diagram schematically illustrating a layout state of components of a display device or light-emitting element according to the first embodiment.
Figure 5:
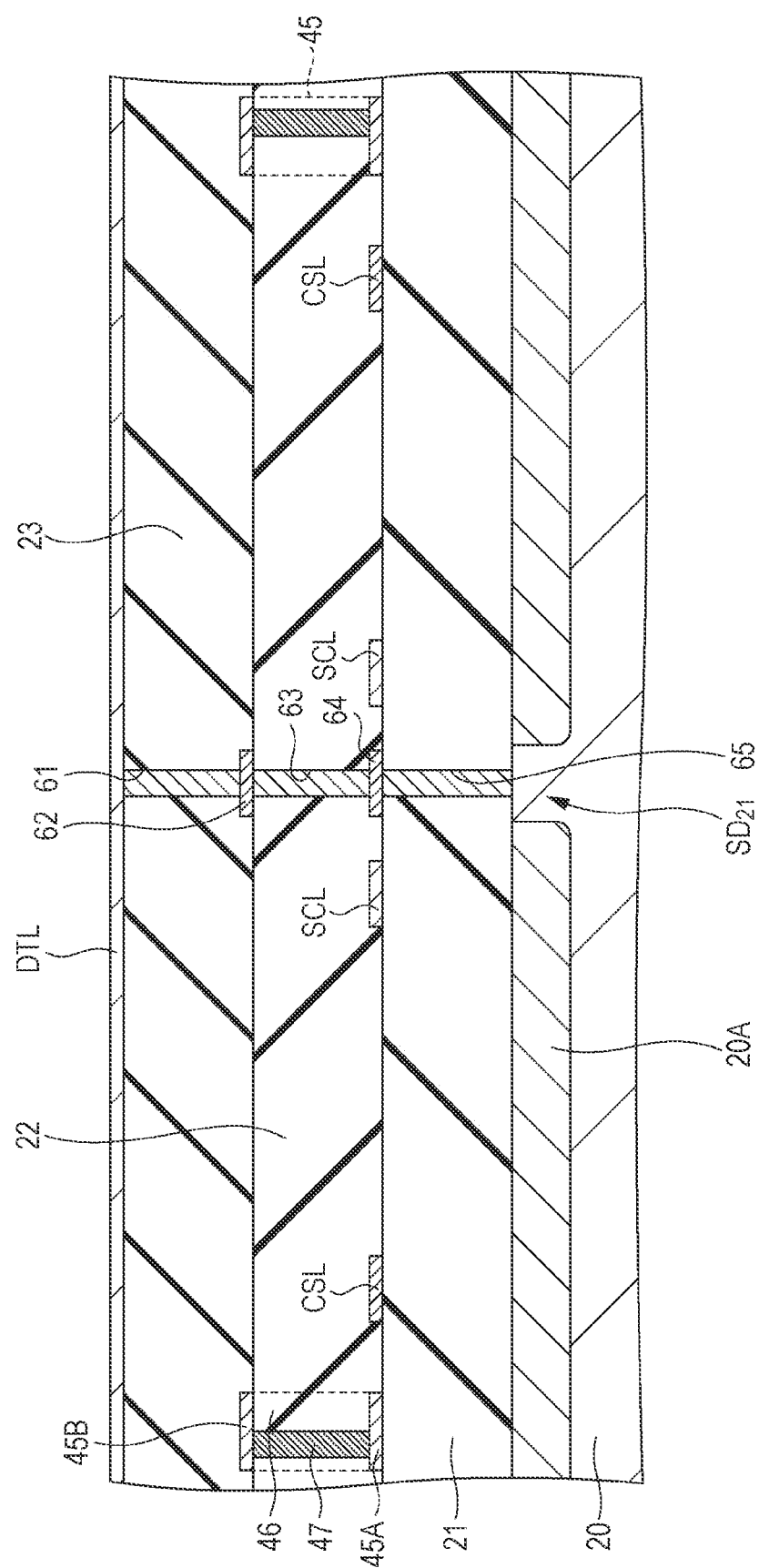
FIG. 5 is a schematic partial cross-sectional view of the display device or light-emitting element according to the first embodiment taken along arrow V-V in FIG. 4.
Figure 6:
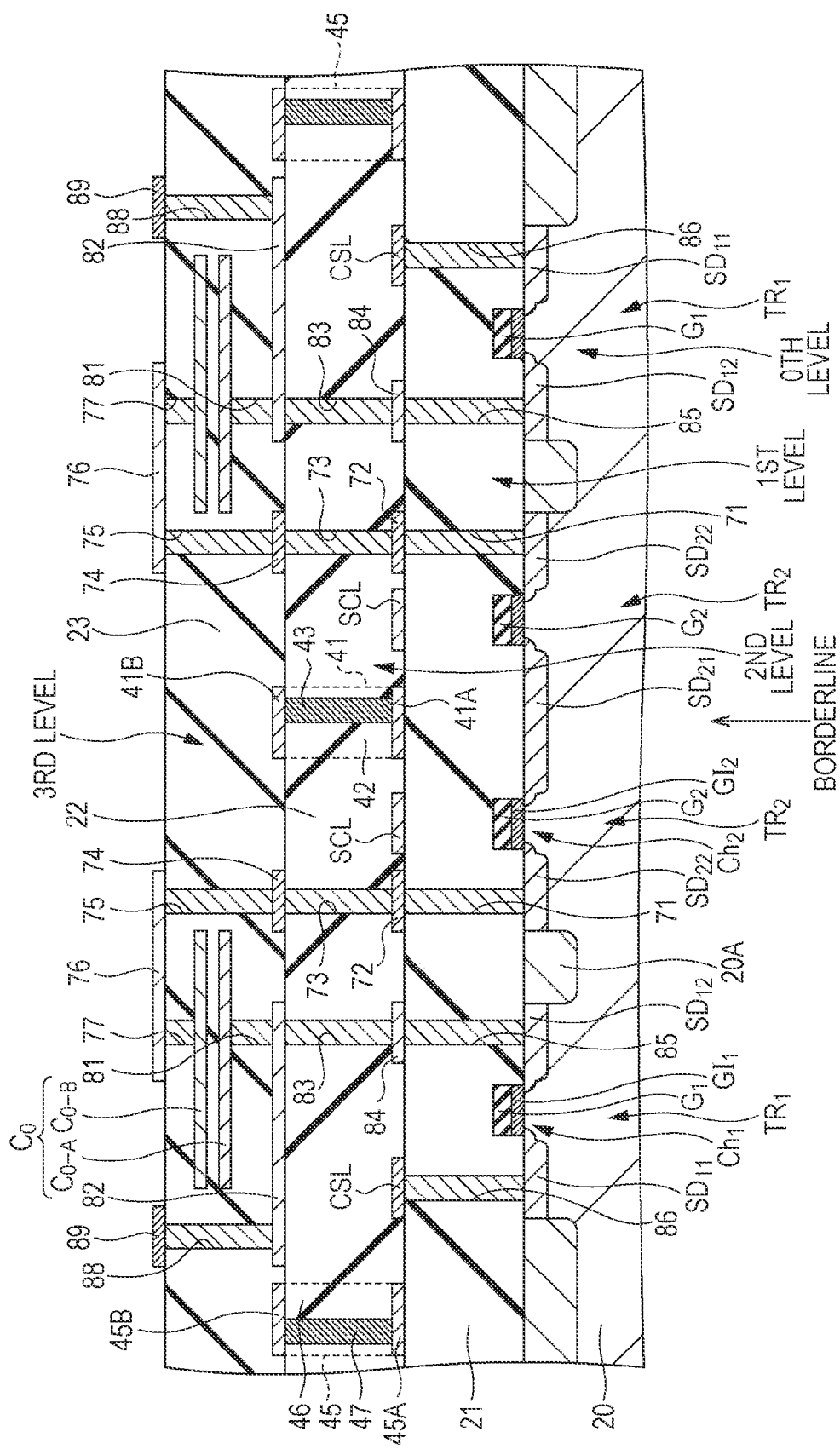
FIG. 6 is a schematic partial cross-sectional view of the display device or light-emitting element according to the first embodiment taken along arrow VI-VI in FIG. 4.
Figure 7:
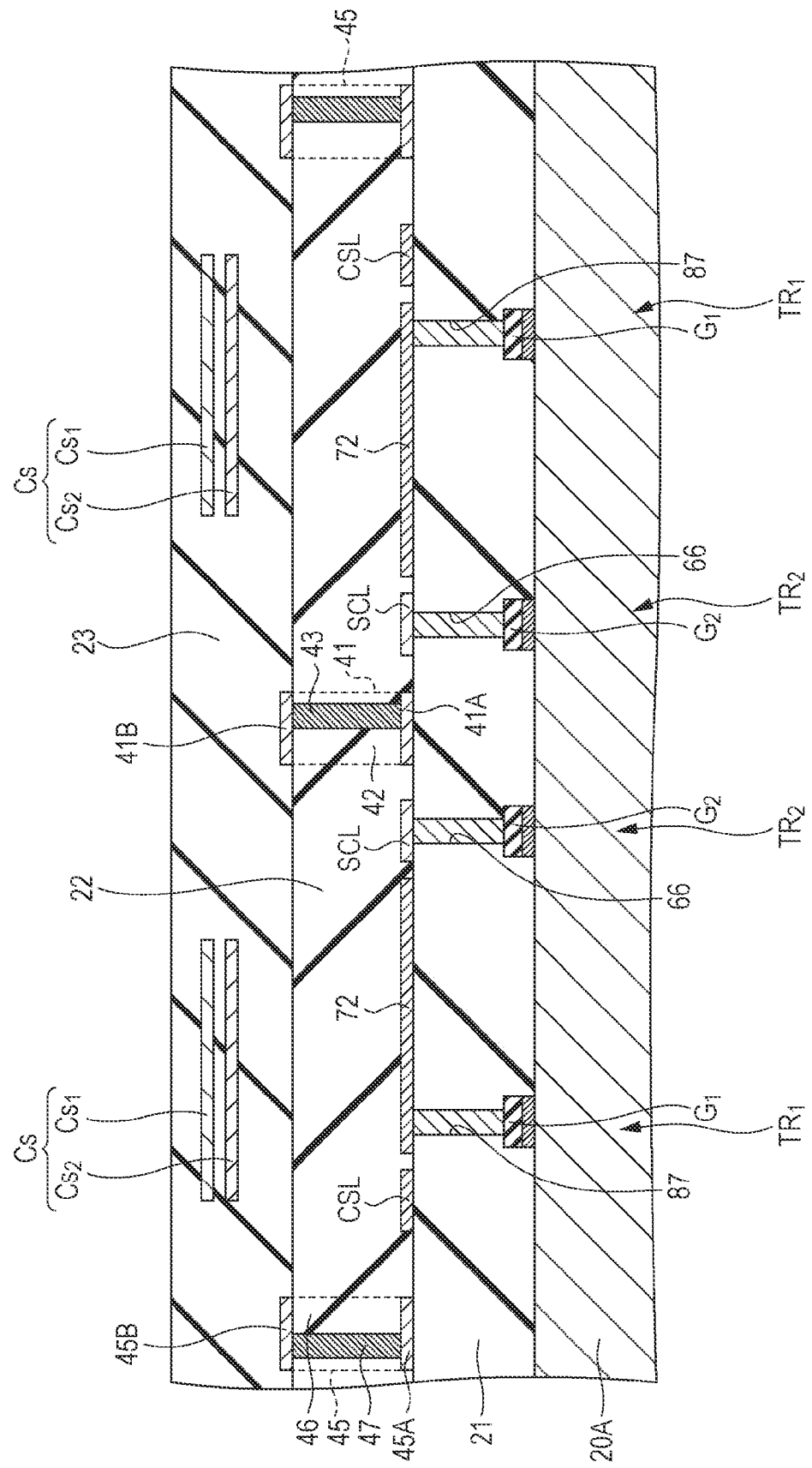
FIG. 7 is a schematic partial cross-sectional view of the display device or light-emitting element according to the first embodiment taken along arrow VII-VII in FIG. 4.
Figure 8A:
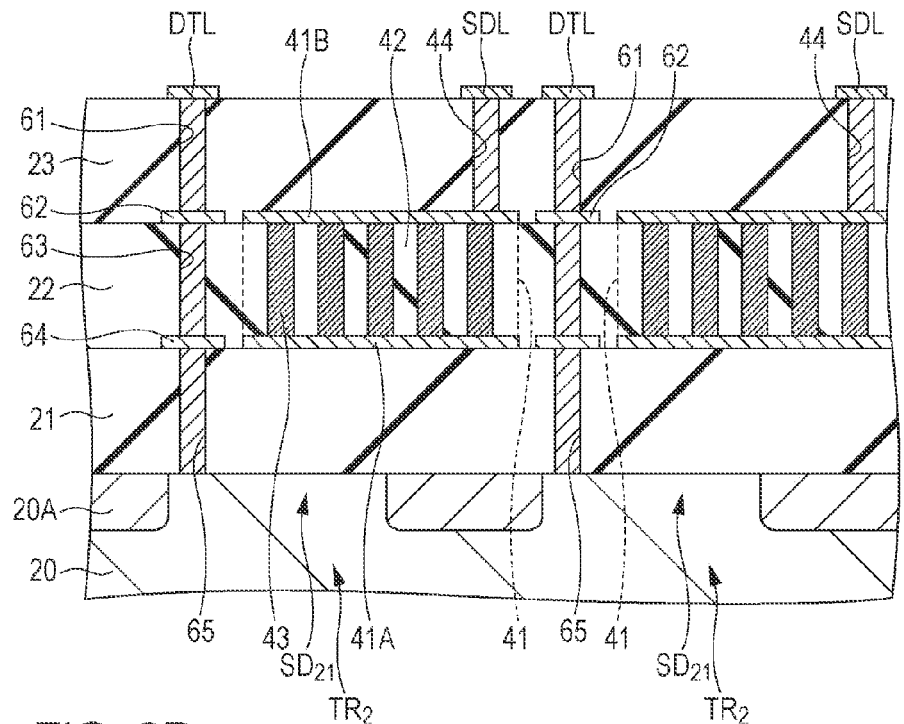
FIGS. 8A and 8B are schematic partial cross-sectional views of the display device or light-emitting element according to the first embodiment taken along arrow VIIIA-VIIIA and arrow VIIIB-VIIIB in FIG. 4, respectively.
Figure 8B:
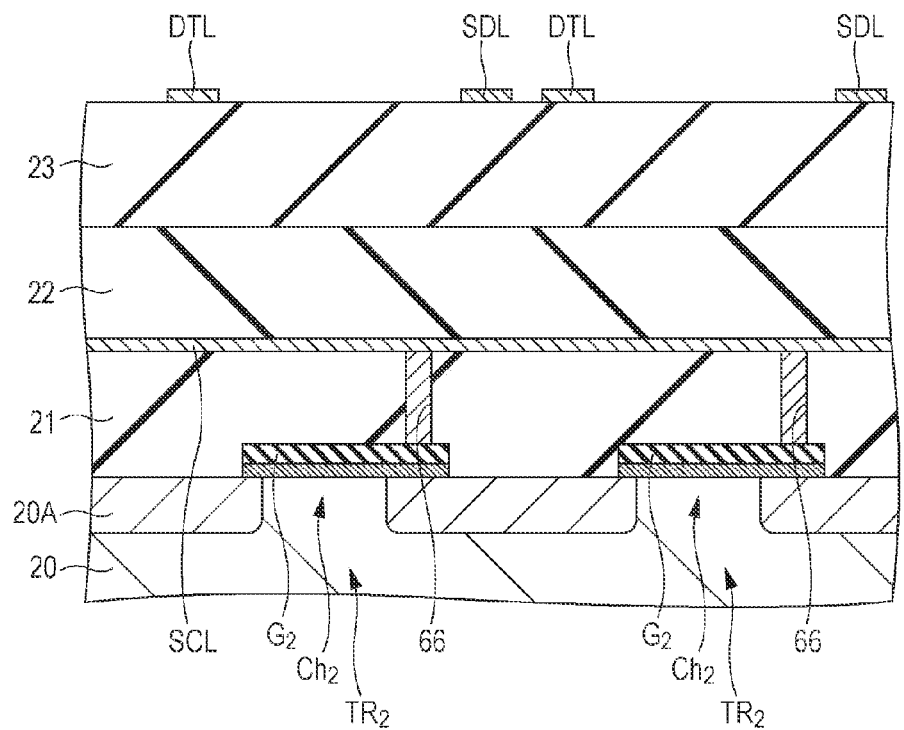
Figure 10A:
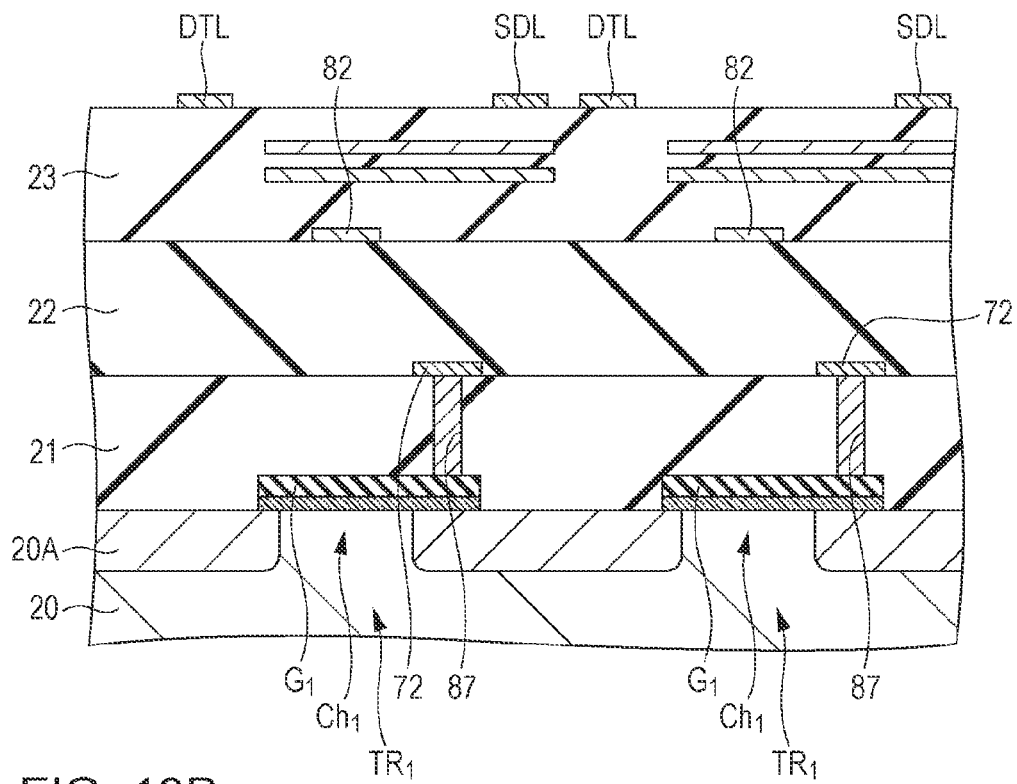
FIGS. 10A and 10B are schematic partial cross-sectional views of the display device or light-emitting element according to the first embodiment taken along arrow XA-XA and arrow XB-XB in FIG. 4, respectively.
Figure 10B:
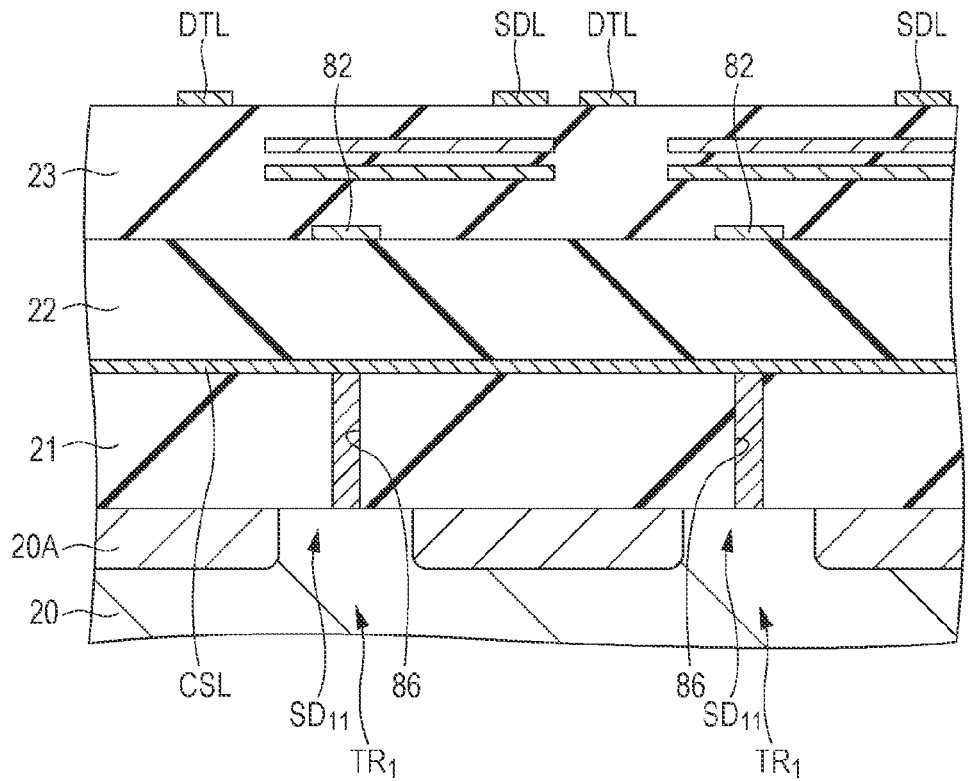
Figure 12:
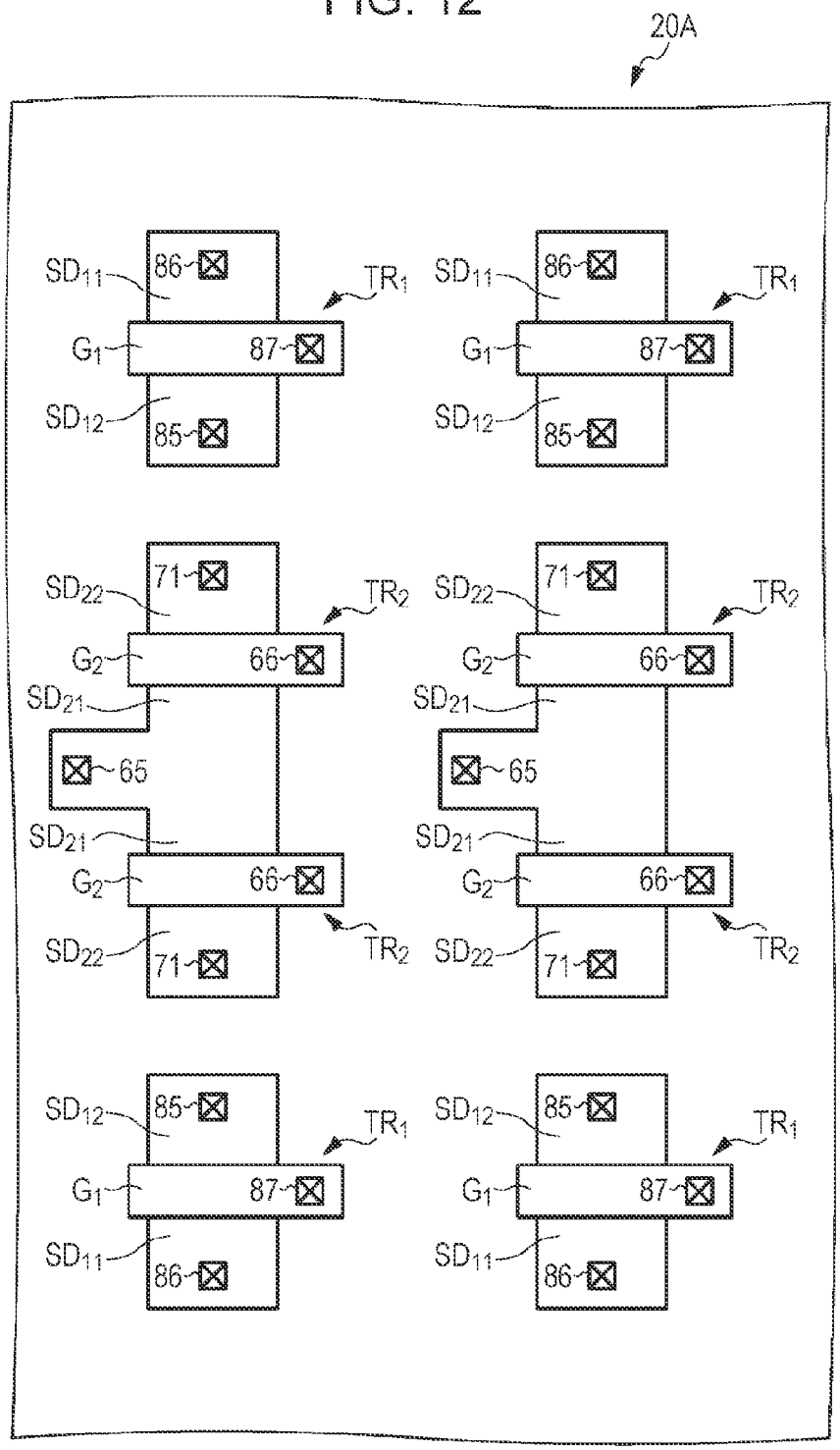
FIG. 12 is a diagram schematically illustrating a layout state of components of the display device or light-emitting element according to the first embodiment at the substrate surface.
Figure 13:
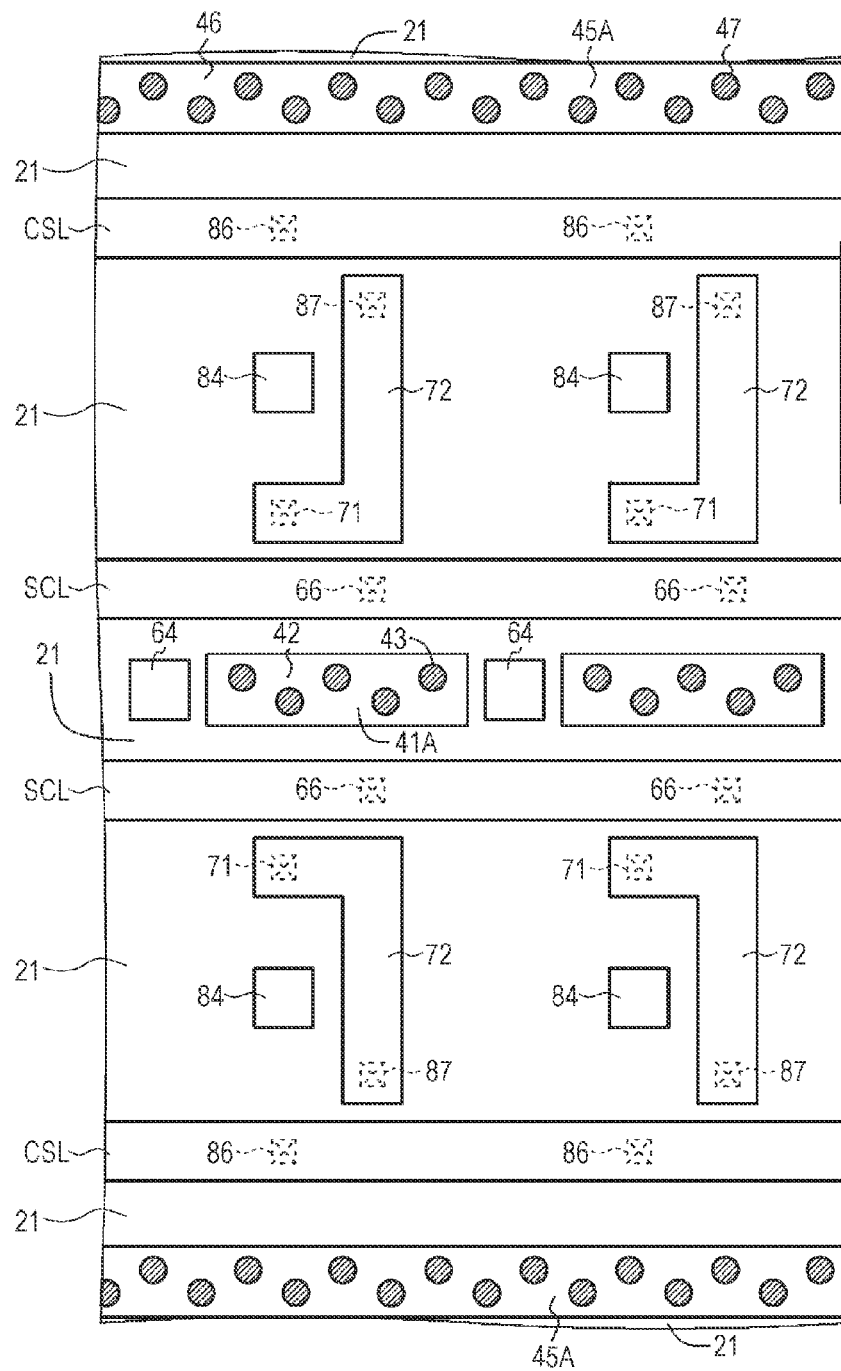
FIG. 13 is a diagram schematically illustrating a layout state of components of the display device or light-emitting element according to the first embodiment at the surface of a first interlayer insulating layer.
Figure 14:
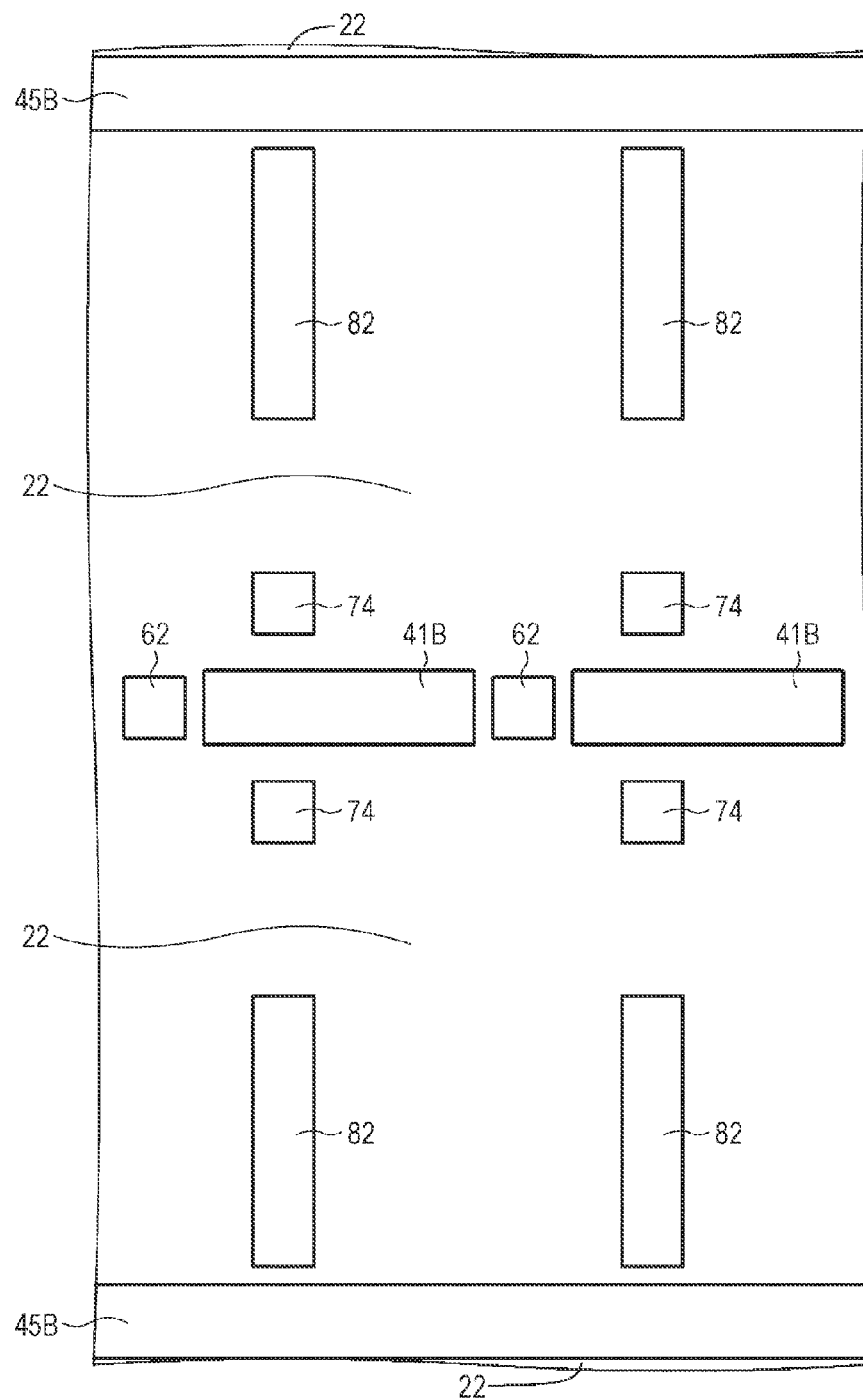
FIG. 14 is a diagram schematically illustrating a layout state of components of the display device or light-emitting element according to the first embodiment at the surface of a lower layer of a second interlayer insulating layer.
Figure 15:
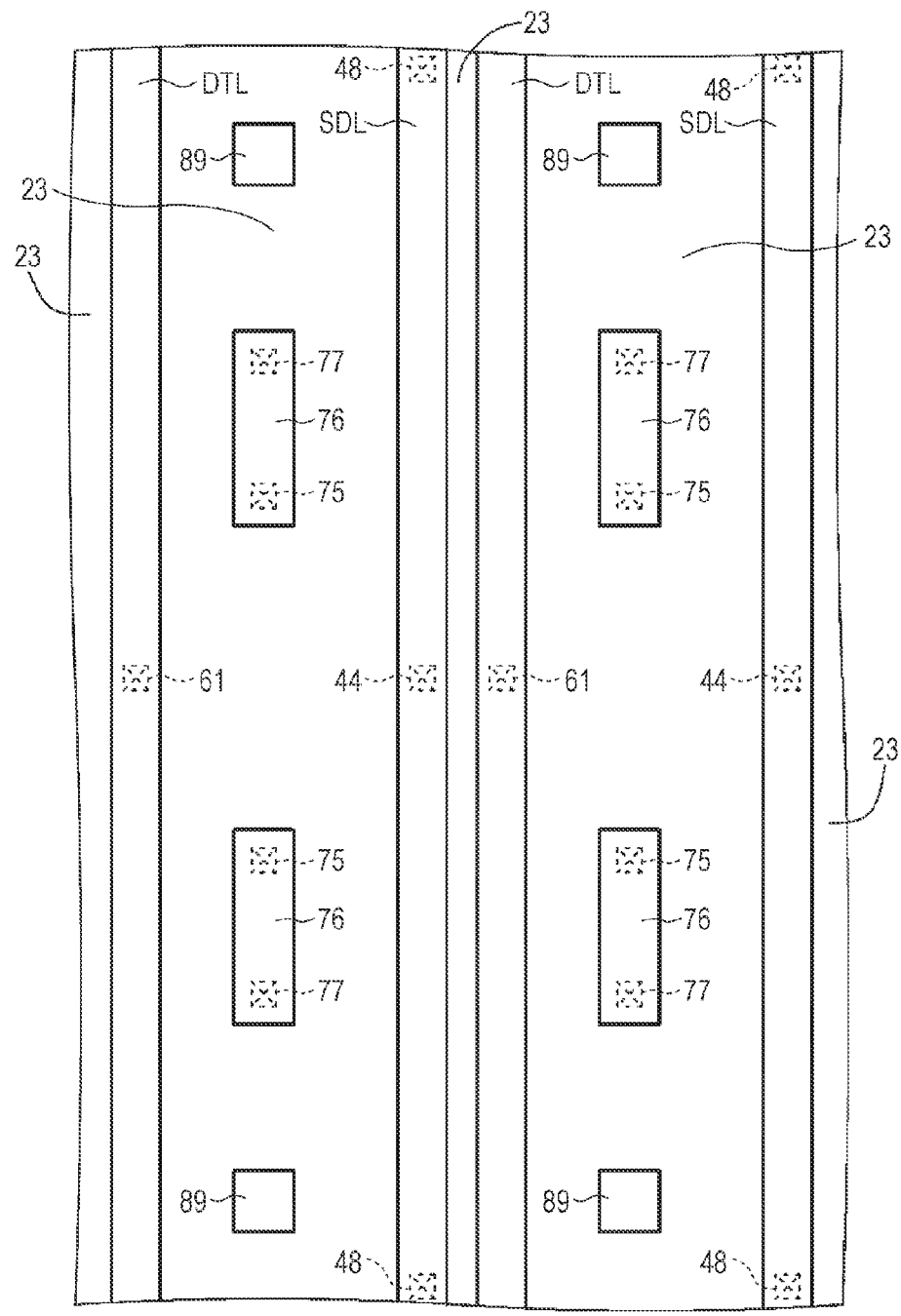
FIG. 15 is a diagram schematically illustrating a layout state of components of the display device or light-emitting element according to the first embodiment at the surface of an upper layer of the second interlayer insulating layer.

FIG. 1 illustrates a conceptual diagram of circuits making up the display device according to the first embodiment, FIG. 2 illustrates an equivalent circuit diagram of a light-emitting element including a driving circuit in the display device according to the first embodiment (an example wherein the driving circuit is a driving circuit (2Tr/1C driving circuit) configured of two transistors $TR_1$ and $TR_2$ and one capacitor unit $C_0$), and FIG. 3 illustrates a schematic partial cross-sectional view of the light-emitting element. Also, FIG. 4 schematically illustrates a layout state of components of the display device or light-emitting element according to the first embodiment. Further, FIG. 5 illustrates a schematic partial cross-sectional view of the display device or light-emitting element according to the first embodiment taken along arrow V-V in FIG. 4, FIG. 6 illustrates a schematic partial cross-sectional view of the display device or light-emitting element according to the first embodiment taken along arrow VI-VI in FIG. 4, and FIG. 7 illustrates a schematic partial cross-sectional view of the display device or light-emitting element according to the first embodiment taken along arrow VII-VII in FIG. 4. Also, FIGS. 8A and 8B illustrate a schematic partial cross-sectional view of the display device or light-emitting element according to the first embodiment taken along arrow VIIIA-VIIIA and arrow VIIIB-VIIIB in FIG. 4 respectively, FIGS. 9A and 9B illustrate a schematic partial cross-sectional view of the display device or light-emitting element according to the first embodiment taken along arrow IXA-IXA and arrow IXB-IXB in FIG. 4 respectively, FIGS. 10A and 10B illustrate a schematic partial cross-sectional view of the display device or light-emitting element according to the first embodiment taken along arrow XA-XA and arrow XB-XB in FIG. 4 respectively, and FIGS. 11A and 11B illustrate a schematic partial cross-sectional view of the display device or light-emitting element according to the first embodiment taken along arrow XIA-XIA and arrow XIB-XIB in FIG. 4 respectively. Also, FIG. 12 schematically illustrates a layout state of components of the display device or light-emitting element according to the first embodiment in the substrate surface, FIG. 13 schematically illustrates a layout state of components of the display device or light-emitting element according to the first embodiment at the surface of the first interlayer insulating layer, FIG. 14 schematically illustrates a layout state of components of the display device or light-emitting element according to the first embodiment at the surface of the lower layer of the second interlayer insulating layer, and FIG. 15 schematically illustrates a layout state of components of the display device or light-emitting element according to the first embodiment at the surface of the upper layer of the second interlayer insulating layer.

The display device according to the first embodiment includes a current supply unit 100, a scanning circuit 101, an image signal output circuit 102, M current supply lines CSL which are connected to the current supply unit 100 and extend to a first direction, M scanning lines SCL which are connected to the scanning circuit 101 and extend to the first direction, N data lines DTL which are connected to the image signal output circuit 102 and extend to a second direction, and N×M light-emitting elements 1 in a two-dimensional matrix shape of N in the first direction and M in the second direction different from the first direction each of which includes an emitting unit (specifically organic EL emitting unit) ELP and a driving circuit configured to drive the emitting unit ELP. The driving circuit making up each light-emitting element 1 is connected to the current supply line CSL, scanning line SCL, and data line DTL. Note that FIG. 1 illustrates 4×3 light-emitting elements 1, but this is just an example. The scanning circuit 101 may be disposed at one edge of the scanning lines SCL, or may be disposed at both edges.

The display devices according to the first embodiment and later-described second embodiment through fourth embodiment are, as described above, configured of pixels arrayed in two-dimensional matrix of N×M, and one pixel is configured of three sub pixels (a red light-emitting sub pixel configured to emit red, a green light-emitting sub pixel configured to emit green, and a blue light-emitting sub pixel configured to emit blue). Also, the sub pixels are configured of a light-emitting element.

Now, description will be made with reference to the light-emitting elements according to the first form of the present disclosure. The light-emitting elements 1 according to the first embodiment and later-described second embodiment to fourth embodiment include an emitting unit ELP and a driving circuit configured to drive the emitting unit ELP, and the driving circuit is configured of at least (A) a transistor $TR_1$ including source/drain regions $SD_{11}$ and $SD_{12}$, a channel formation region $Ch_1$, and a gate electrode $G_1$, (B) an image signal writing transistor $TR_2$ including source/drain regions $SD_{21}$ and $SD_{22}$, a channel formation region $Ch_2$, and a gate electrode $G_2$, and (C) a capacitor unit $C_0$. Reference numerals $GI_1$ and $GI_2$ denote a gate insulating layer.

In other words, the display device according to the first embodiment includes multiple light-emitting elements each of which includes an emitting unit ELP and a driving circuit configured to drive the emitting unit ELP, and the driving circuit is configured of at least a capacitor unit Co, an image signal writing transistor $TR_2$ which holds a driving signal (luminance signal) $V_{Sig}$ at the capacitor $C_0$, and a driving transistor $TR_1$ which drives the emitting unit ELP based on the driving signal (luminance signal) $V_{Sig}$ held at the capacitor $C_0$.

Now, at the driving transistor $TR_1$, (A-1) one source/drain region $SD_{11}$ is connected to a current supply line CSL extending in the first direction, (A-2) the other source/drain region $SD_{12}$ is connected to the emitting unit ELP and also connected to one edge $C_{0-B}$ of the capacitor unit $C_0$, which makes up a second node $ND_2$, and (A-3) the gate electrode $G_1$ is connected to the other source/drain region $SD_{22}$ of the image signal writing transistor $TR_2$, and also connected to the other edge $C_{0-A}$ of the capacitor $C_0$, which makes up a first node $ND_1$.

On the other hand, at the image signal writing transistor $TR_2$, (B-1) one source/drain region $SD_{21}$ is connected to a data line DTL extending in the second direction different from the first direction, and (B-2) the gate electrode $G_2$ is connected to a scanning line SCL extending in the first direction.

The driving transistor $TR_1$ and image signal writing transistor $TR_2$, and also, a later-described emission control transistor $T_{EL\_C}$, a first node initializing transistor $T_{ND1}$ and a second node initializing transistor $T_{ND2}$ are configured of a n-channel type MOS FET each including source/drain regions, a channel formation region, and a gate electrode, and is formed on a first substrate 20 made of a silicon semiconductor substrate. Also, these transistors are mutually separated by an element separation region 20A provided to the first substrate 20. Note that the driving transistor $TR_1$ may be formed of a p-channel type MOS FET, and further, the image signal writing transistor $TR_2$, emission control transistor $T_{EL\_C}$, first node initializing transistor $T_{ND1}$ and second node initializing transistor $T_{ND2}$ may be formed of a p-channel type MOS FET.

The driving transistor $TR_1$, image signal writing transistor $TR_2$, and capacitor unit $C_0$ are covered with the first interlayer insulating layer 21, the current supply lines CSL and scanning lines SCL are formed on the first interlayer insulating layer 21, the first interlayer insulating layer 21, current supply lines CSL, and scanning lines SCL are covered with the second interlayer insulating layer, and the data lines DTL are formed on the second interlayer insulating layer.

Here, the second interlayer insulating layer includes a laminated configuration of a lower layer 22 of the second interlayer insulating layer and an upper layer 23 of the second interlayer insulating layer. The first interlayer insulating layer 21, the lower layer 22 of the second interlayer insulating layer, and the upper layer 23 of the second interlayer insulating layer are made of $SiO_2$.

A shield wall (first shied wall 41) extending in the first direction is provided to the second interlayer insulating layer (in the first embodiment, specifically, the lower layer 22 of the second interlayer insulating layer) between one light-emitting element and a light-emitting element adjacent to the one light-emitting element in the second direction.

Alternatively, description will be made with reference to the light-emitting elements according to the second form of the present disclosure. The light-emitting elements 1 according to the first embodiment and later-described second embodiment to fourth embodiment include an emitting unit ELP and a driving circuit configured to drive the emitting unit ELP, a first shield wall 41 is provided between one light-emitting element and a light-emitting element adjacent to the one light-emitting element, the first shield wall 41 is configured of multiple columnar-shaped conductor portions (first conductor portions 43) being arrayed apart, and when viewing the first shield wall 41 from the axial directions of the first conductor portions 43, the multiple columnar-shaped first conductor portions 43 are arrayed in two columns, and also arrayed in a zigzag pattern.

Alternatively, description will be made with reference to the light-emitting elements according to the third form of the present disclosure. The light-emitting elements 1 according to the first embodiment and later-described second embodiment to fourth embodiment include an emitting unit ELP and a driving circuit configured to drive the emitting unit ELP, the driving circuit includes at least a driving transistor $TR_1$, an image signal writing transistor $TR_2$, and a capacitor unit $C_0$, the capacitor unit $C_0$ is, as illustrated in FIG. 6, provided to a higher level (the third level in the first embodiment) than a level where the driving transistor $TR_1$ and image signal writing transistor $TR_2$ are provided (the 0'th level in the first embodiment), a first shield wall 41 is provided between one light-emitting element and a light-emitting element adjacent to this one light-emitting element, to a higher level than a level where the driving transistor TR' and image signal writing transistor $TR_2$ are provided (the 0'th level) but a level (the second level in the first embodiment) equal to or lower than a level where the capacitor unit $C_0$ is provided (the third level).

Also, the display device according to the first embodiment is configured of the multiple light-emitting elements 1 according to the first embodiment being arrayed in a two-dimensional matrix shape in a first direction and a second direction different from the first direction. The electronic device according to the first embodiment includes the display device according to the first embodiment.

With light-emitting elements arrayed in the second direction, when assuming that m is an odd number, the m'th light-emitting element and the (m+1)'th light-emitting element are disposed in line symmetry as to a borderline extending in the first direction between the m'th light-emitting element and the (m+1)'th light-emitting element. Also, the first shield wall 41 is provided between the m'th light-emitting element and the (m+1)'th light-emitting element. That is to say, the light-emitting elements are "light-emitting elements disposed in symmetry". Specifically, one source/drain region $SD_{21}$ of the image signal writing transistor $TR_2$ making up the m'th light-emitting element is shared with one source/drain region $SD_{21}$ of the image signal writing transistor $TR_2$ making up the (m+1)'th light-emitting element. Accordingly, the borderline extending in the first direction passes through this shared one source/drain region $SD_{21}$ of the image signal writing transistor $TR_2$. The arrow VIIIA-VIIIA in FIG. 4 is equivalent to this borderline, and FIG. 8A is a schematic partial cross-sectional view when the light-emitting element 1 is cut away at a virtual vertical plane including the borderline.

The first shield wall 41 is formed on this borderline. The first shield wall 41 is configured of multiple columnar-shaped first conductor portions 43 being arrayed apart. When viewing the first shield wall 41 from the axial directions of the first conductor portions 43 (i.e., when viewing the first shield wall 41 from above), the multiple columnar-shaped first conductor portions 43 are arrayed in two columns, and also arrayed in a zigzag pattern. The first shield wall 41 is connected to a shield wiring portion SDL. Specifically, with the first embodiment, the first shield wall 41 is connected to a shield wiring portion SDL formed in the second interlayer insulating layer. More specifically, the first shield wall 41 is connected to a shield wiring portion SDL formed on the upper layer 23 of the second interlayer insulating layer.

Also, with "light-emitting elements disposed in symmetry" according to the first embodiment, though not necessarily, a second shield wall 45 extending in the first direction is provided between the (m−1)'th light-emitting element and the m'th light-emitting element of the light-emitting elements arrayed in the second direction. That is to say, the light-emitting elements are "light-emitting elements including the second shield wall". Here, the second shield wall 45 is, in the same way as with the first shield wall 41, configured of the multiple columnar-shaped second conductor portions 47 being arrayed apart. Note that when viewing the second shield wall 45 from the axial directions of the second conductor portions 47 (i.e., when viewing the second shield wall 45 from above), in the same way as with the first shield wall 41, the multiple columnar-shaped second conductor portions 47 are arrayed in two columns, and also arrayed in a zigzag pattern. The second shield wall 45 is provided to the lower layer 22 of the second interlayer insulating layer. The second shield wall 45 is, with the first embodiment, connected to a shield wiring portion SDL formed on the upper layer 23 of the second interlayer insulating layer.

When projecting the first shield wall 41 and second shield wall 45 on a virtual plane (virtual vertical plane) including the axial lines of the first conductor portions 43 and second conductor portions 47, the multiple columnar-shaped first conductor portions 43 and second conductor portions 47 are arrayed in a non-overlapped state. Specifically, with a projection image, there is no gap between the first conductor portions 43 and 43, and there is no gap between the second conductors 47 and 47. When cutting away the columnar-shaped first conductor portion 43 and second conductor 47 at a virtual plane (virtual horizontal plane) perpendicular to the axial directions of the first conductor portions 43 and second conductor portions 47, the cross-sectional shapes of the first conductor portions 43 and second conductor portions 47 are circles. Also, the first shield wall 41 and second shield wall 45 are connected to a shield wiring portion SDL via contact holes 44 and 48. Specifically, the first shield wall 41 and second shield wall 45 are connected to a shield wiring portion SDL formed on the second interlayer insulating layer (specifically formed on the upper layer 23 of the second interlayer insulating layer in the first embodiment). Note that an electroconductive material layer 41A is provided to the bottom of the first shield wall 41, and an electroconductive material layer 41B is provided to the top of the first shield wall 41. Also, an electroconductive material layer 45A is provided to the bottom of the second shield wall 45, and an electroconductive material layer 45B is provided to the top of the second shield wall 45. Here, the first conductor portions 43, second conductor portions 47, and electroconductive material layers 41A, 41B, 45A, and 45B are made of aluminum or aluminum alloy. Between the first conductor portions 43 and 43, and between the second conductor portions 47 and 47 are filled with extended portions 42 and 46 of the lower layer 22 of the second interlayer insulating layer surrounding the first shield wall 41 and second shield wall 45. The first conductor portions 43 and second shield wall 45 may be formed, based on a method according to the related art, by forming an opening portion in the lower layer 22 of the second interlayer insulating layer based on a photolithographic technique or etching technique, and filling such an opening portion with an electroconductive material. The first shield wall 41 and second shield wall 45 are connected to a predetermined fixed potential, for example, the power source $V_{SS}$ via the shield wiring portion SDL. Note that a third shield wall and a fourth shield wall which will be described later in the second embodiment also have the same configuration and architecture as with the first shield wall and second shield wall.

As described above, the driving transistor $TR_1$ is configured of the gate electrode $G_1$, gate insulating layer $GI_1$, source/drain regions $SD_{11}$ and $SD_{12}$ provided to the first substrate 20 made of a silicon semiconductor substrate, and channel formation region $Ch_1$ to which a portion of the first substrate 20 between the source/drain regions $SD_{11}$ and $SD_{12}$ corresponds. Also, the image signal writing transistor $TR_2$ is configured of the gate electrode $G_2$, gate insulating layer $GI_2$, source/drain regions $SD_{21}$ and $SD_{22}$ provided to the first substrate 20, and channel formation region $Ch_e$ to which a portion of the first substrate 20 between the source/drain regions $SD_{21}$ and $SD_{22}$ corresponds. On the other hand, the capacitor unit $C_0$ is configured of the other electrode $C_{0-B}$ (equivalent to the first node $ND_1$), the dielectric layer configured of the upper layer 23 of the second interlayer insulating layer, and one electrode $C_{0-A}$ (equivalent to the second node $ND_2$). The capacitor unit $C_0$ is formed within the second interlayer insulating layer, specifically within the upper layer of the second interlayer insulating layer.

The one source/drain region $SD_{11}$ of the driving transistor $TR_1$ is connected to a current supply line CSL via a contact hole 86. Also, the other source/drain region $SD_{12}$ is connected to the emitting unit ELP via a contact hole 85, a contact pad 84, a contact hole 83, a wiring 82, a contact hole 88, a contact pad 89, and a contact hole 90, and also connected to the one edge $C_{0-A}$ of the capacitor unit $C_0$ via the contact hole 85, contact pad 84, contact hole 83, wiring 82, and a contact hole 81. Further, the gate electrode $G_1$ is connected to the other source/drain region $SD_{22}$ of the image signal writing transistor $TR_2$ via a contact hole 87, a wiring 72, a contact hole 71, and also connected to the other edge $C_{0-B}$ of the capacitor unit $C_0$ via the contact hole 87, wiring 72, a contact hole 73, a contact pad 74, a contact hole 75, a wiring 76, a contact hole 77.

On the other hand, the one source/drain region $SD_{21}$ of the image signal writing transistor $TR_2$ is connected to a data line DTL via a contact hole 65, a contact pad 64, a contact hole 63, a contact pad 62, and a contact hole 61. Also, the gate electrode $G_2$ is connected to a scanning line SCL via a contact hole 66.

The upper layer 23 of the second interlayer insulating layer is covered with a fourth interlayer insulating layer 24. The emitting unit ELP configured of the first electrode (anode electrode) 11, organic layer 12 (e.g., configured of a hole transportation layer, an emission layer, and an electron transportation layer), and second electrode (cathode electrode) 13 is provided on the fourth interlayer insulating layer 24. Note that, in the drawing, the organic layer 12 is displayed with one layer. An insulating layer 25 is provided on the fourth interlayer insulating layer 24 portion where no emitting unit ELP is provided, a protective film 26 is formed on the insulating layer 25 and second electrode 13, and further a transparent second substrate 27 is disposed on the protective film 26. Light emitted at the emission layer passes through the second substrate 27 and is externally emitted. Note that, in FIG. 3, all of the components of the light-emitting elements 1 positioned in the upper layer 23 of the second interlayer insulating layer and in a lower layer than the upper layer 23 of the second interlayer insulating layer are illustrated with one layer using a reference numeral 10 for convenience.

Manufacturing of the light-emitting elements 1 described above may substantially be performed based on a method according to the related art, and also, materials according to the related art may be employed as various materials to be used for manufacturing of the light-emitting elements 1. Also, operation of the driving circuit according to the first embodiment will be described in detail in the fourth embodiment.

With the light-emitting elements according to the first embodiment, the first shield wall extending in the first direction is provided to the second interlayer insulating layer between one light-emitting element and a light-emitting element adjacent to the one light-emitting element in the second direction. Also, the first shield wall is provided between one light-emitting element and a light-emitting element adjacent to the one light-emitting element, and the first shield wall is configured of multiple columnar-shaped first conductor portions being arrayed apart, and when viewing the first shield wall from the axial directions of the first conductor portions, the multiple columnar-shaped first conductor portions are arrayed in two columns, and also arrayed in a zigzag pattern. Further, the capacitor unit is provided in a higher level than a level where the driving transistor and image signal writing transistor are provided, and the first shield wall is provided in a higher level than a level where the driving transistor and image signal writing transistor are provided but in a level equal to or lower than a level where the capacitor unit is provided, between one light-emitting element and a light-emitting element adjacent to the one light-emitting element. Therefore, coupling does not readily occur between the driving circuit of a light-emitting element and the driving circuit of an adjacent light-emitting element, and a configuration and architecture where influence from an electric field from adjacent pixels does not readily occur may be applied to the light-emitting elements. Specifically, there may be suppressed occurrence of a phenomenon where potential increase amount of the gate electrode of the driving transistor of a driving circuit making up one light-emitting element fluctuates due to coupling with a light-emitting element adjacent to one light-emitting element. As a result thereof, an image may be displayed with high uniformity without visual recognition of streaky spots, and without occurrence of a phenomenon where an image is observed appearing as if the resolution thereof is half, and without a pixel emitting light with unintended luminance.

Second Embodiment

The second embodiment is a modification of the first embodiment.

Figure 16:
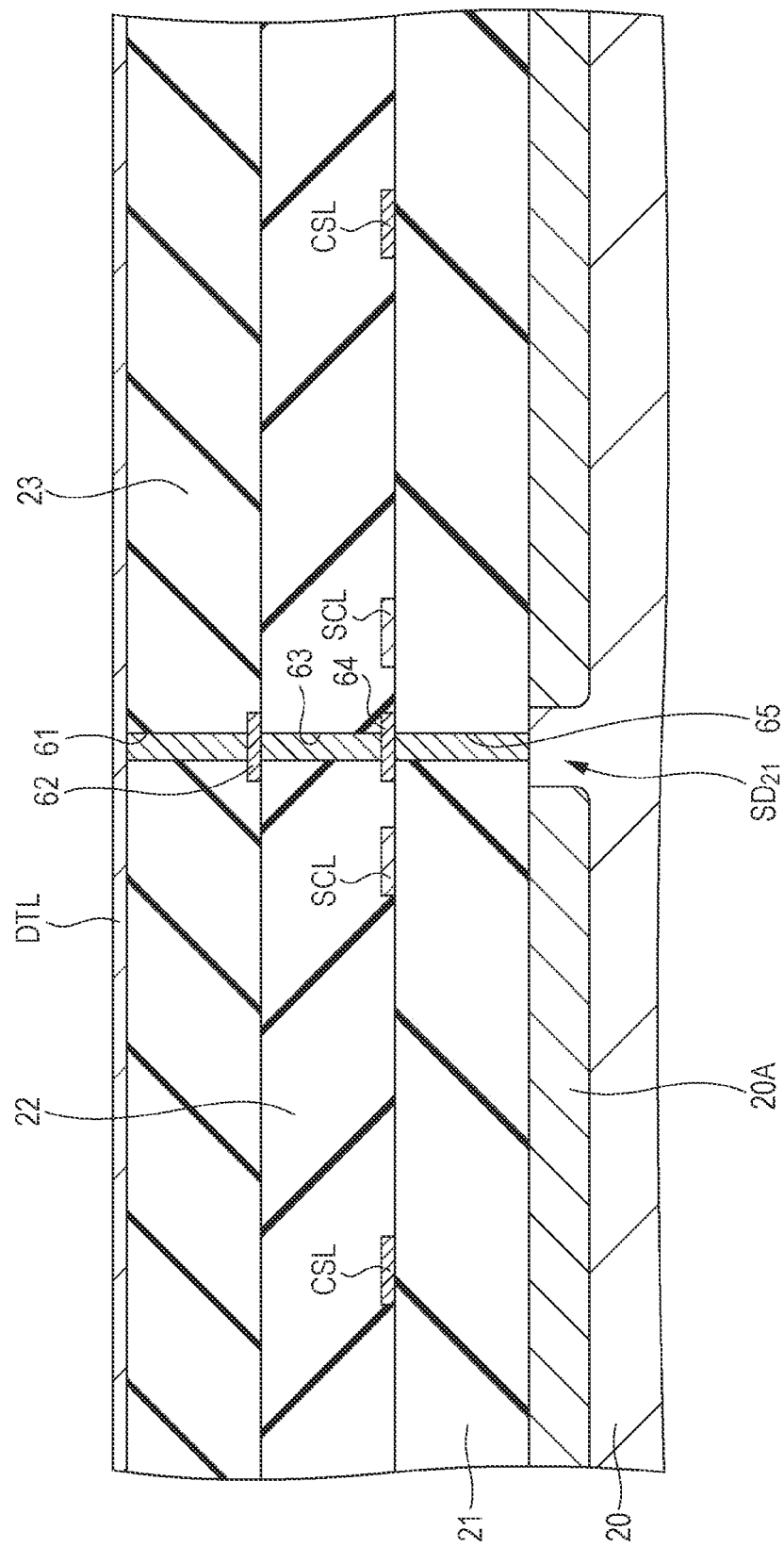
FIG. 16 is a schematic partial cross-sectional view of a display device or light-emitting element according to a second embodiment, in the same way as that taken along arrow XVI-XVI in FIG. 4.
Figure 17:
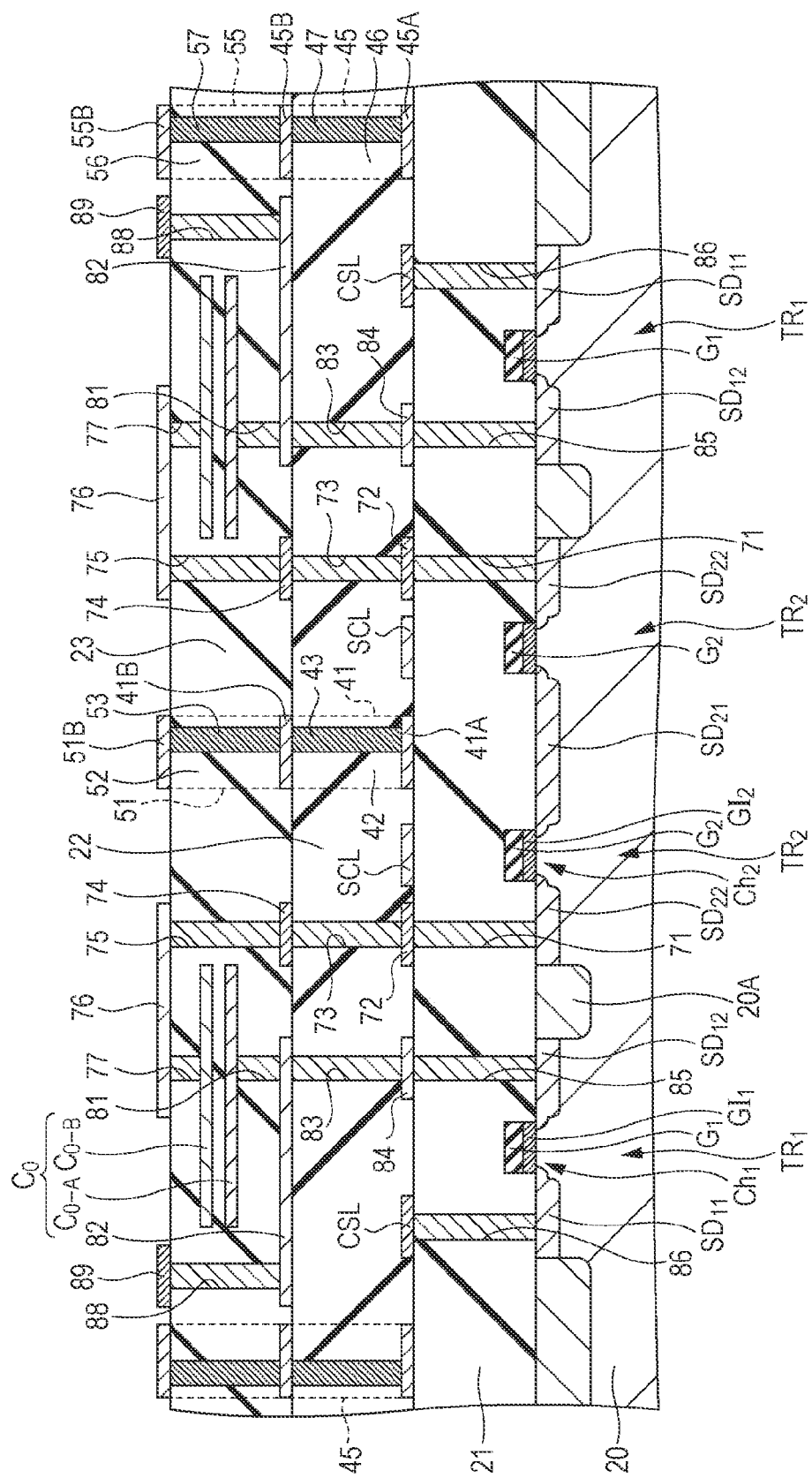
FIG. 17 is a schematic partial cross-sectional view of the display device or light-emitting element according to the second embodiment, in the same way as that taken along arrow XVII-XVII in FIG. 4.
Figure 18:
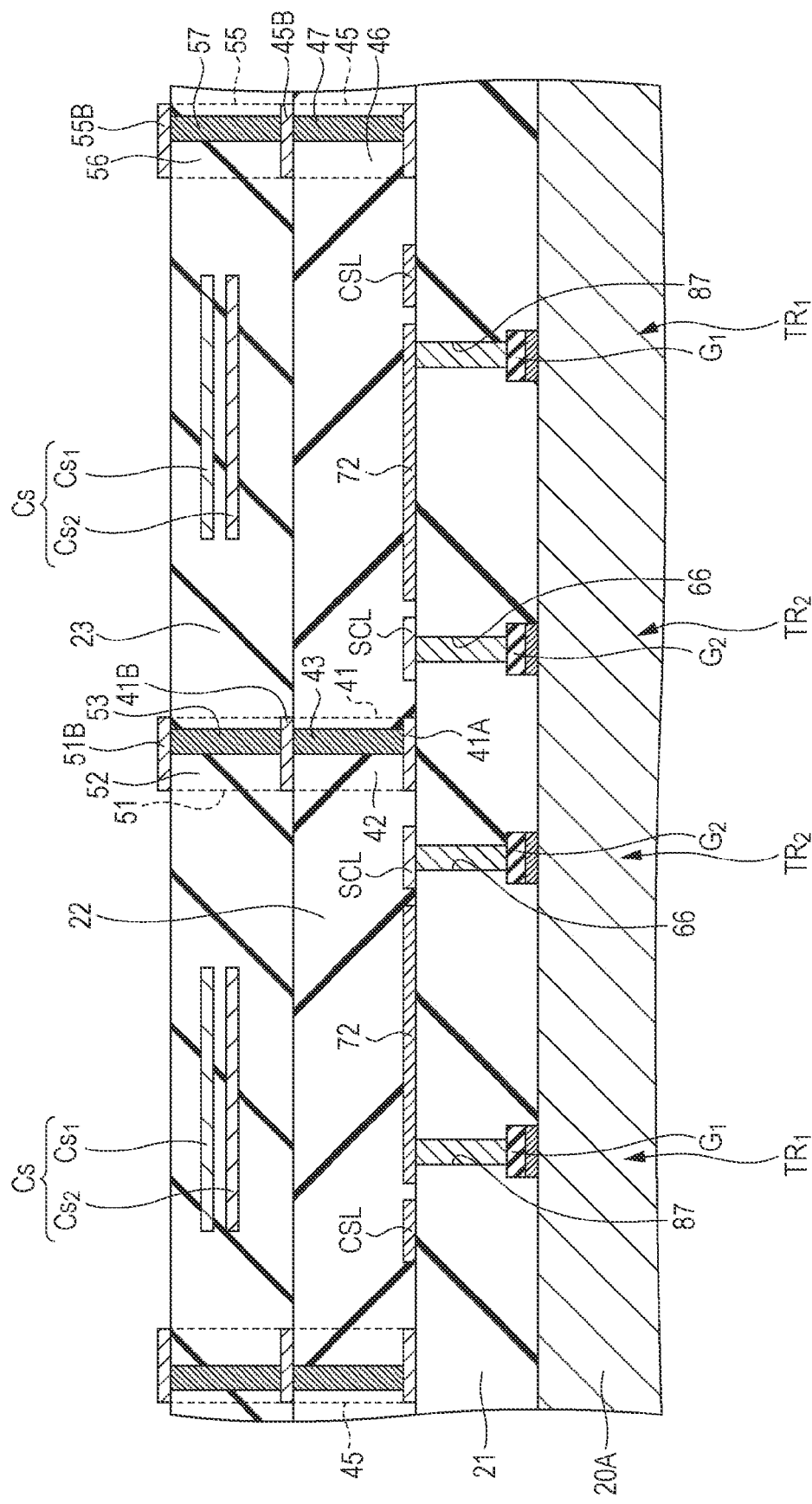
FIG. 18 is a schematic partial cross-sectional view of the display device or light-emitting element according to the second embodiment, in the same way as that taken along arrow XVIII-XVIII in FIG. 4.
Figure 19A:
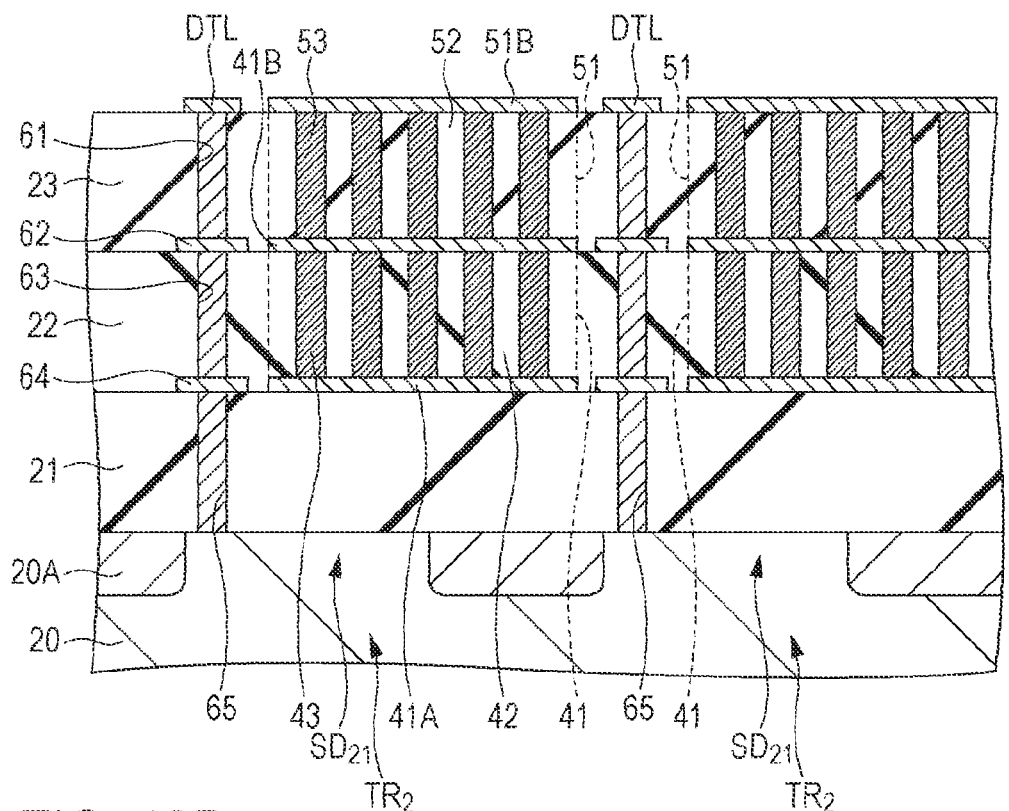
FIGS. 19A and 19B are schematic partial cross-sectional views of the display device or light-emitting element according to the second embodiment, in the same way as that taken along arrow XIXA-XIXA and arrow XIXB-XIXB in FIG. 4, respectively.
Figure 19B:
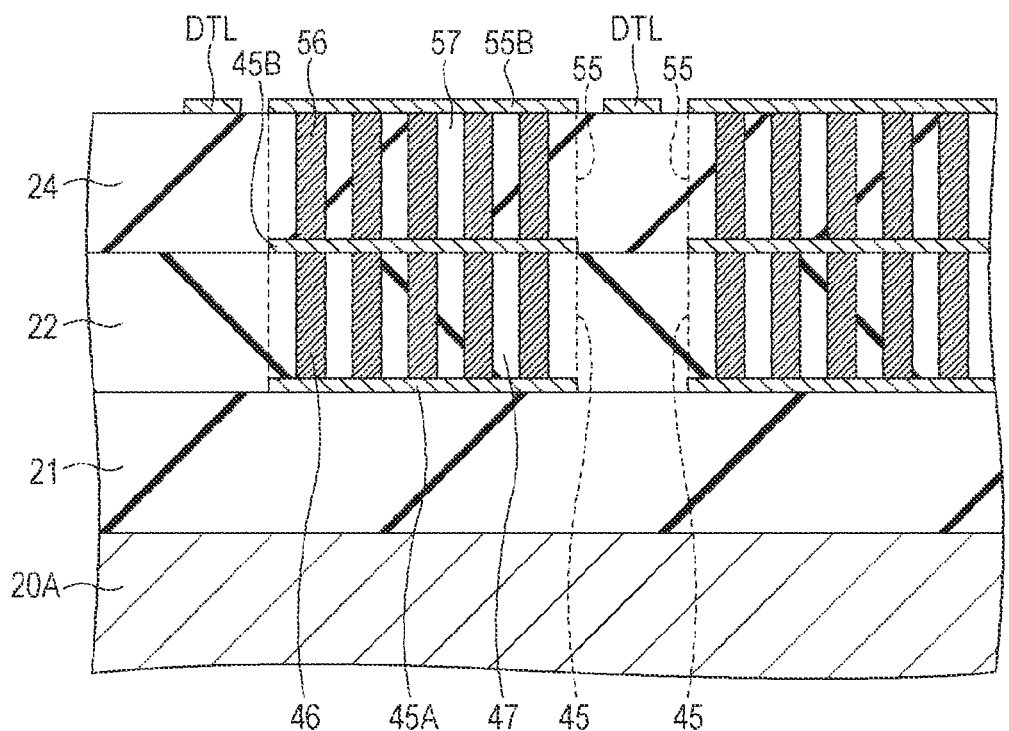
Figure 20:
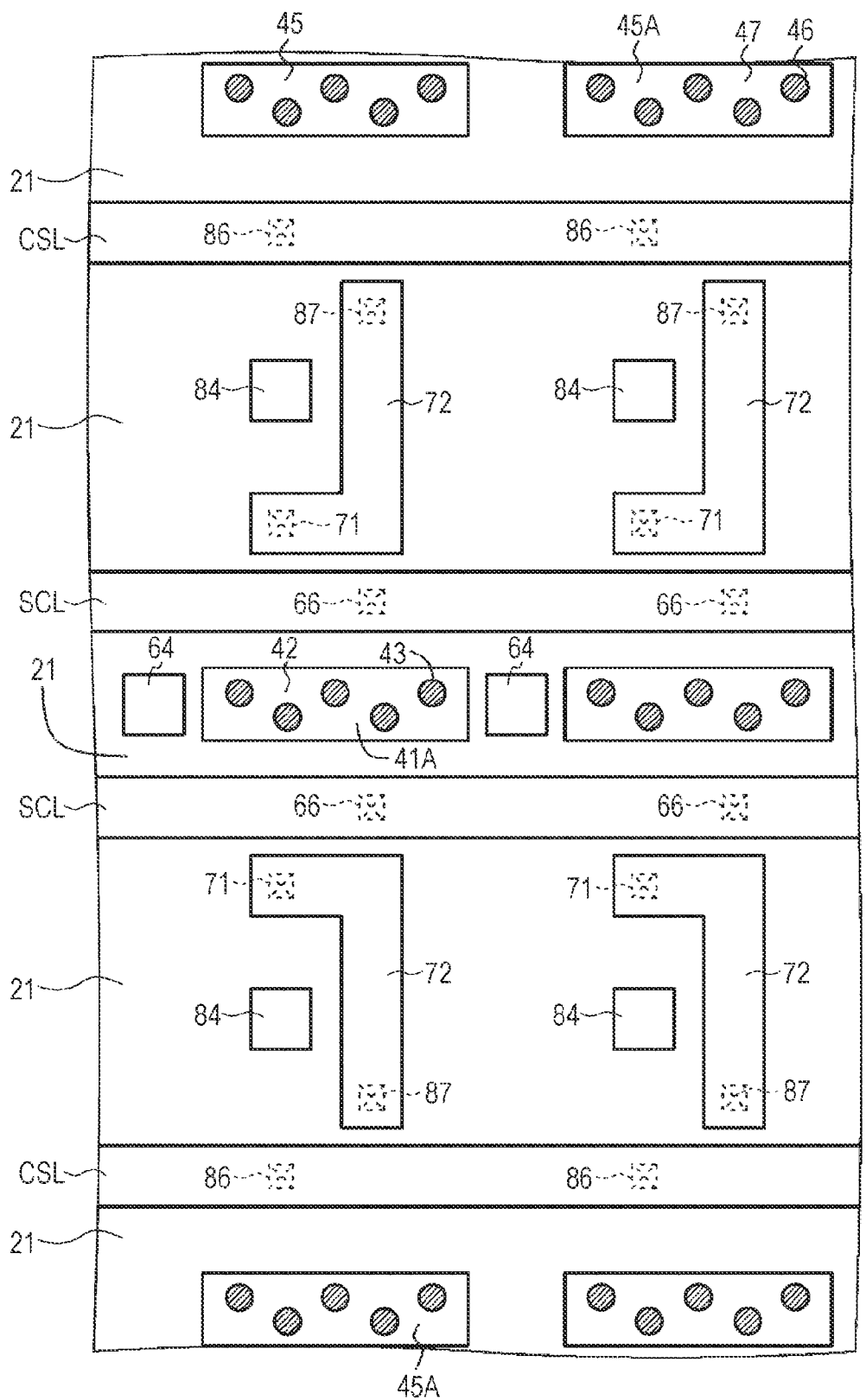
FIG. 20 is a diagram schematically illustrating a layout state of components of the display device or light-emitting element according to the second embodiment at the surface of a first interlayer insulating layer.
Figure 21:
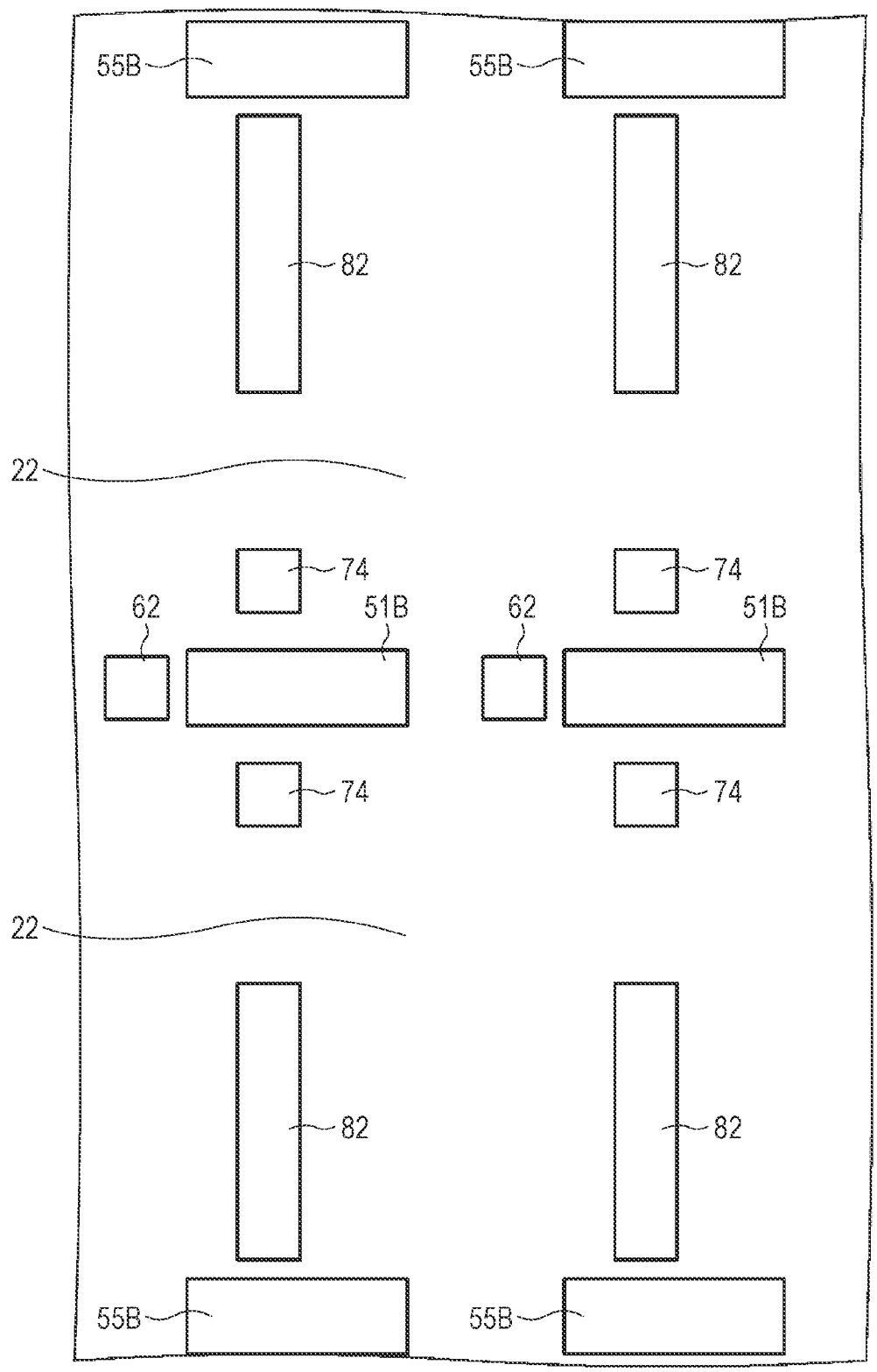
FIG. 21 is a diagram schematically illustrating a layout state of components of the display device or light-emitting element according to the second embodiment at the surface of a lower layer of a second interlayer insulating layer.
Figure 22:
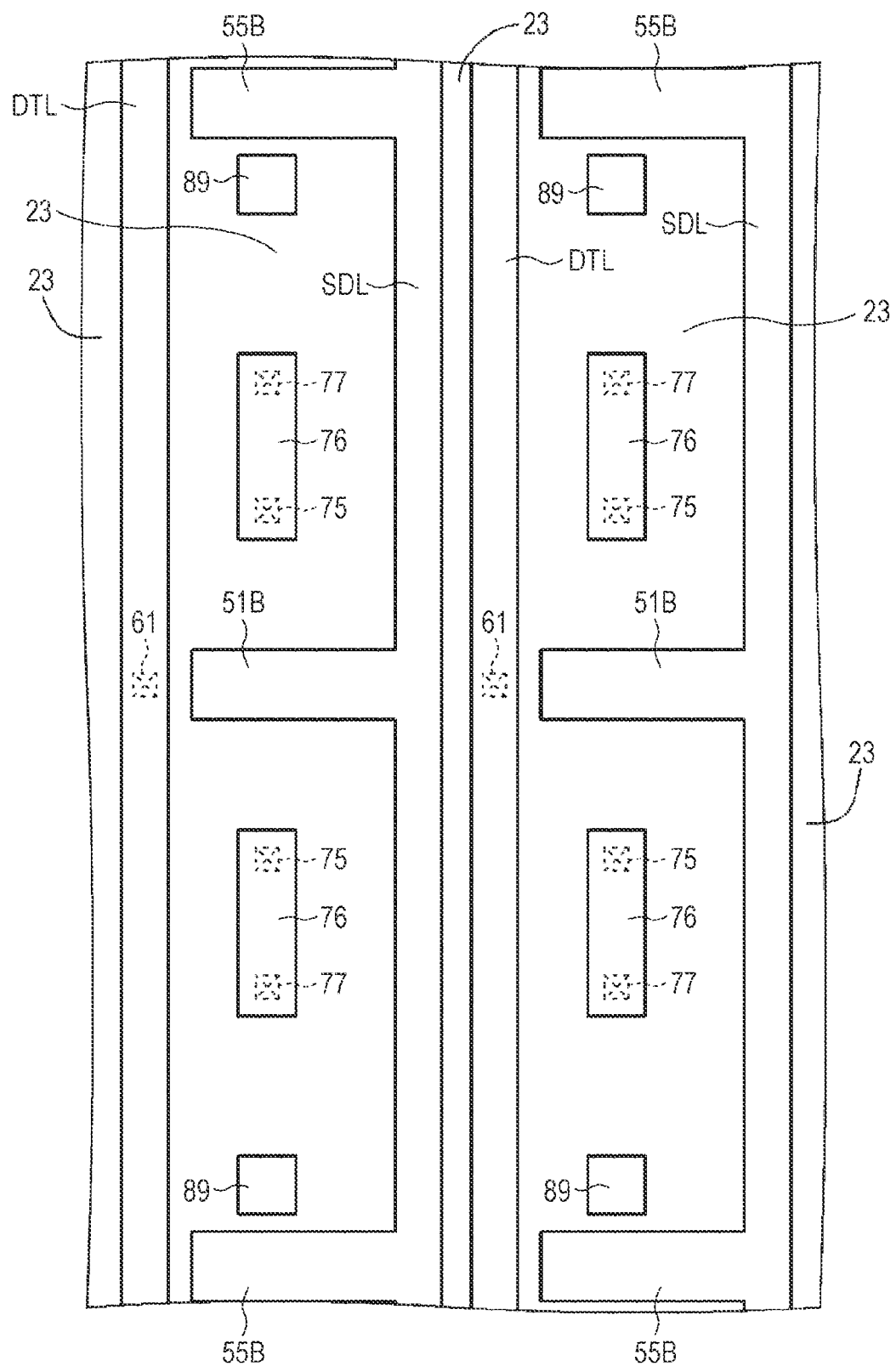
FIG. 22 is a diagram schematically illustrating a layout state of components of the display device or light-emitting element according to the second embodiment at the surface of an upper layer of the second interlayer insulating layer.

FIG. 16 illustrates, in the same way as taken along the arrow XVI-XVI in FIG. 4, a schematic partial cross-sectional view of the display device or light-emitting element according to the second embodiment, FIG. 17 illustrates, in the same way as taken along the arrow XVII-XVII in FIG. 4, a schematic partial cross-sectional view of the display device or light-emitting element according to the second embodiment, and FIG. 18 illustrates, in the same way as taken along the arrow XVIII-XVIII in FIG. 4, a schematic partial cross-sectional view of the display device or light-emitting element according to the second embodiment. Also, FIGS. 19A and 19B illustrate, in the same way as taken along the arrow XIXA-XIXA and arrow XIXB-XIXB in FIG. 4, a schematic partial cross-sectional view of the display device or light-emitting element according to the second embodiment, respectively. FIG. 20 schematically illustrates a layout state of components of the display device or light-emitting element according to the second embodiment at the surface of the first interlayer insulating layer, FIG. 21 schematically illustrates a layout state of the components of the display device or light-emitting element according to the second embodiment at the surface of the lower layer of the second interlayer insulating layer, and FIG. 22 schematically illustrates a layout state of the components of the display device or light-emitting element according to the second embodiment at the surface of the upper layer of the second interlayer insulating layer.

With the light-emitting elements according to the second embodiment, the first shield wall 41 is, in the same way as with the first embodiment, provided to the lower layer 22 of the second interlayer insulating layer, and a third shield wall 51 having the same configuration as the first shield wall 41 extending in the first direction is provided to the upper layer 23 portion of the second interlayer insulating layer positioned above the first shield wall 41, and the third shield wall 51 is connected to a shield wiring portion SDL. Further, though not necessarily, in the same way as with the first embodiment, a second shield wall 45 is provided to the lower layer 22 of the second interlayer insulating layer, a fourth shield wall 55 having the same configuration as the second shield wall 45 extending in the first direction is provided to the upper layer 23 portion of the second interlayer insulating layer positioned above the second shield wall 45, and the fourth shield wall 55 is connected to a shield wiring portion SDL. The third shield wall 51 is formed in the upper layer 23 of the second interlayer insulating layer above the electroconductive material layer 41B, and is connected to a shield wiring portion SDL via a wiring 51B. Also, the fourth shield wall 55 is formed in the upper layer 23 of the second interlayer insulating layer above the electroconductive material layer 45B, and is connected to a shield wiring portion SDL via a wiring 55B. Between the third conductor portions 53 and between the fourth conductor portions 57 are filled with extended portions 52 and 56 of the upper layer 23 of the second interlayer insulating layer surrounding the third shield wall 51 and fourth shield wall 55.

The light-emitting elements according to the second embodiment have the same configuration and architecture as with the first embodiment except for the above-mentioned configuration and architecture, and accordingly, detailed description will be omitted.

Third Embodiment

The third embodiment is a modification of the first embodiment or second embodiment.

Figure 23:
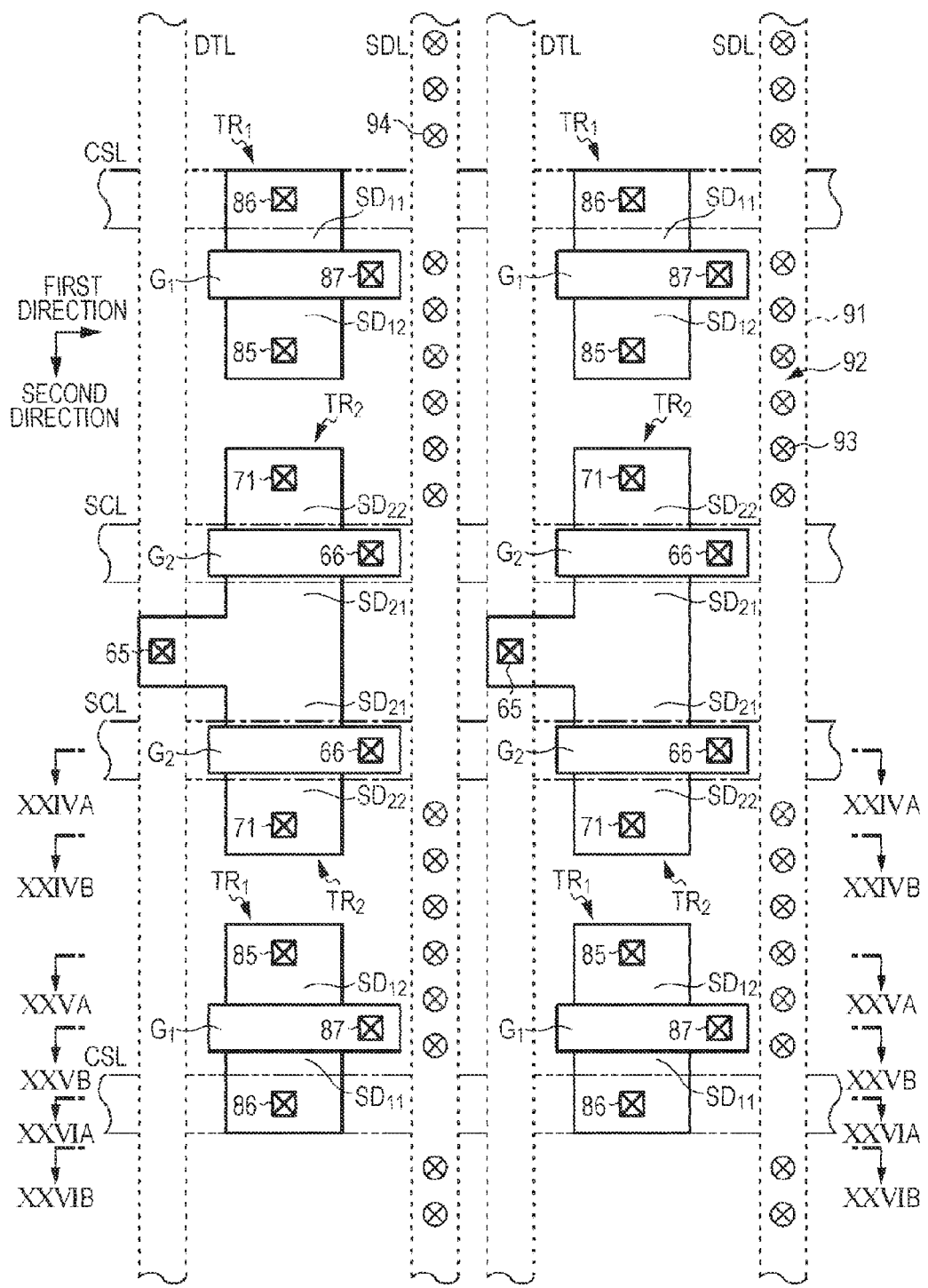
FIG. 23 is a diagram schematically illustrating a layout state of components of a display device or light-emitting element according to a third embodiment.
Figure 24A:
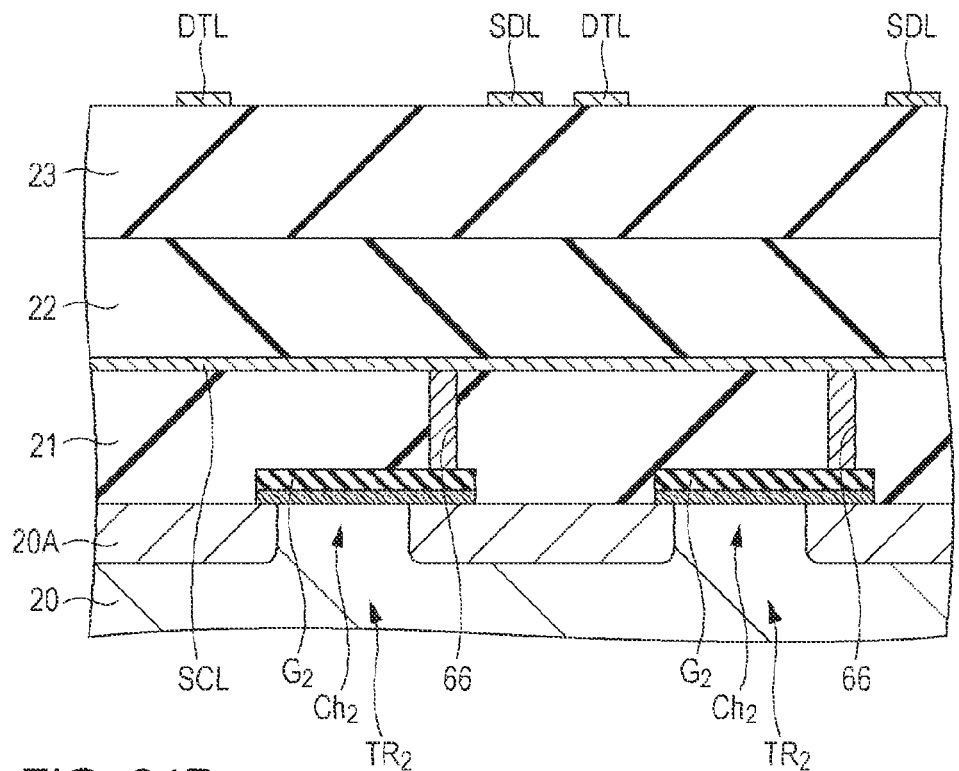
FIGS. 24A and 24B are schematic partial cross-sectional views of the display device or light-emitting element according to the third embodiment, in the same way as those taken along arrow XXIVA-XXIVA and arrow XXIVB-XXIVB in FIG. 23, respectively.
Figure 24B:
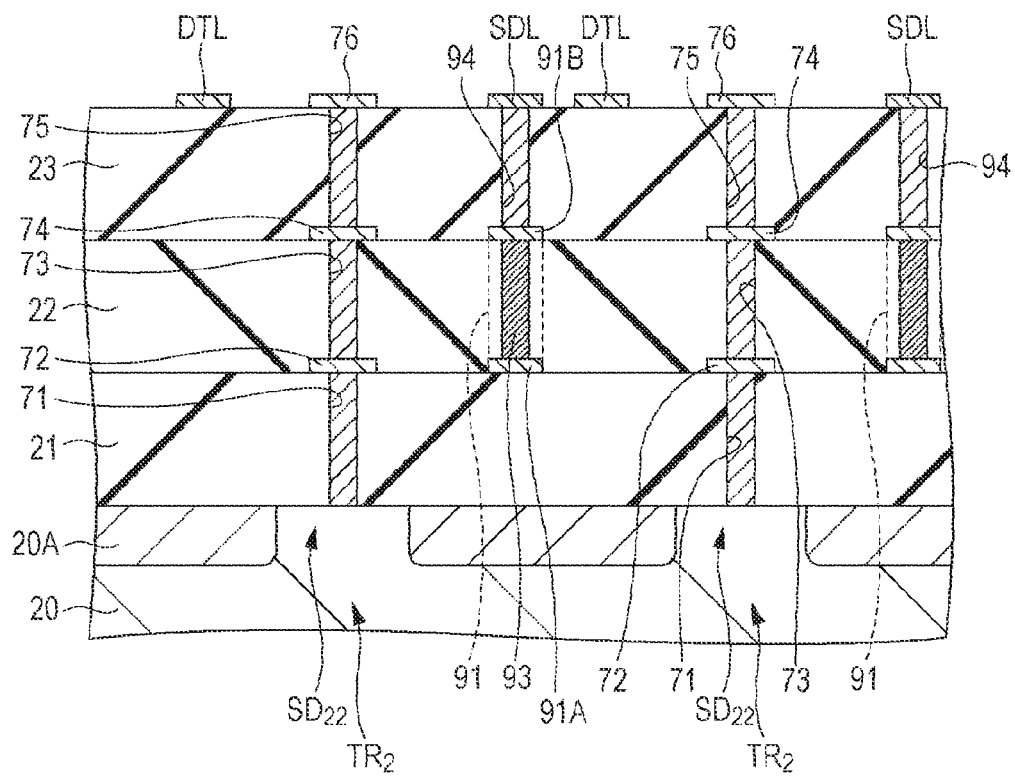
Figure 25A:
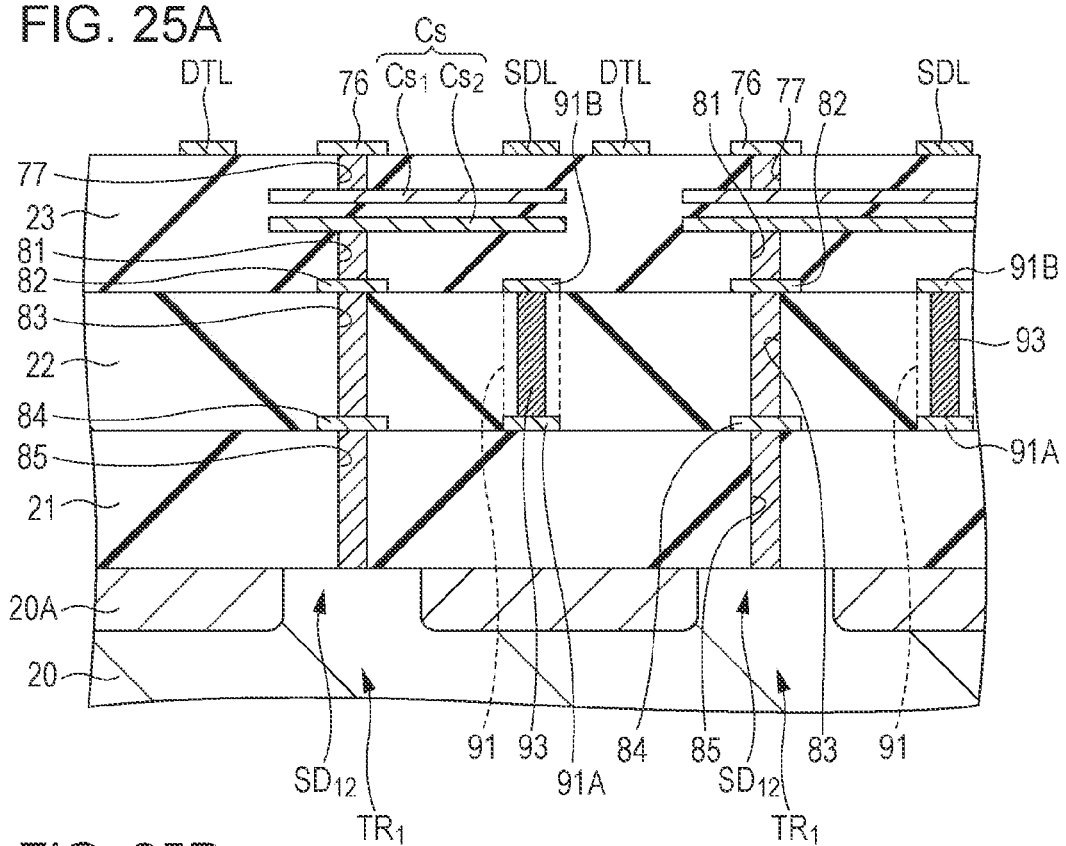
FIGS. 25A and 25B are schematic partial cross-sectional views of the display device or light-emitting element according to the third embodiment, in the same way as those taken along arrow XXVA-XXVA and arrow XXVB-XXVB in FIG. 23, respectively.
Figure 25B:
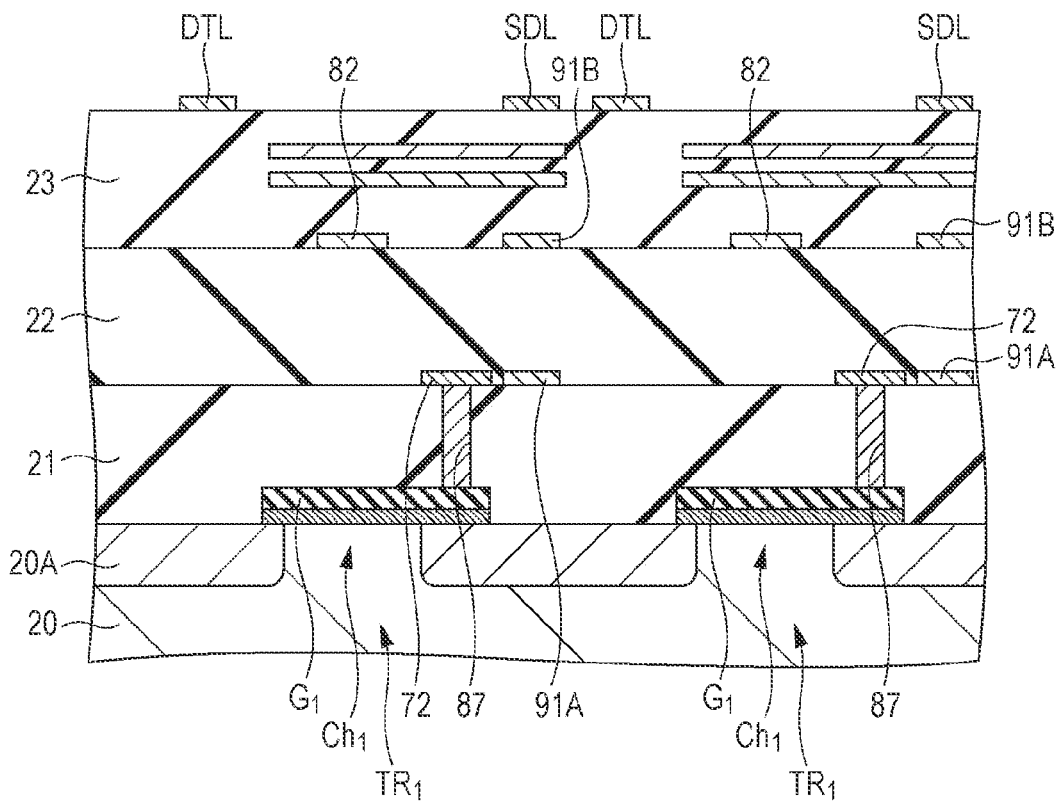
Figure 26A:
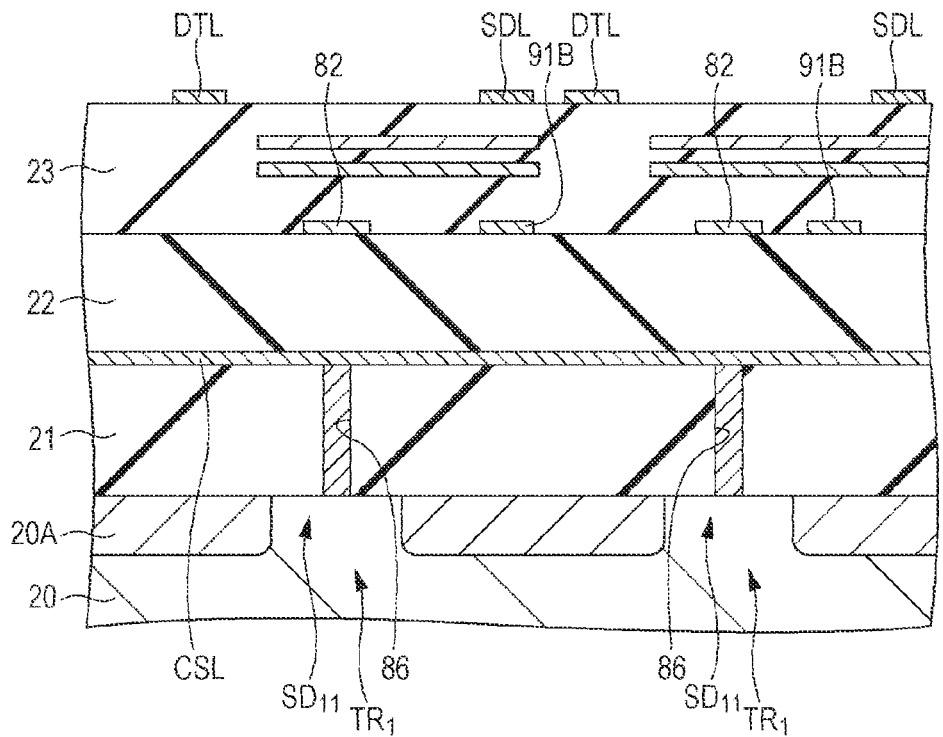
FIGS. 26A and 26B are schematic partial cross-sectional views of the display device or light-emitting element according to the third embodiment, in the same way as those taken along arrow XXVIA-XXVIA and arrow XXVIB-XXVIB in FIG. 23, respectively.
Figure 26B:
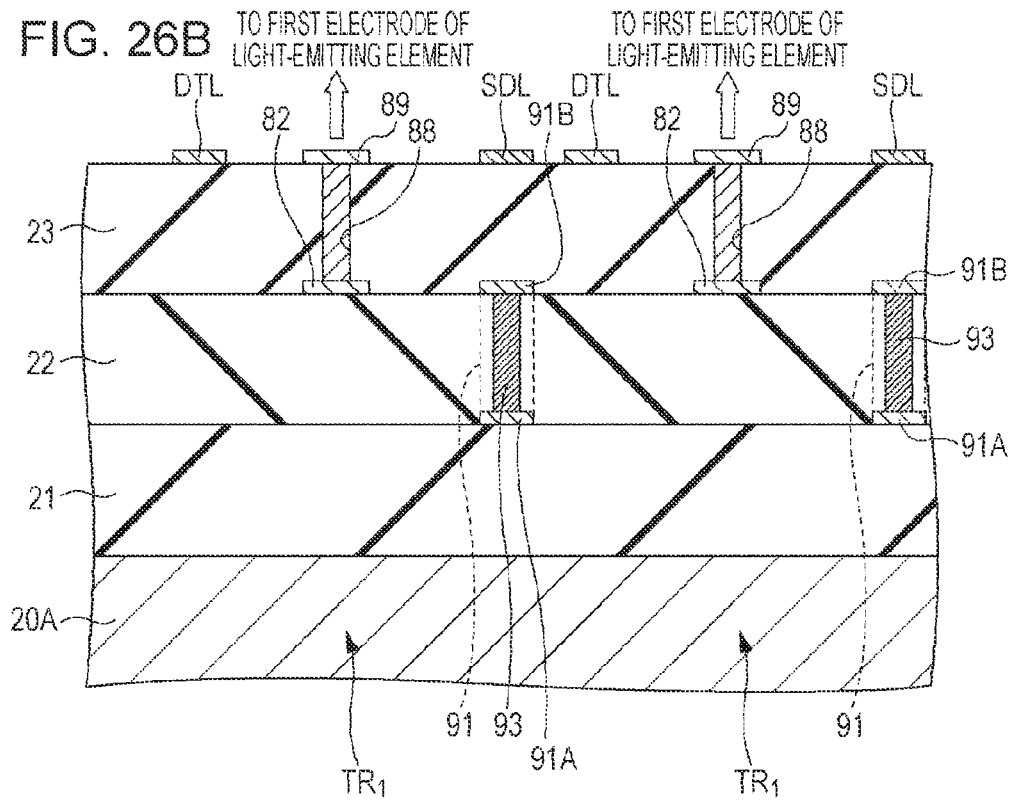

FIG. 23 schematically illustrates a layout state of the components of the display device or light-emitting element according to the third embodiment, FIGS. 24A and 24B illustrate, in the same way as taken along the arrow XXIVA-XXIVA and arrow XXIVB-XXIVB in FIG. 23, a schematic partial cross-sectional view of the display device or light-emitting element according to the third embodiment respectively, FIGS. 25A and 25B illustrate, in the same way as taken along the arrow XXVA-XXVA and arrow XXVB-XXVB in FIG. 23, a schematic partial cross-sectional view of the display device or light-emitting element according to the third embodiment respectively, and FIGS. 26A and 26B illustrate, in the same way as taken along the arrow XXVIA-XXVIA and arrow XXVIB-XXVIB in FIG. 23, a schematic partial cross-sectional view of the display device or light-emitting element according to the third embodiment respectively.

With the third embodiment, a second direction shield wall 91 extending in the second direction is provided between one light-emitting element and a light-emitting element adjacent to the one light-emitting element in the first direction. That is to say, the second direction shield wall 91 extending in the second direction is provided to the second interlayer insulating layer (with the third embodiment, specifically, the lower layer 22 of the second interlayer insulating layer) between one light-emitting element and a light-emitting element adjacent to the one light-emitting element in the first direction.

With the third embodiment, the second direction shield wall 91 is configured of multiple columnar-shaped conductor portions 93 of the second direction shield wall being arrayed apart. Here, when viewing the second direction shield wall 91 from the axial directions of the conductor portions 93 of the second direction shield wall (i.e., when viewing the second direction shield wall 91 from above), the multiple columnar-shaped conductor portions of the second direction shield wall are arrayed in one column. Between the conductor portions 93 of the second direction shield wall is filled with the extended portion 92 of the lower layer 22 of the second interlayer insulating layer surrounding the second direction shield wall 91. When cutting away the columnar-shaped second direction shield wall 91 at a virtual plane (virtual horizontal plane) perpendicular to the axial directions of the conductor portions 93 of the second direction shield wall, the cross-sectional shapes of the conductor portions 93 of the second direction shield wall are circles. Also, the second direction shield wall 91 is connected to a shield wiring portion SDL via a contact hole 94. Note that an electroconductive material layer 91A is provided to the bottom of the second direction shield wall 91, and an electroconductive material layer 91B is provided to the top of the second direction shield wall 91. Here, the conductor portions 93 of the second direction shield wall, and the electroconductive material layers 91A and 91B are made of the same material as with the first conductors 43. The conductor portions 93 of the second direction shield wall may be formed, based on the related art, by forming an opening portion in the lower layer 22 of the second interlayer insulating layer based on a photolithographic technique or etching technique, and filling such an opening portion with an electroconductive material.

The light-emitting elements according to the third embodiment have the same configuration and architecture as with the first embodiment and second embodiment except for the above-mentioned configuration and architecture, and accordingly, detailed description will be omitted.

Fourth Embodiment

Figure 27:
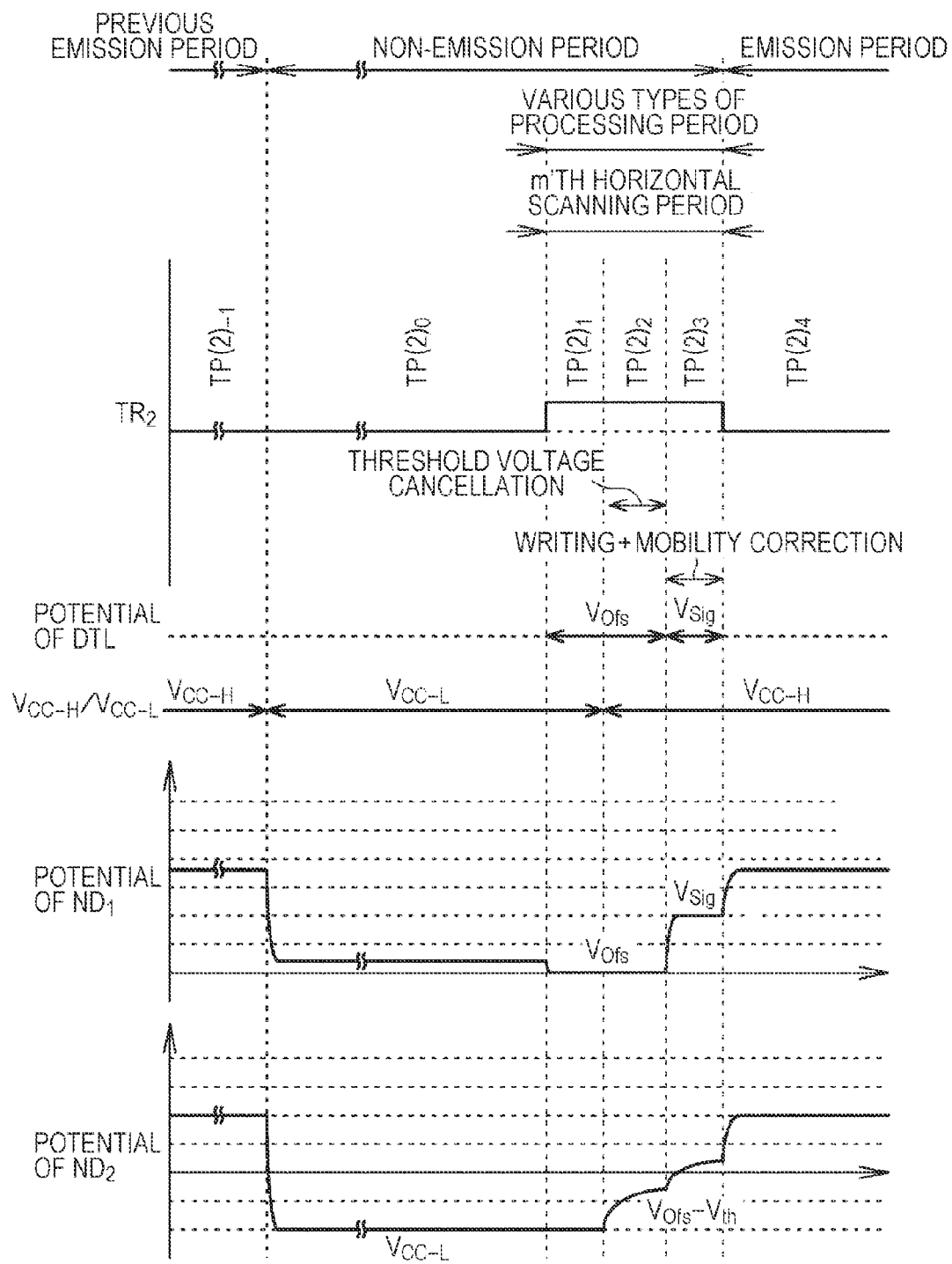
FIG. 27 is a diagram schematically illustrating a driving timing chart of 2Tr/1C driving circuits according to the first embodiment to the third embodiment.

With the fourth embodiment, operation of the 2Tr/1C driving circuit described in the first through third embodiments will be described. A driving timing chart of the 2Tr/1C driving circuit according to the fourth embodiment is schematically illustrated in FIG. 27, and on/off state and so forth of each transistor are schematically illustrated in FIGS. 28A, 28B, 28C, 28D, 28E, and 28F. Hereinafter, operation description of the 2Tr/1C driving circuit will be made.

Voltage $V_{CC\text{-}H}$ for controlling emission of the emitting unit ELP, and voltage $V_{CC\text{-}L}$ for controlling the potential of the source region of the driving transistor $TR_1$ are supplied from the current supply unit 100 to the driving transistor $TR_1$. Here, as values of the voltage $V_{CC\text{-}H}$ and $V_{CC\text{-}L}$, though $V_{CC\text{-}H}$=20 V, $V_{CC\text{-}L}$=−10 V may be exemplified, the values are not restricted to these.

Figure 28A:
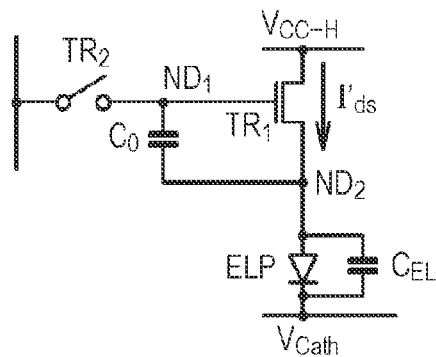
FIGS. 28A, 28B, 28C, 28D, 28E, and 28F are diagrams schematically illustrating an on/off state of each transistor making up the 2Tr/1C driving circuits according to the first embodiment to the third embodiment.

Period-TP(2)$_{-1}$ (see FIGS. 27 and 28A)

This Period-TP(2)$_{-1}$ is, for example, operation in the previous display frame, and is a period while the (n, m)'th emitting unit ELP is in an emitting state after completion of the last various types of processing. Specifically, a drain current I'$_{ds}$ based on later-described Expression (B) flows into the emitting unit ELP making up the (n, m)'th sub pixel, luminance of the emitting unit ELP making up the (n, m)'th sub pixel is a value corresponding to such a drain current I'$_{ds}$. Here, the driving transistor $TR_1$ is in an on state. The emitting state of the (n, m)'th emitting unit ELP is continued until immediately before start of the horizontal scanning period of the emitting unit ELP arrayed in the (m+m')th row.

Period-TP(2)$_0$ to Period-TP(2)$_2$ illustrated in FIG. 27 is an operation period from the emitting state after completion of the last various types of processing is completed to immediately before the next image signal writing processing is performed. Specifically, this Period-TP(2)$_0$ to Period-TP(2)$_2$ is, for example, a period of certain time length from the commencement of the (m+m')th horizontal scanning period in the previous display frame to the termination of the (m−1)'th horizontal scanning period in the current display frame. Note that Period-TP(2)$_0$ to Period-TP(2)$_2$ may be configured to be included in the m'th horizontal scanning period in the current display frame. With Period-TP(2)$_0$ to Period-TP(2)$_2$, the (n, m)'th emitting unit ELP is in a non-emitting state. Note that, as illustrated in FIG. 27, in addition to Period-TP(2)$_3$, Period-TP(2)$_1$ to Period-TP(2)$_2$ is also included in the m'th horizontal scanning period. For convenience of description, description will be made assuming that the commencement of Period-TP(2)$_1$, and the termination of Period-TP(2)$_3$ agree with the commencement and termination of the m'th horizontal scanning period respectively.

Hereinafter, each period of Period-TP(2)$_0$ to Period-TP(2)$_4$ will be described. Note that the length of each period of Period-TP(2)$_1$ to Period-TP(2)$_3$ may be set according to design of the display device as appropriate.

Figure 28B:
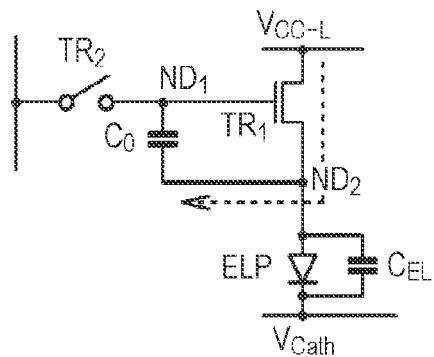

Period-TP(2)$_0$ (see FIG. 28B)

This Period-TP(2)$_0$ is, for example, operation in the previous display frame to the current display frame. Specifically, this Period-TP(2)$_0$ is a period from the (m+m')th horizontal scanning period in the previous display frame to the (m−1)'th horizontal scanning period in the current display frame. With this Period-TP(2)$_0$, the (n, m)'th emitting unit ELP is in a non-emitting state. Here, voltage to be supplied from the current supply unit 100 is changed from $V_{CC-H}$ to $V_{CC-L}$ at the time of proceeding from Period-TP(2)$_{-1}$ to Period-TP(2)$_0$. As a result thereof, the potential of the second node ND$_2$ (the source region of the driving transistor TR$_1$ or the anode electrode of the emitting unit ELP) decreases to $V_{CC-L}$, and the emitting unit ELP goes to a non-emitting state. Also, in accordance with potential decrease of the second node ND$_2$, the potential of the first node ND$_1$ (the gate electrode of the driving transistor TR$_1$) in a floating state also decreases.

Figure 28C:
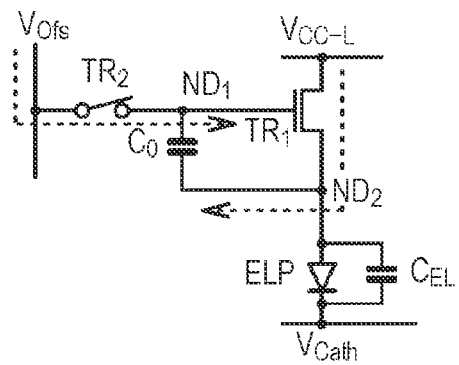

Period-TP(2)$_1$ (see FIG. 28C)

Next, the horizontal scanning period in the m'th row in the current display frame starts. At the time of start of Period-TP(2)$_1$, the image signal writing transistor TR$_2$ is set to an on state by setting a scanning line SCL to a high level based on the operation of the scanning circuit 101. As a result thereof, the potential of the first node ND$_1$ goes to $V_{Ofs}$ (e.g., 0 V). The potential of the second node ND$_2$ holds $V_{CC-L}$ (e.g., −10 V).

According to the above processing, potential difference between the gate electrode and source region of the driving transistor TR$_1$ goes to $V_{th}$ or higher, and the driving transistor TR$_1$ goes to an on state.

Figure 28D:
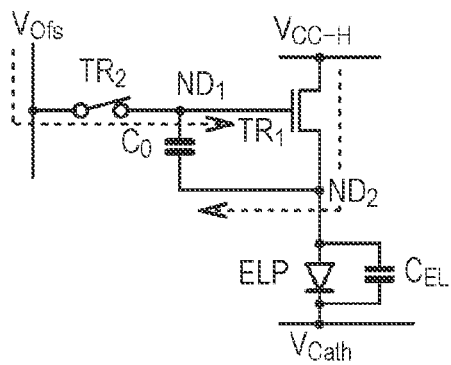

Period-TP(2)$_2$ (see FIG. 28D)

Next, threshold voltage cancellation processing is performed. Specifically, voltage to be supplied from the current supply unit 100 is switched from $V_{CC-L}$ to $V_{CC-H}$ while maintaining the on state of the image signal writing transistor TR$_2$. As a result thereof, though the potential of the first node ND$_1$ is not changed (maintains $V_{Ofs}=0$ V), the potential of the second node ND$_2$ in a floating state increases, and potential difference between the first node ND$_1$ and the second node ND$_2$ approximates the threshold voltage $V_{th}$ of the driving transistor TR$_1$. When the potential difference between the gate electrode and source region of the driving transistor TR$_1$ reaches $V_{th}$, the driving transistor TR$_1$ goes to an off state. Specifically, the potential of the second node ND$_2$ in a floating state approximates ($V_{Ofs}-V_{th}=-3$ V), and finally goes to ($V_{Ofs}-V_{th}$). Here, in the event that the following Expression (A) is ensured, in other words, in the event that the potential is selected and determined so as to satisfy Expression (A), the emitting unit ELP does not emit light. Note that, qualitatively, with the threshold voltage cancellation processing, the extent to which the potential difference between the first node ND$_1$ and the second node ND$_2$ (in other words, potential difference between the gate electrode and source region of the driving transistor TR$_1$) approximates the threshold $V_{th}$ of the driving transistor TR$_1$ depends on time of the threshold voltage cancellation processing. Accordingly, for example, in the event that the time of the threshold voltage cancellation processing has been secured sufficiently long, the potential difference between the first node ND$_1$ and the second node ND$_2$ reaches the threshold voltage $V_{th}$ of the driving transistor TR$_1$, and the driving transistor TR$_1$ goes to an off state. On the other hand, for example, in the event that the time of the threshold voltage cancellation processing has been set short, the potential difference between the first node ND$_1$ and the second node ND$_2$ is greater than the threshold voltage $V_{th}$ of the driving transistor TR$_1$, and the driving transistor TR$_1$ may not go to an off state. That is to say, as a result of the threshold voltage cancellation processing, the driving transistor TR$_1$ does not have to go to an off state. Note that reference symbol $V_{th-EL}$ is threshold voltage of the emitting unit ELP, reference symbol $V_{Cath}$ is voltage to be applied the second electrode of the emitting unit ELP, and reference symbol $C_{EL}$ denotes parasitic capacitance of the emitting unit ELP.

$$(V_{Ofs}-V\text{th})<(V_{th-EL}+V_{Cath}) \tag{A}$$

With this Period-TP(2)$_2$, the potential of the second node ND$_2$ finally goes to ($V_{Ofs}-V_{th}$). Specifically, the potential of the second node ND$_2$ is determined depending on the voltage $V_{Ofs}$ alone for initializing the threshold voltage $V_{th}$ of the driving transistor TR$_1$ and the gate electrode of the driving transistor TR$_1$, which is independent of the threshold voltage $V_{th-EL}$ of the emitting unit ELP.

Figure 28E:
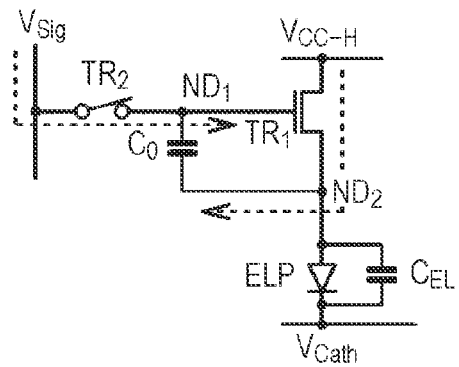

Period-TP(2)$_3$ (see FIG. 28E)

Next, image signal writing processing as to the driving transistor TR$_1$, and potential correction of the source region (second node ND$_2$) of the driving transistor TR$_1$ based on magnitude of mobility μ of the driving transistor TR$_1$ (mobility correction processing) are performed. Specifically, the image signal writing transistor TR$_2$ is set to an off state once, the potential of the data line DTL is changed to a driving signal (luminance signal) $V_{Sig}$ for controlling luminance in the emitting unit ELP, and the image signal writing transistor TR$_2$ is set to an on state by setting the scanning line SCL to a high level, thereby setting the driving transistor TR$_1$ to an on state.

The potential $V_{CC-H}$ has been applied to the drain region of the driving transistor TR$_1$ from the current supply unit 100, and accordingly, the potential of the source region of the driving transistor TR$_1$ increases. After predetermined time (t$_0$) elapses, the scanning line SCL is set to a low level, thereby setting the image signal writing transistor TR$_2$ to an off state, and setting the first node ND$_1$ (the gate electrode of the driving transistor TR$_1$) to a floating state. Note that the entire time t$_0$ of this Period-TP(2)$_3$ may be determined beforehand as a design value at the time of design of the display device so that the potential of the second node ND$_2$ goes to ($V_{Ofs}-V_{th}+\Delta V$).

With this Period-TP(2)$_3$, in the event that the value of the mobility μ of the driving transistor TR$_1$ is great, increase amount $\Delta V$ (potential correction value) of the potential in the source region of the driving transistor TR$_1$ increases, and in the event that the value of the mobility μ of the driving transistor TR$_1$ is small, the increase amount $\Delta V$ (potential correction value) of the potential in the source region of the driving transistor TR$_1$ decreases.

Figure 28F:
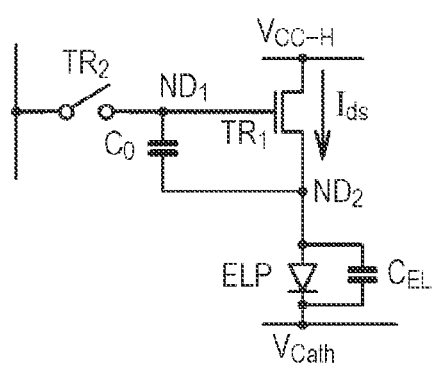

Period-TP(2)$_4$ (see FIG. 28F)

According to the above operations, the threshold voltage cancellation processing, image signal writing processing, and mobility correction processing are completed. Based on the operation of the scanning circuit 101, as a result of the scanning line SCL going to a low level, the image signal writing transistor TR$_2$ goes to an off state, the first node ND$_1$, that is, the gate electrode G$_1$ of the driving transistor TR$_1$ goes to a floating state. Here, the driving transistor TR$_1$ holds an on state, and is in a state connected to the current supply unit 100 (voltage $V_{CC-H}$, e.g., 20 V). Accordingly, as a result of the above, the potential of the second node ND$_2$ increases, and exceeds ($V_{th-EL}$ $V_{Cath}$), and accordingly, the emitting unit ELP starts emission. The gate electrode G$_1$ of the driving transistor TR' is in a floating state, and also, the capacitor unit C$_0$ exists, and accordingly, the same phenomenon as with a so-called bootstrap circuit occurs on the gate electrode G$_1$ of the driving transistor TR$_1$, and the potential of the first node ND$_1$ also increases. As a result thereof, potential difference $V_{gs}$ between the gate electrode and source region of the driving transistor $TR_1$ holds the value of the following Expression (B). The current flowing into the emitting unit ELP may be obtained by Expression (C), and accordingly, current Ids flowing into the emitting unit ELP depends on neither the threshold voltage $V_{th-EL}$ of the emitting unit ELP nor the threshold voltage $V_{th}$ of the driving transistor $TR_1$. That is to say, the emission amount (luminance) of the emitting unit ELP receives neither influence of the threshold voltage $V_{th-EL}$ of the emitting unit ELP nor influence of the threshold voltage $V_{th}$ of the driving transistor $TR_1$. In addition, occurrence of irregularities of a drain current $I_{ds}$ due to irregularities of the mobility μ at the driving transistor $TR_1$ may be suppressed.

$$V_{gs} \approx V_{Sig} - (V_{Ofs} - V_{th}) - \Delta V \quad (B)$$

$$I_{ds} = k \cdot \mu \cdot (V_{sig} - V_{Ofs} - \Delta V)^2 \quad (C)$$

where
μ: effective mobility
L: channel length
W: channel width
$V_{gs}$: potential difference between the gate electrode and source region
$V_{th}$: threshold voltage
$C_{ox}$: (relative permittivity of gate insulating layer)×(vacuum permittivity)/(thickness of gate insulating layer) $\equiv k \equiv (\frac{1}{2}) \cdot (W/L) \cdot C_{ox}$ The emitting state of the emitting unit ELP is continued until the (m+m'−1)'th horizontal scanning period. This point-in-time is equivalent to end of Period-TP $(2)_{-1}$.

Thus, emission operation of the (n, m)'th sub pixel of the emitting unit ELP is completed.

Though the light-emitting element, display device, and electronic device according to the present disclosure have been described based on the preferred embodiments, the light-emitting element, display device, and electronic device according to the present disclosure are not restricted to these embodiments. The configurations and architectures of the light-emitting element, display device, and driving circuit which have been described in the embodiments are examples, and may be modified as appropriate, and the driving method is also an example, and may be modified as appropriate. With the embodiments, the various transistors have been configured of a MOS FET, but may also alternatively be configured of a TFT. With the embodiments, the various transistors have been described as n-channel type, but in some cases, a part or all of the driving circuits may also be configured of a p-channel type transistor.

Also, with the embodiments, a form has been described wherein the current supply lines CSL and scanning lines SCL are formed on the first interlayer insulating layer, and the data lines DTL are formed on the second interlayer insulating layer, but in some cases, a form may also be employed wherein the current supply lines CSL and scanning lines SCL are formed on the second interlayer insulating layer, and the data lines DTL are formed on the first interlayer insulating layer. The first shield wall, second shield wall, third shield wall, fourth shield wall, and second direction shield wall may be formed by forming a recessed portion or groove portion in an interlayer insulating layer, and filling such a recessed portion or groove portion with an electroconductive material.

The display device according to the present disclosure may be applied to a monitor device making up a television receiver or digital camera, a monitor device making up a video camera, a monitor device making up a personal computer, various display units in a PDA (Personal Digital Assistant), a cellular phone, a smart phone, a portable music player, a game machine, an electronic book, and an electronic dictionary, an electronic view finder (EVF), and an head mounted display (HMD). That is to say, examples of the electronic device according to the present disclosure include television receivers, digital cameras, video cameras, personal computers, PDAs, cellular phones, smart phones, portable music players, game machines, electronic books, electronic dictionaries, electronic view finders, and head mounted displays, and the display device according to the present disclosure is included in these electronic devices. With the embodiments, description has been made assuming that the display unit is chiefly configured of an organic electroluminescence emitting unit, but the emitting unit may also be configured of a self-luminous emitting unit such as a liquid crystal emitting unit, inorganic electroluminescence emitting unit, LED emitting unit, semiconductor laser emitting unit, or the like.

Figure 29:
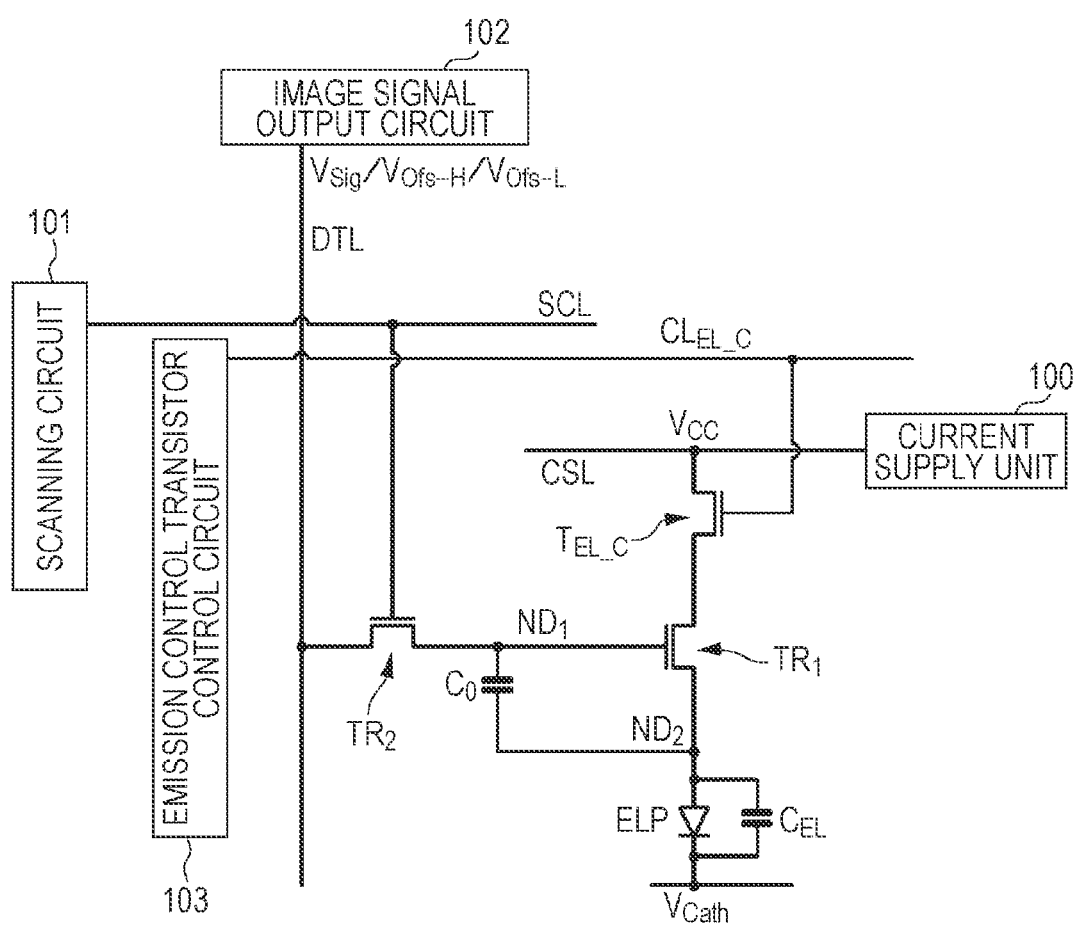
FIG. 29 is an equivalent circuit diagram of a 3Tr/1C driving circuit.
Figure 30:
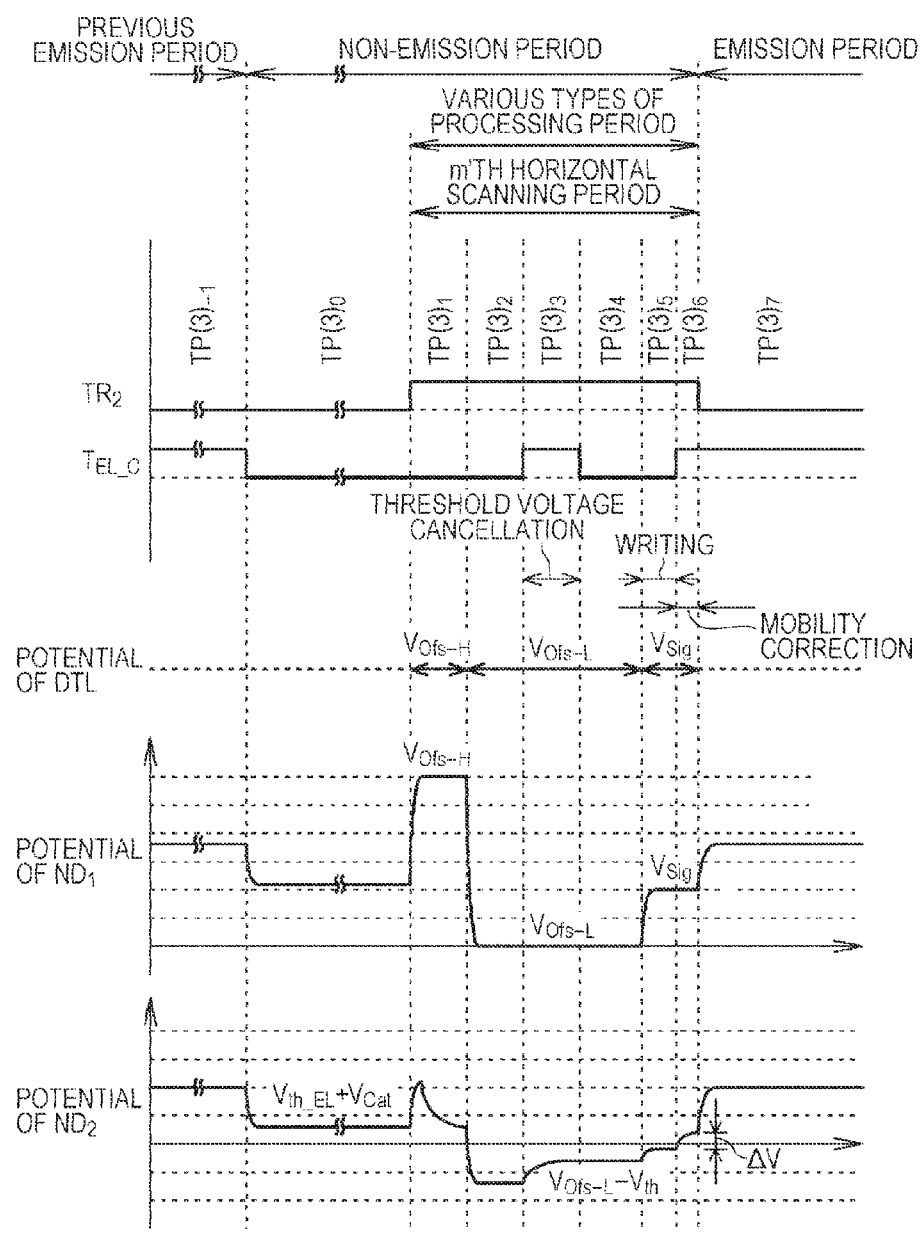
FIG. 30 is a diagram schematically illustrating a driving timing chart of the 3Tr/1C driving circuit.
Figure 31:
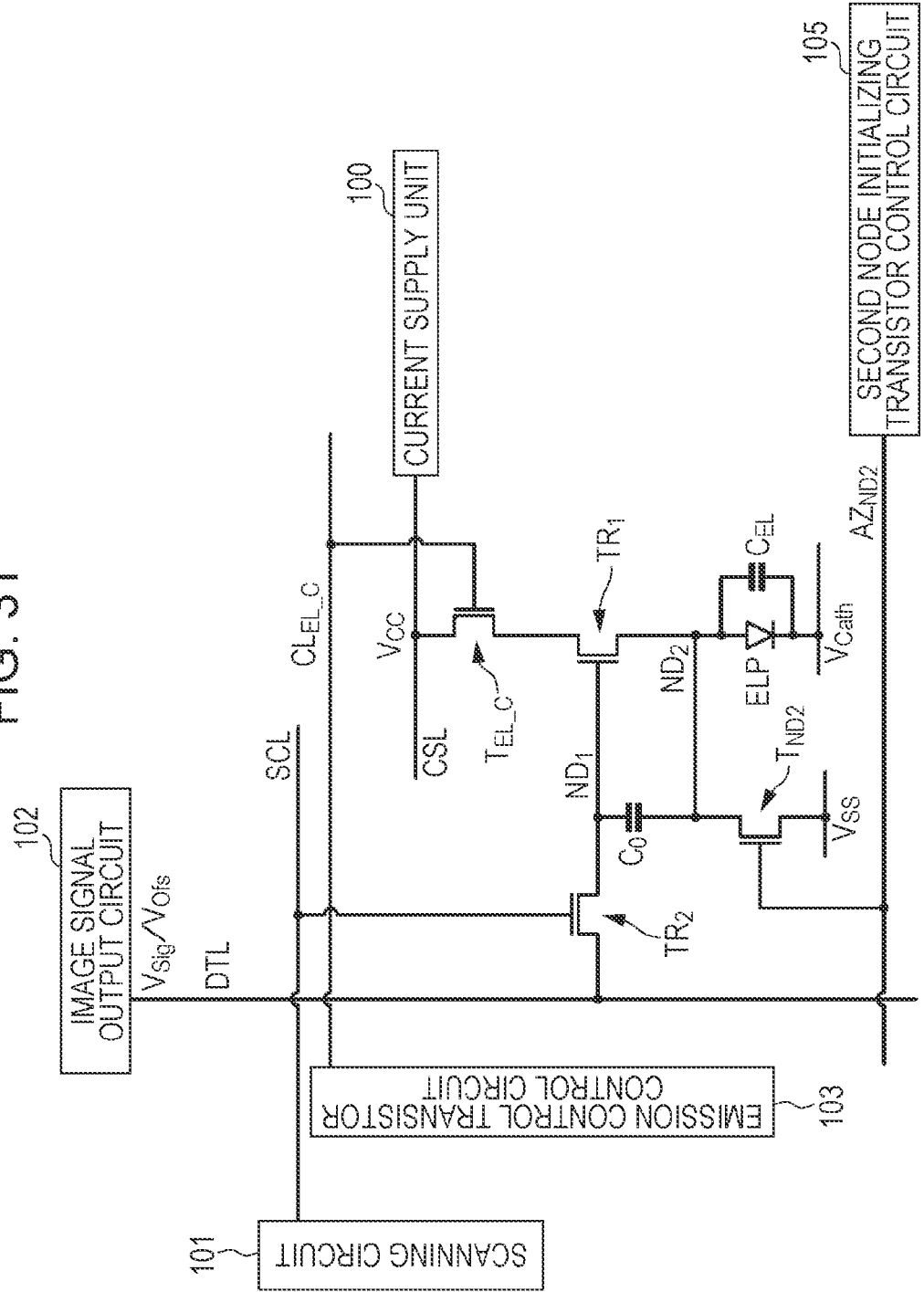
FIG. 31 is an equivalent circuit diagram of a 4Tr/1C driving circuit.
Figure 32:
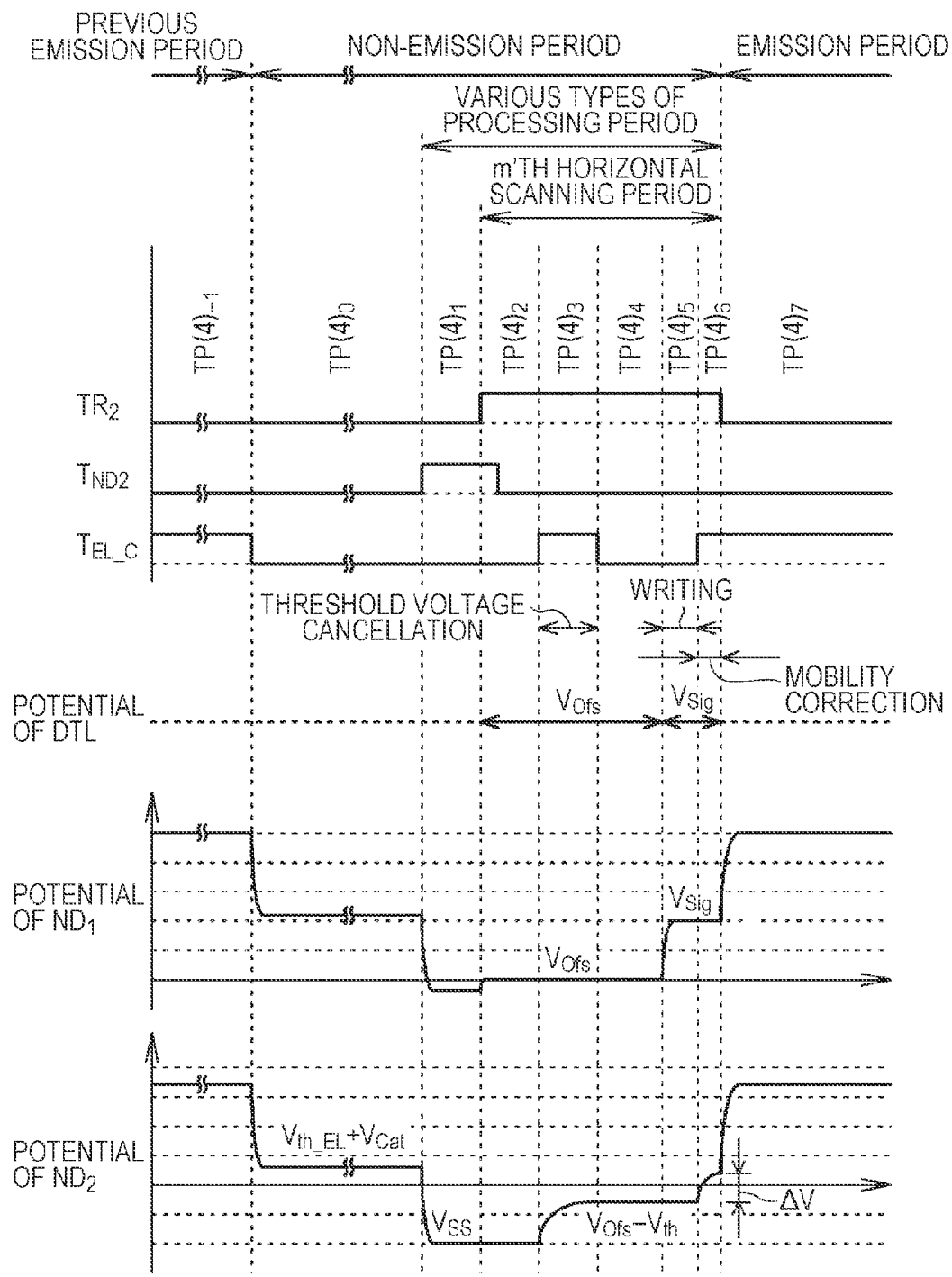
FIG. 32 is a diagram schematically illustrating a driving timing chart of the 4Tr/1C driving circuit.
Figure 33:
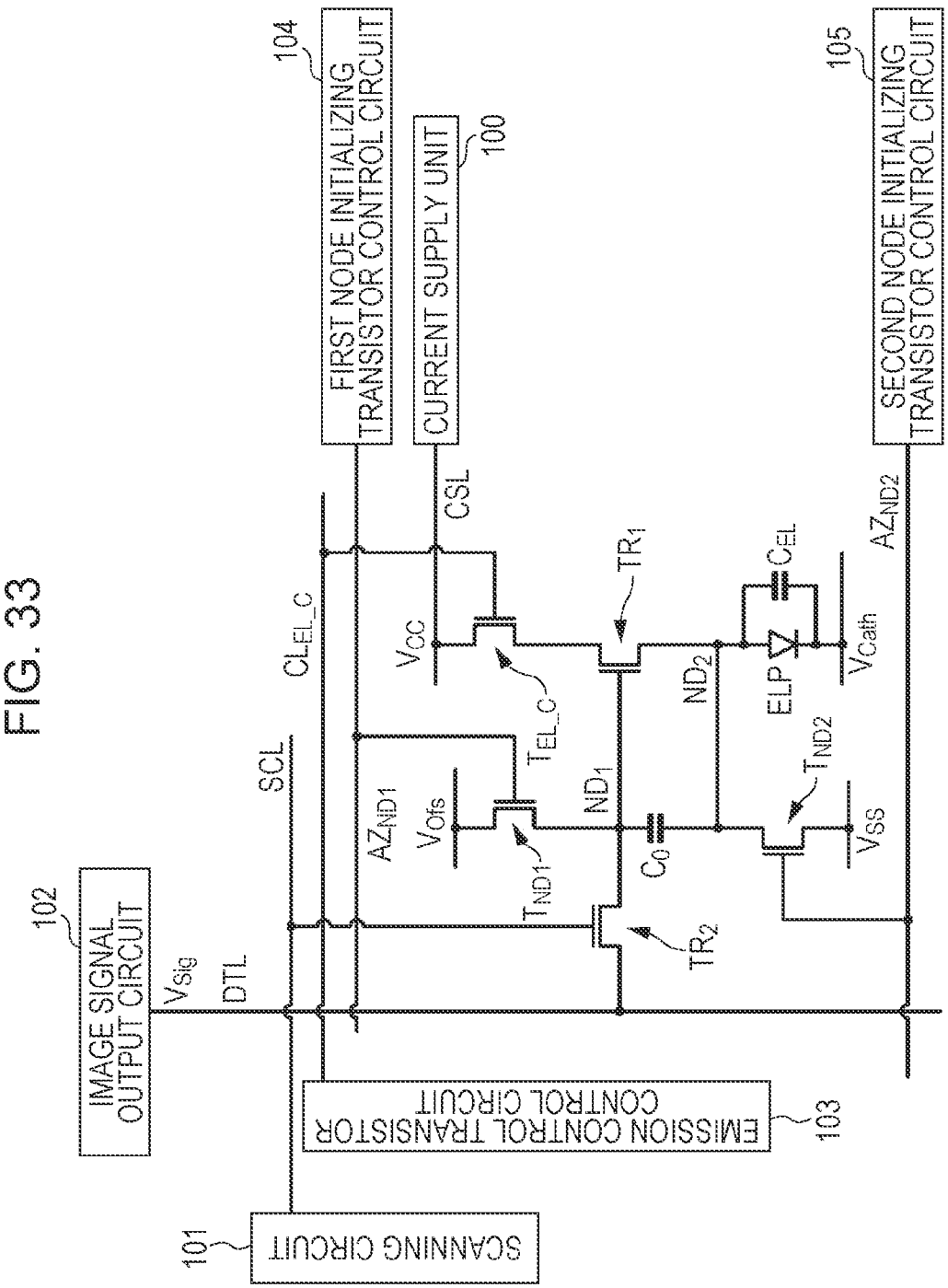
FIG. 33 is an equivalent circuit diagram of a 5Tr/1C driving circuit.
Figure 34:
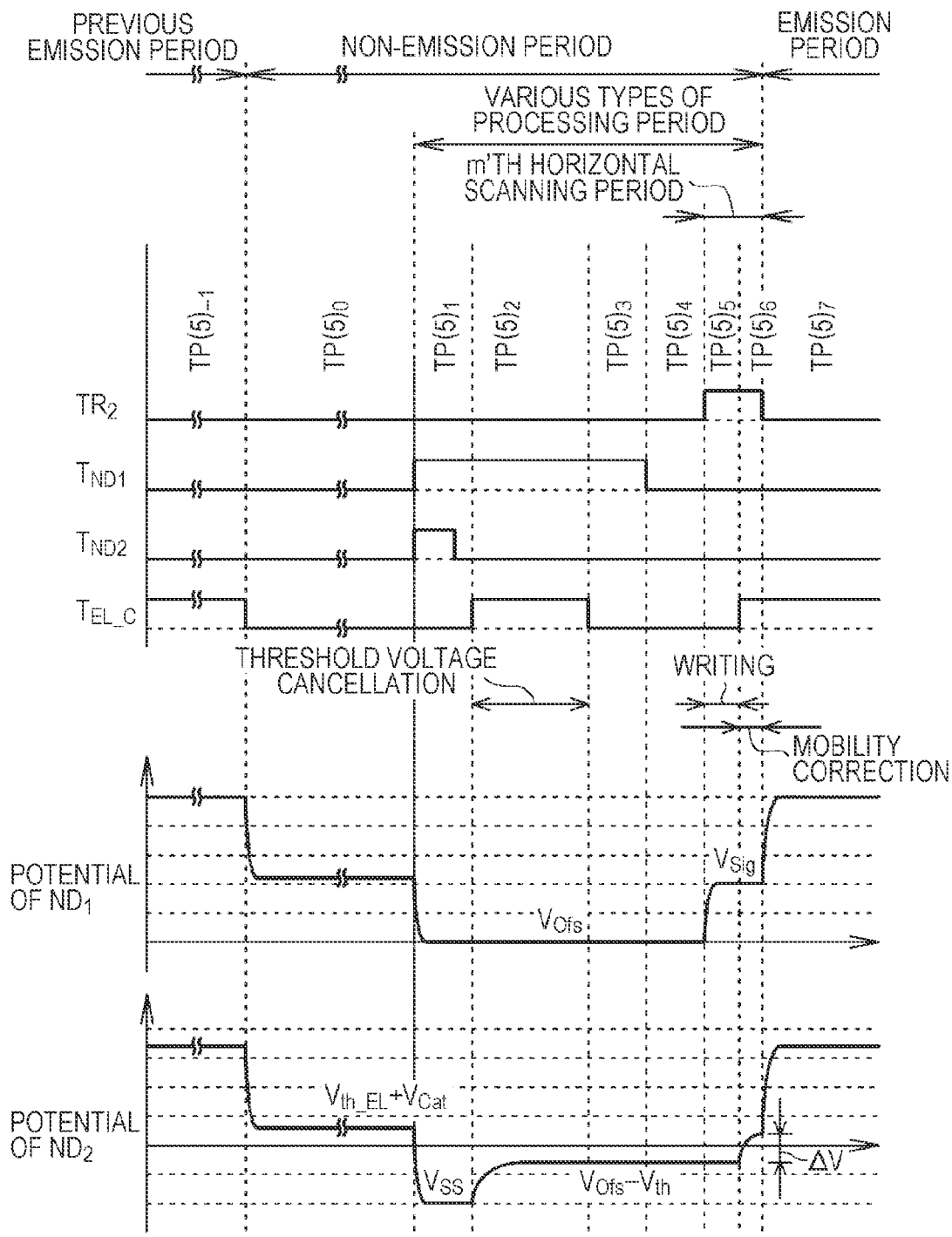
FIG. 34 is a diagram schematically illustrating a driving timing chart of the 5Tr/1C driving circuit.
Figure 35:
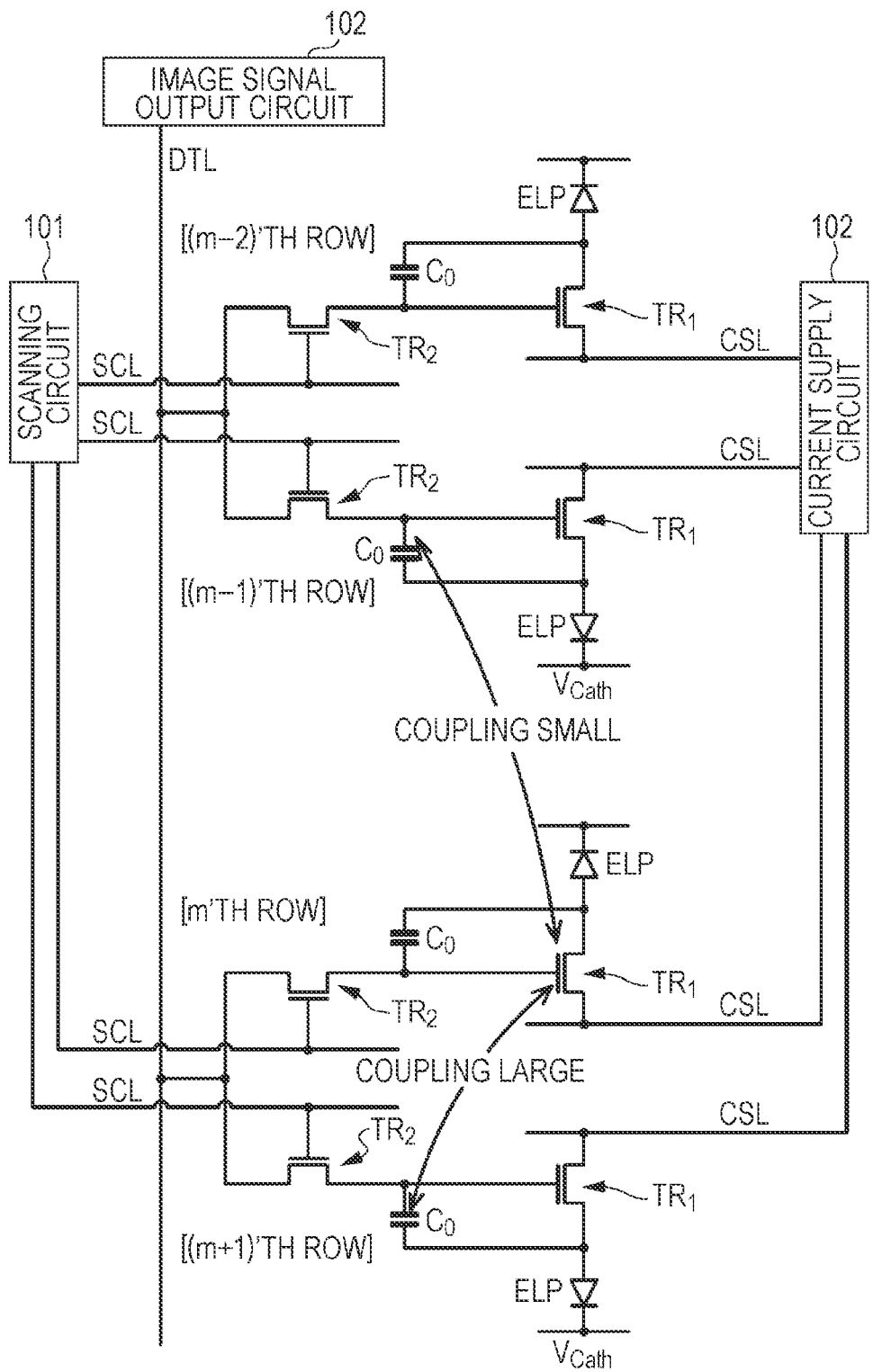
FIG. 35 is an equivalent circuit diagram of a driving circuit according to the related art.

The driving circuit is not restricted to the 2Tr/1C driving circuit. As illustrated in an equivalent circuit diagram in FIG. 29, and as schematically illustrated in a timing chart in FIG. 30, the driving circuit may be configured of a 3Tr/1C driving circuit configured of three transistors (driving transistor, image signal writing transistor, and one transistor) and one capacitor unit, or as illustrated in an equivalent circuit diagram in FIG. 31, and as schematically illustrated in a timing chart in FIG. 32, the driving circuit may be configured of a 4Tr/1C driving circuit configured of four transistors (driving transistor, image signal writing transistor, and two transistors) and one capacitor unit, or as illustrated in an equivalent circuit diagram in FIG. 33, and as schematically illustrated in a timing chart in FIG. 34, the driving circuit may be configured of a 5Tr/1C driving circuit configured of five transistors (driving transistor, image signal writing transistor, and three transistors) and one capacitor unit.

Note the present disclosure may also have the following configurations.

[1] A light-emitting element (First Form) including: an emitting unit; and a driving circuit configured to drive the emitting unit,
wherein the driving circuit is configured of at least
(A) a driving transistor including
two source/drain regions,
a channel formation region, and
a gate electrode,
(B) an image signal writing transistor including
two source/drain regions,
a channel formation region, and
a gate electrode, and
(C) a capacitor unit;
wherein with the driving transistor,
(A-1) one of the source/drain regions is connected to a current supply line extending in a first direction,
(A-2) the other source/drain region is connected to the emitting unit, and also connected to one edge of the capacitor unit, and
(A-3) the gate electrode is connected to the other source/drain region of the image signal writing transistor, and also connected to the other edge of the capacitor unit;
and wherein with the image signal writing transistor,
(B-1) one of the source/drain regions is connected to a data line extending in a second direction different from the first direction, and
(B-2) the gate electrode is connected to a scanning line extending in the first direction;

and wherein the driving transistor, the image signal writing transistor, and the capacitor unit are covered with a first interlayer insulating layer;

and wherein the current supply line and the scanning line are formed on the first interlayer insulating layer;

and wherein the first interlayer insulating layer, the current supply line, and the scanning line are covered with a second interlayer insulating layer;

and wherein the data line is formed on the second interlayer insulating layer;

and wherein a shield wall extending in the first direction is provided to the second interlayer insulating layer between one light-emitting element and a light-emitting element adjacent to the one light-emitting element in the second direction.

[2] The light-emitting element according to [1], wherein the shield wall is configured of a plurality of columnar-shaped conductor portions being arrayed apart;

and wherein the plurality of columnar-shaped conductor portions are arrayed in two columns and also arrayed in a zigzag pattern when viewing the shield wall from the axial directions of the conductor portions.

[3] The light-emitting element according to [1] or [2], wherein the shield wall is connected to a shield wiring portion formed in the second interlayer insulating layer.

[4] The light-emitting element according to any one of [1] to [3], wherein with light-emitting elements arrayed in the second direction, when assuming that m is an odd number, the m'th light-emitting element and the (m+1)'th light-emitting element are disposed in line symmetry as to a borderline extending in the first direction between the m'th light-emitting element and the (m+1)'th light-emitting element;

and wherein the shield wall is provided to at least between the m'th light-emitting element and the (m+1)'th light-emitting element.

[5] The light-emitting element according to [4], wherein with the shield wall is provided above the borderline.

[6] The light-emitting element according to [4] or [5], wherein with light-emitting elements arrayed in the second direction, a second shield wall extending in the first direction is provided between the (m−1)'th light-emitting element and the m'th light-emitting element.

[7] The light-emitting element according to [6], wherein the second shield wall is configured of a plurality of columnar-shaped second conductor portions being arrayed apart;

and wherein the plurality of columnar-shaped second conductor portions are arrayed in two columns and also arrayed in a zigzag pattern when viewing the second shield wall from the axial directions of the second conductor portions.

[8] The light-emitting element according to [6] or [7], wherein the second shield wall is connected to a shield wiring portion formed in the second interlayer insulating layer.

[9] The light-emitting element according to any one of [6] to [8], wherein the second interlayer insulating layer has a laminated configuration of a lower layer of the second interlayer insulating layer and an upper layer of the second interlayer insulating layer;

and wherein the shield wall is provided to the lower layer of the second interlayer insulating layer;

and wherein a third shield wall having the same configuration as with the shield wall and extending in the first direction is provided to the upper layer portion of the second interlayer insulating layer positioned above the shield wall, and the third shield wall is connected to the shield wiring portion.

[10] The light-emitting element according to any one of [6] to [9], wherein the second interlayer insulating layer has a laminated configuration of a lower layer of the second interlayer insulating layer and an upper layer of the second interlayer insulating layer;

and wherein the second shield wall is provided to the lower layer of the second interlayer insulating layer;

and wherein a fourth shield wall having the same configuration as with the second shield wall and extending in the first direction is provided to the upper layer portion of the second interlayer insulating layer positioned above the second shield wall, and the fourth shield wall is connected to the shield wiring portion.

[11] The light-emitting element according to any one of [1] to [5], wherein the second interlayer insulating layer has a laminated configuration of a lower layer of the second interlayer insulating layer and an upper layer of the second interlayer insulating layer;

and wherein the shield wall is provided to the lower layer of the second interlayer insulating layer;

and wherein a third shield wall having the same configuration as with the shield wall and extending in the first direction is provided to the upper layer portion of the second interlayer insulating layer positioned above the shield wall, and the third shield wall is connected to the shield wiring portion.

[12] The light-emitting element according to any one of [1] to [11], wherein a second direction shield wall extending in the second direction is provided to the second interlayer insulating layer between one light-emitting element and a light-emitting element adjacent to the one light-emitting element in the first direction.

[13] A light-emitting element (Second Form) including: an emitting unit; and a driving circuit configured to drive the emitting unit, wherein a shield wall is provided between one light-emitting element and a light-emitting element adjacent to the one light-emitting element;

and wherein the shield wall is configured of a plurality of columnar-shaped conductor portions being arrayed apart;

and wherein the plurality of columnar-shaped conductor portions are arrayed in two columns and also arrayed in a zigzag pattern when viewing the shield wall from the axial directions of the conductor portions.

[14] A light-emitting element (Third Form) including: an emitting unit; and a driving circuit configured to drive the emitting unit, wherein the driving circuit includes at least a driving transistor, an image signal writing transistor, and a capacitor unit;

and wherein the capacitor unit is provided in a higher level than a level where the driving transistor and the image signal writing transistor are provided;

and wherein a shield wall is provided in a level equal to or lower than a level where the capacitor is provided but a level higher than a level where the driving transistor and the image signal writing transistor are provided, between one light-emitting element and a light-emitting element adjacent to the one light-emitting element.

[15] The light-emitting element according to [14], wherein the shield wall is configured of a plurality of columnar-shaped conductor portions being arrayed apart;

and wherein the plurality of columnar-shaped conductor portions are arrayed in two columns and also arrayed in a zigzag pattern when viewing the shield wall from the axial directions of the conductor portions.

[16] The light-emitting element according to any one of [13] to [15], wherein the shield wall is connected to the shield wiring portion.

[17] The light-emitting element according to any one of [13] to [16], wherein the driving circuit is connected to a current supply line extending in a first direction, a scanning line extending in the first direction, and a data line extending in a second direction different from the first direction;

and wherein with light-emitting elements arrayed in the second direction, when assuming that m is an odd number, the m'th light-emitting element and the (m+1)'th light-emitting element are disposed in line symmetry as to a borderline extending in the first direction between the m'th light-emitting element and the (m+1)'th light-emitting element;

and wherein the shield wall is provided to at least between the m'th light-emitting element and the (m+1)'th light-emitting element.

[18] The light-emitting element according to [17], wherein with the shield wall is provided above the borderline.

[19] The light-emitting element according to [17] or [18], wherein with light-emitting elements arrayed in the second direction, a second shield wall extending in the first direction is provided between the (m−1)'th light-emitting element and the m'th light-emitting element.

[20] The light-emitting element according to [19], wherein the second shield wall is configured of a plurality of columnar-shaped second conductor portions being arrayed apart;

and wherein the plurality of columnar-shaped second conductor portions are arrayed in two columns and also arrayed in a zigzag pattern when viewing the second shield wall from the axial directions of the second conductor portions.

[21] The light-emitting element according to [19] or [20], wherein the second shield wall is connected to the shield wiring portion.

[22] The light-emitting element according to any one of [17] to [21], wherein a second direction shield wall extending in the second direction is provided between one light-emitting element and a light-emitting element adjacent to the one light-emitting element in the first direction.

[23] A display device configured of a plurality of the light-emitting elements according to any one of [1] to [22] being arrayed in the first direction and in a second direction different from the first direction in a two-dimensional matrix shape.

It should be understood by those skilled in the art that various modifications, combinations, sub-combinations and alterations may occur depending on design requirements and other factors insofar as they are within the scope of the appended claims or the equivalents thereof.

What is claimed is:

1. A light-emitting device comprising:
    at least two pixels, each of the at least two pixels including
        an emitting unit; and
        a driving unit configured to control the emitting unit, wherein the driving unit includes a capacitor unit and at least two transistors, and wherein the capacitor unit is formed above the at least two transistors.

2. The light-emitting device according to claim 1, further comprising a shield layer located between the at least two pixels.

3. The light-emitting device according to claim 2, wherein the shield layer is formed above the at least two transistors, and wherein the shield layer is formed on a level with the capacitor unit.

4. The light-emitting device according to claim 2, wherein the shield layer is formed above the at least two transistors, and wherein the shield layer is formed below the capacitor unit.

5. The light-emitting device according to claim 1, wherein the at least two transistors include a first transistor and a second transistor, wherein the first transistor is a driving transistor, and wherein the second transistor is an image signal writing transistor.

6. The light-emitting device according to claim 1, wherein the capacitor unit includes a first capacitor and a second capacitor.

7. The light-emitting device according to claim 1, further comprising:
    a first interlayer insulating layer that covers the driving unit;
    current supply lines formed on the first interlayer insulating layer;
    scanning lines formed on the first interlayer insulating layer;
    a second interlayer insulating layer that covers the current supply lines and the scanning lines; and
    data lines formed on the second interlayer insulating layer.

8. A display device comprising:
    an image signal circuit; and
    a light-emitting device coupled to the image signal circuit, the light-emitting device comprising:
    at least two pixels, each of the at least two pixels including
        an emitting unit, and
        a driving unit configured to control the emitting unit, wherein the driving unit includes a capacitor unit and at least two transistors, and wherein the capacitor unit is formed above the at least two transistors.

9. The display device according to claim 8, wherein the light-emitting device further comprises a shield layer located between the at least two pixels.

10. The display device according to claim 9, wherein the shield layer is formed above the at least two transistors, and wherein the shield layer is formed on a level with the capacitor unit.

11. The display device according to claim 9, wherein the shield layer is formed above the at least two transistors, and wherein the shield layer is formed below the capacitor unit.

12. The display device according to claim 8, wherein the at least two transistors include a first transistor and a second transistor, wherein the first transistor is a driving transistor, and wherein the second transistor is an image signal writing transistor.

13. The display device according to claim 8, wherein the capacitor unit includes a first capacitor and a second capacitor.

14. The display device according to claim 8, wherein the light-emitting device further includes a first interlayer insulating layer that covers the driving unit;
    current supply lines formed on the first interlayer insulating layer;
    scanning lines formed on the first interlayer insulating layer;
    a second interlayer insulating layer that covers the current supply lines and the scanning lines; and
    data lines formed on the second interlayer insulating layer.

15. An electronic apparatus comprising:
an image signal circuit; and
a light-emitting device coupled to the image signal circuit, the light-emitting device comprising:
at least two pixels, each of the at least two pixels including an emitting unit, and
a driving unit configured to control the emitting unit, wherein the driving unit includes a capacitor unit and at least two transistors, and wherein the capacitor unit is formed above the at least two transistors.

16. The electronic apparatus according to claim 15, wherein the light-emitting device further comprises a shield layer located between the at least two pixels.

17. The electronic apparatus according to claim 16, wherein the shield layer is formed above the at least two transistors, and wherein the shield layer is formed on a level with the capacitor unit.

18. The electronic apparatus according to claim 16, wherein the shield layer is formed above the at least two transistors, and wherein the shield layer is formed below the capacitor unit.

19. The electronic apparatus according to claim 15, wherein the at least two transistors include a first transistor and a second transistor, wherein the first transistor is a driving transistor, and wherein the second transistor is an image signal writing transistor.

20. The electronic apparatus according to claim 15, wherein the light-emitting device further includes a first interlayer insulating layer that covers the driving unit;

current supply lines formed on the first interlayer insulating layer;

scanning lines formed on the first interlayer insulating layer;

a second interlayer insulating layer that covers the current supply lines and the scanning lines; and data lines formed on the second interlayer insulating layer.

* * * * *